United States Patent [19]
Whetsel

[11] Patent Number: 5,875,353
[45] Date of Patent: Feb. 23, 1999

[54] CIRCUIT WITH SWITCH CONTROLLER THAT SIGNALS SWITCH CONTROL INPUT TO CLOSE SWITCH UPON COMPLETING REQUEST ACKNOWLEDGMENT OF CONNECTION REQUEST FROM DATA TRANSFER PORT

[75] Inventor: Lee D. Whetsel, Plano, Tex.

[73] Assignee: Texas Instruments Incorporated, Dallas, Tex.

[21] Appl. No.: 485,741

[22] Filed: Jun. 7, 1995

Related U.S. Application Data

[62] Division of Ser. No. 427,947, Apr. 24, 1995, Pat. No. 5,483,518, which is a continuation of Ser. No. 322,112, Oct. 12, 1994, abandoned, which is a continuation of Ser. No. 900,708, Jun. 17, 1992, abandoned.

[51] Int. Cl.$^6$ .................................................. G06F 13/14
[52] U.S. Cl. ...................... 395/858; 395/309; 395/311; 395/500; 370/362; 370/360
[58] Field of Search ..................................... 395/500, 550, 395/309, 726, 775, 850, 849, 311, 858; 455/11.1; 370/362, 360

[56] References Cited

U.S. PATENT DOCUMENTS

| | | | |
|---|---|---|---|
| 4,390,969 | 6/1983 | Hayes | 395/550 |
| 4,587,609 | 5/1986 | Boudreau et al. | 395/726 |
| 4,627,018 | 12/1986 | Trost et al. | 395/476 |
| 5,014,186 | 5/1991 | Chisholm | 395/850 |
| 5,133,062 | 7/1992 | Joshi et al. | 395/500 |
| 5,159,465 | 10/1992 | Maemura et al. | 326/73 |
| 5,214,774 | 5/1993 | Welsch et al. | 455/11.1 |
| 5,218,702 | 6/1993 | Kirtland | 395/298 |
| 5,276,807 | 1/1994 | Kodama et al. | 395/309 |
| 5,319,754 | 6/1994 | Meinecke et al. | 395/310 |
| 5,388,216 | 2/1995 | Oh | 395/849 |
| 5,481,734 | 1/1996 | Yoshida | 395/775 |
| 5,548,781 | 8/1996 | Huang | 395/831 |

*Primary Examiner*—Thomas C. Lee
*Assistant Examiner*—Albert Wang
*Attorney, Agent, or Firm*—Lawrence J. Bassuk; Richard L. Donaldson

[57] ABSTRACT

A protocol and associated circuitry operable for efficiently extending serial bus capability in system environments is disclosed. The protocol is designed to coexist and be fully compatible with existing serial bus approaches, and in particular an example of application of the invention to a backplane system utilizing the 1149.1 IEEE standard serial bus is detailed. The circuitry and protocol required to couple any one of the boards on the backplane to the serial bus master without modifying the existing serial bus protocol, without adding additional signals, and without affecting the throughput rate of the serial bus is described. The invention advantageously allows the serial bus master to select, communicate with, and deselect backplane boards so that high level test functions may be simultaneously executed and monitored. Additional preferred embodiments are also disclosed.

7 Claims, 21 Drawing Sheets

```
              HIERARCHICAL SELECT PROTOCOL TO ENVIRONMENT "m"
RE TO E1      T | S1:aSS2:aSS3:aS....Sm-2:aSSm-1:aSSm:aSIT.........T
E1 TO E2      T...........T|S2:aSS3:aS....Sm-2:aSSm-1:aSSm:aSIT......T
E2 TO E3      T....................T|S3:aS....Sm-2:aSSm-1:aSSm:aS IT.....T
Em-3 TO Em-2  T.............................T|Sm-2:aSSm-1:aSSm:aSIT...T
Em-2 TO Em-1  T......................................T|Sm -1:aSSm:aSITT
Em-1 TO Em    T...............................................T|Sm:aSIT

HIERARCHICAL ACKNOWLEDGE PROTOCOL FROM ENVIRONMENT "m"
Em TO Em-1    T|Sm:aSIT..................................................T
Em-1 TO Em-2  TT|Sm:aSSm-1:aSIT.........................................T
Em-2 TO Em-3  T...T|Sm:aSSm-1:aSSm-2:aS IT................................T
E3 TO E2      T....T|Sm:aSSm-1:aSSm -2:aSSm-1...S3:aIT..................T
E2 TO E1      T..... T|Sm:aSSm-1:aSSm-2:aSSm-1.... S3:aSS2:a IT........T
E1 TO RE      T.......T|Sm:aSSm-1:aSSm-2:aSSm-1...S3:aSS2:aSS1:aSIT
```

Fig. 35

```
              HIERARCHICAL SELECT PROTOCOL USED FOR GLOBAL RESETTING
RE TO E1      T | S1:rSS2:rSS3:rS....Sm-2:rSSm-1:rSSm:rSIT............T
E1 TO E2      T...........T|S2:rSS3:rS...... Sm-2:rSSm-1:rSSm :rS IT......T
E2 TO E3      T....................T|S3:rS....Sm-2:rSSm -1:rSSm :rS I T....T
Em-3 TO Em-2  T.............................T|Sm-2:rSSm -1:rSSm: rS IT...T
Em-2 TO Em-1  T......................................T|Sm -1:rSSm:rS ITT
Em-1 TO Em    T...............................................T|Sm:rS I T

HIERARCHICAL SELECT PROTOCOL FOR LOCAL RESETTING OF ENVIRONMENT "m"
RE TO E1      T | S1:aSS2:aSS3:aS....Sm-2:aSSm-1:aSSm:rSIT.........T
E1 TO E2      T...........T|S2:aSS3:aS....Sm-2:aSSm-1:aSSm:rS IT......T
E2 TO E3      T....................T|S3:aS....Sm-2:aSSm-1:aSSm:rS I T....T
Em-3 TO Em-2  T.............................T|Sm-2:aSSm-1:aSSm:rS IT...T
Em-2 TO Em-1  T......................................T|Sm -1:aSSm:rS ITT
Em-1 TO Em    T...............................................T|Sm:rS I T
```

Fig. 36

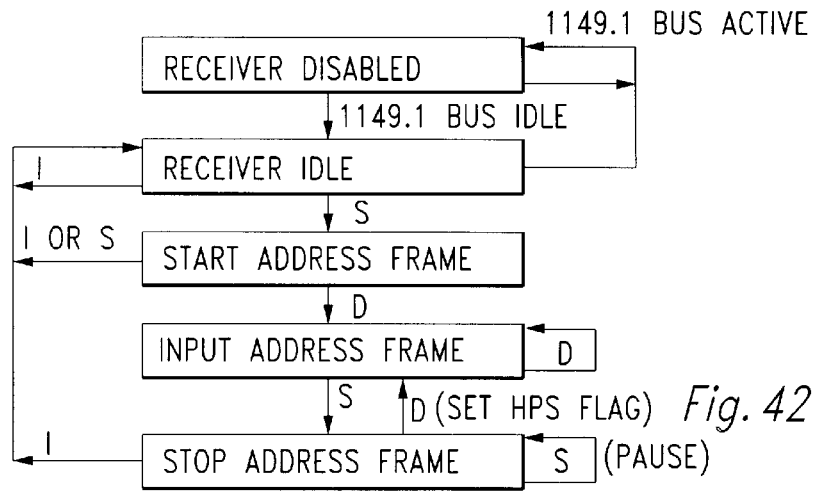
Fig. 42
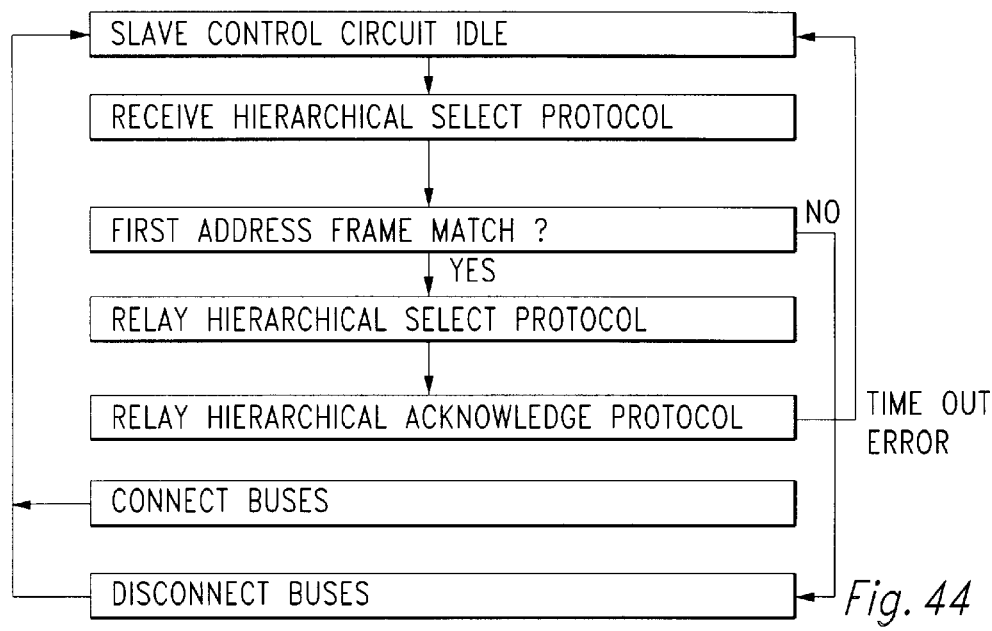
Fig. 44
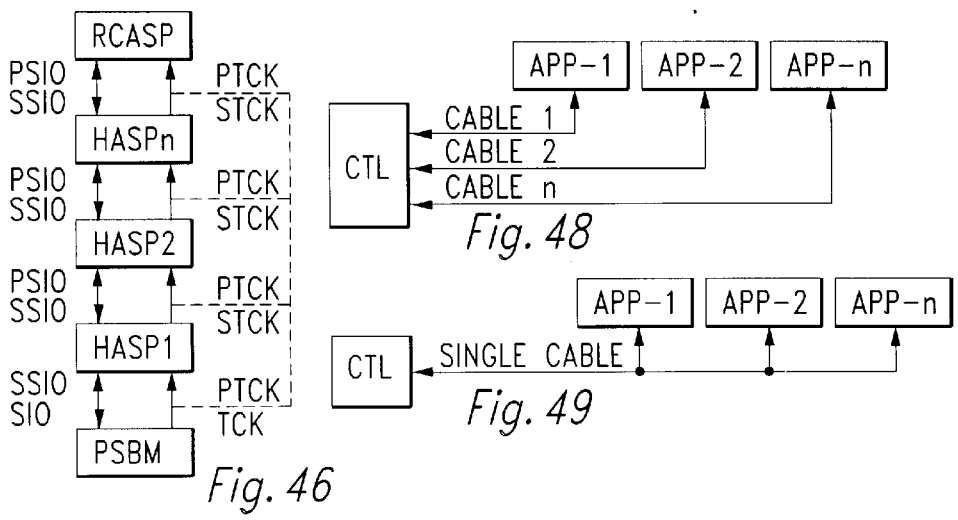
Fig. 46
Fig. 48
Fig. 49

000
CIRCUIT WITH SWITCH CONTROLLER THAT SIGNALS SWITCH CONTROL INPUT TO CLOSE SWITCH UPON COMPLETING REQUEST ACKNOWLEDGMENT OF CONNECTION REQUEST FROM DATA TRANSFER PORT

This is a division of application Ser. No. 08/427,947, filed Apr. 24, 1995 now U.S. Pat. No. 5,483,518 which is a continuation application under 37 CFR 1.62 of the prior application Ser. No. 08/322,112, filed on Oct. 12, 1994, and now abandoned which was a continuation application under 37 CFR 1.62 of the prior application Ser. No. 07/900,708, filed on Jun. 17, 1992, and now abandoned.

RELATED APPLICATIONS

This application is related to the U.S. applications Ser. No. 08/259,272, entitled "Hierarchical Connection Method, Apparatus and Protocol", now U.S. Pat. No. 5,617,420, and U.S. application Ser. No. 08/179,900, entitled "Remotely Controllable Addressable Shadow Port and Protocol for Serial Bus Networks", now abandoned.

FIELD OF THE INVENTION

This invention relates generally to the use of serial buses to communicate between devices, circuits, systems, boards or networks, and in particular to serial backplane buses. The invention is applicable to any environment where a serial communication bus is or may be used, including circuit boards, backplanes, integrated circuits, and systems.

BACKGROUND OF THE INVENTION

In producing integrated circuits or circuit boards for systems, the use of a serial communication bus for test and debug is rapidly becoming a standard practice. The use of the serial bus allows the system, circuit board or integrated circuits to be tested and connections to be confirmed without the need for intrusive hardware or test probes. This is particularly important as packaging of the devices reaches higher densities and for multiple integrated circuits packaged on a single module, or for systems where the circuitry is not available for physical access for other reasons.

Industry has developed and continues to develop standard protocols for serial busses of this kind. The standards are necessary and desirable to insure that parts and boards acquired from various vendors will be able to communicate on a common bus. In general, the concepts of this invention apply to any type of serial bus. However, to clarify the description of the invention it will be described as being a feature added to a well understood and documented IEEE/ANSI standard serial bus designed for testing ICs at the board level, referred to as IEEE/ANSI standard 1149.1 or more commonly as the JTAG boundary scan standard.

The IEEE/ANSI 1149.1 standard describes a 4-wire serial bus that can be used to transmit serial data to and receive serial data from multiple ICs on a board. While the 1149.1 serial bus was originally developed to serially access ICs at the board level, it can also be used at the backplane level to serially access ICs on multiple boards.

The 1149.1 standard describes a 4-wire serial bus that can be used to transmit serial data between a serial bus master and slave device. While 1149.1 was developed to serially access ICs on a board, it can be used at the backplane level to serially access boards in a backplane. 1149.1 has two serial access configurations, referred to as "ring" and "star", that can be used at the backplane level.

In a backplane 1149.1 ring configuration, all boards in the backplane directly receive the control outputs from a primary serial bus master (PSBM) and are daisy chained between the PSBM's data output and data input. During scan operation, the PSBM outputs control scan data through all boards in the backplane, via its test data output (TDO) and test data input (TDI) bus connections. The problem associated with the ring configuration is that the scan operation only works if all the boards are included in the backplane and are operable to scan data from their TDI input to TDO output signals. If one of the boards is removed or has a fault, the PSBM will be unable to scan data through the backplane. Since the ring configuration does not allow access to remaining boards when one is removed or disabled, it does not fully meet the needs of a serial bus for backplane and large system applications.

In a backplane 1149.1 star configuration, all boards in the backplane directly receive the test clock (TCK) and TDI signals from the PSBM and output a TDO signal to the PSBM. Also each board receives a unique test mode select (TMS) signal from the PSBM. In the star configuration only one board is enabled at a time to be serially accessed by the PSBM. When a board is enabled, the TMS signal associated with that board will be active while all other TMS signals are inactive. The problem with the star configuration is that each board requires its own TMS signal. In a backplane with 100 boards, the PSBM would have to have 100 individually controllable TMS signals, and the backplane would have to have traces for each of the 100 TMS signals. Due to these requirements, star configurations are typically not considered for backplane applications.

Two IEEE serial bus standards, P1149.5 and P1394, are in development for use in system backplanes. Since these standards are being specifically designed for backplane applications, they appear to overcome the problems stated using the 1149.1 standard bus as a backplane bus. However, the protocols of these anticipated standards are different from the 1149.1 protocol and therefore methods must be defined to translate between them and 1149.1.

The IEEE P1149.5 standard working group is currently defining a module test and maintenance bus that can be used in system backplane environments. P1149.5 is a single master/multiple slave bus defined by a 5-wire interface. The P1149.5 bus master initiates a data transfer operation by transmitting a data packet to all slave devices. The data packet consists of an address and command section. The slave device with a matching address is enabled to respond to the command section of the data packet as described in the P1149.5 standard proposal.

Interfacing an P1149.5 bus into an 1149.1 bus environment requires new additional system hardware and software, and designers with a detailed understanding of both bus types. Therefore, in using P1149.5 to interface into an 1149.1 environment, an unnecessary complication is added to an otherwise simple serial access approach. Another problem is that the bandwidth of the 1149.1 serial data transfer will be adversely affected by the 1149.5 to 1149.1 protocol conversion process and hardware.

The IEEE P1394 standard working group is currently defining a 2-wire high-speed serial bus that can be used in either a cable or system backplane environment. The P1394 standard, unlike P1149.5, is not a single master/multiple slave type bus. In P1394, all devices (nodes) connected to the bus are considered to be of equal mastership. The fact that P1394 can operate on a 2-wire interface makes this bus attractive in newer 32-bit backplane standards where only two wires are reserved for serial communication. However, there are problems in using P1394 as a backplane test bus to access 1149.1 board environments.

First, P1394 is significantly more complex in operation than P1149.1, thus devices designed to translate between P1394 and 1149.1 may be costly. Second, P1394 is not a full time test bus, but rather it is a general purpose serial communication bus, and its primary purpose in a backplane environment is to act as a backup interface in the event the parallel interface between boards becomes disabled. While 1149.1 test access can be achieved via P1394, it will be available only during time slices when the bus is not handling functional operations. Thus on-line 1149.1 test bus access will be limited and must be coordinated with other transactions occurring on the P1394 bus. This will require additional hardware and software complexity.

Another method of achieving a backplane to board level interface is to extend the protocol defined in the 1149.1 standard. Such an approach has been described in a paper presented at the 1991 International Test Conference by D. Bhavsar, entitled "An Architecture for Extending the IEEE Standard 1149.1 Test Access Port to System Backplanes". The Bhavsar paper describes a method of extending the protocol of 1149.1 so it can be used to access an interface circuit residing between the backplane and board level 1149.1 buses. The interface circuit responds to 1149.1 protocol transmitted over the backplane bus to load an address. If the address matches the address of the interface circuit, the interface circuit is connected to the backplane. After the interface circuit is connected to the backplane, additional 1149.1 protocol is input to the interface circuit to connect the backplane and board level 1149.1 buses. Following this connection procedure, the board level 1149.1 bus can be controlled by the backplane 1149.1 bus. Bhavsar's approach also has problems that limit its effectiveness as a general purpose 1149.1 bus backplane to board interface.

Bhavsar's approach does not allow selecting one board, then selecting another board without first resetting the backplane and board level 1149.1 buses, by transitioning them into their test logic reset (TLRST) states. Entering the TLRST state causes test conditions setup in the ICs of a previously selected board to be lost due to the test reset action of the 1149.1 bus on the test access ports (TAPs) of the ICs.

Also, it is often desirable to select and initiate self-tests in a selected group of backplane boards. However, since the Bhavsar approach requires resetting the 1149.1 bus each time a new board is selected, it is impossible to self-test more than one board at a time, because resetting the bus aborts any previously initiated self-test.

Thus, a need exists for a simple, efficient and effective means to provide support for the use of an 1149.1 standard serial bus in a multiple-board backplane environment. The invention described herein meets this need.

SUMMARY OF THE INVENTION

Generally, and in one form of the invention, a backplane access approach which provides a method of using the 1149.1 bus at the backplane level without incurring the problems previously described is disclosed. Using this approach, it is envisioned that one homogeneous serial bus may be used throughout a system design, rather than translating between multiple serial bus types. Employing a common serial bus in system designs can simplify software and hardware engineering efforts, since only an understanding of one bus type is required.

In a first embodiment of the invention a circuit, called an addressable shadow port (ASP), and a protocol, called a shadow protocol, is described which provides a simple and efficient method of directly connecting 1149.1 backplane and board buses together. When the 1149.1 backplane bus is in either its run test/idle (RT/IDLE) or test logic reset (TLRST) states, the ASP circuit can be enabled, via the shadow protocol of the invention, to connect a target board's 1149.1 serial bus up to the backplane 1149.1 serial bus. After the shadow protocol herein described has been used to connect the target board and backplane buses together, the protocol of the invention becomes inactive and becomes transparent to the operation of the 1149.1 bus protocol.

The use of the invention results in several improvements over the use of the 1149.1 standard in a system or backplane environment or the other prior art extension approaches in terms of the efficiency of data transfers, the ability to remove boards or support backplanes where not all slots are populated, the ability to keep the 1149.1 bus in the idle state when selecting and deselecting boards, and the advantageous use of the well understood 1149.1 serial bus without the need for additional bus design or translator circuitry to accomplish these improvements.

An additional embodiment is disclosed wherein a single board contains multiple 1149.1 scan paths, each coupled to the backplane serial bus by means of an individually addressable shadow port, for additional flexibility in scan path and testability design. Other preferred embodiments and enhancements are also disclosed.

Further embodiments extend the ASP circuit and protocol to allow the local serial bus to be selectively controlled by a remote serial bus master circuit or alternatively by a primary serial bus master located on the backplane serial bus. The ASP capabilities are extended to allow input and output of parallel data to a memory via the ASP and the primary serial bus master. The ASP circuit and protocol are further extended to allow interrupt, status and command information to be transferred between a remote serial bus master and a primary serial bus master, to support sophisticated commands and remote functions autonomously executed by the remote serial bus master.

The invention is then applied to hierarchically organized systems, wherein multiple backplane systems are linked together through networks coupled in a multiple level environment. The ASP capabilities are extended to allow the primary serial bus master to directly select and send and receive data and commands to any board within the hierarchy.

An additional embodiment is disclosed wherein the circuitry and protocol of the invention is adapted for use with the proposed two wire serial backplane busses being considered by some in industry. Modifications and enhancements to make the invention compatible with such a bus are described.

BRIEF DESCRIPTION OF THE DRAWINGS

In the drawings:

FIG. 35 depicts an example of the select and acknowledge protocol message transfers of the invention in an Mth level system;

FIG. 36 depicts an example of local and global reset messages in an Mth level system using the HASP select protocol of the invention;

FIG. 42 depicts a state diagram of the HASP receiver circuitry of the invention;

FIG. 44 depicts a state diagram of the HASP Slave Control Circuit of the invention;

FIG. 46 depicts a two wire connection between a primary serial bus master and an RCASP circuit via N-level HASP circuits of the invention;

FIG. 48 depicts a block diagram of a typical multiple cable environment coupling application circuitry;

FIG. 49 depicts a block diagram of a single cable configuration coupling the same application circuitry of FIG. 46 and incorporating the HASP circuitry of the invention;

Corresponding numerals and symbols in the different figures refer to corresponding parts unless otherwise indicated.

DETAILED DESCRIPTION OF PREFERRED EMBODIMENTS

Within this specification, the following abbreviations are used hereafter:

SBM indicates the serial bus master of the invention, a circuit capable of addressing and accessing other boards coupled to the serial bus;

PSBM indicates the primary serial bus master;

ASP indicates the addressable shadow port hardware of the invention;

TAP indicates a test access port, the standard hardware interface of devices coupled to the 1149.1 bus;

TMS indicates the Test Mode Select line, the control line of the 1149.1 bus;

TDO indicates the Test Data Output line, one of the lines the 1149.1 bus transfers serial data on;

TDI indicates the Test Data Input line, one of the lines the 1149.1 bus transfers data on;

TCK indicates the Test Clock line, the common clock line used by all of the devices coupled to the 1149.1 serial bus to synchronize transfers between devices.

A serial bus slave is a circuit or device that can be enabled and communicated to by a serial bus master via the serial bus network. A serial bus slave as used in this application refers to any well defined logic block or circuitry having input and output circuitry operable to allow it to be interfaced onto a serial bus. For simplicity, this application treats serial bus slaves as being printed circuit boards, comprised of multiple ICs that are plugged into a system backplane. However, it should be understood that the invention could be used in applications which define serial bus slaves as being: (1) sub-circuits in an IC, (2) ICs on a common substrate (i.e. multi-chip modules), (3) ICs on a printed circuit board, (3) boards plugged into a system backplane, (4) backplanes in a subsystem (5) subsystems in a system, or (6) systems connected to other systems.

A serial bus master is a circuit or device that can output the necessary control signals to enable communications with a serial bus slave via the serial bus network. Throughout the remainder of this application, the serial bus master will be referred to as an SBM.

Figure 1:
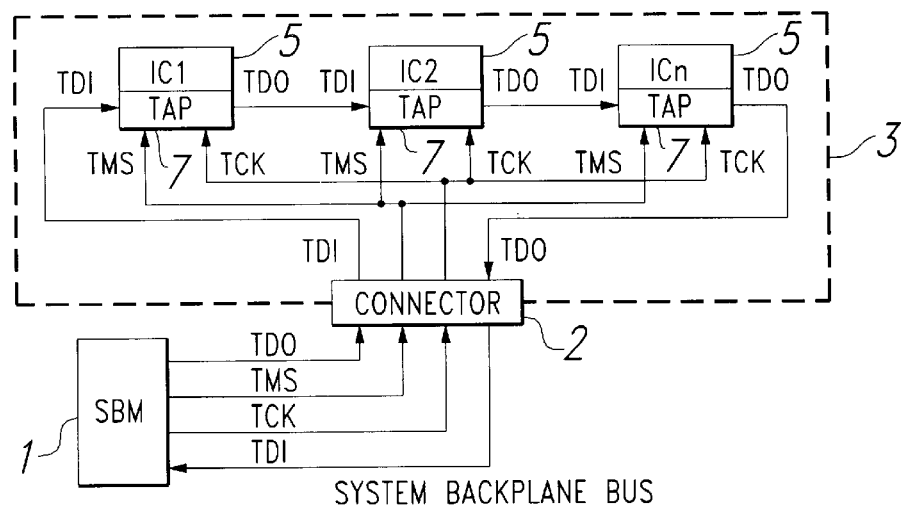
FIG. 1 depicts a typical backplane to board connection using the 1149.1 bus standard.

In FIG. 1, an SBM 1 is depicted as connected to an example board 3 via a connector 2 coupled to the standard 4-wire 1149.1 serial bus as contemplated by the existing art. Inside board 3, the 4-wire serial bus is connected to various integrated circuits (ICs) IC1, IC2, ICN via a standard IC level serial interface circuit referred to as a test access port (TAP). The TAP consists of a control circuit that responds to the 4-wire serial bus to enable and disable serial access to the IC. The TAP pins used to connect up to the serial bus consist of a serial test data input (TDI) pin, a serial test data output (TDO) pin, a test clock (TCK) pin, and a test mode select (TMS) pin. The TAP's TDI pin is a unidirectional data input signal used for shifting serial data bit streams into the IC. The TAP's TDO pin is a unidirectional data output signal used for shifting serial data bit streams out of the IC. The TAP's TCK pin is a unidirectional clock input signal used for clocking the serial data bit streams into and out of the IC, via the TDI and TDO pins. The TAP's TMS pin is a unidirectional control input signal used for enabling the shifting of the serial data bit streams into and out of the IC.

In operation, board 3 is plugged into a backplane, and the TAP of each IC IC1, I2, etc. is connected in parallel to the TMS and TCK backplane serial bus signals from the SBM. Also each IC's TAP is serially linked or daisychained, via their TDI and TDO pin connections, to form a single serial data path between the backplane's TDI input and TDO output signals. From the backplane, the SBM can drive TMS and TCK signals into the board to cause the TAPs of the ICs to serially shift data from the SBM's TDO output signal, into the board, through each IC on the board, from the board, and back into the SBM's TDI input signal.

Figure 2:
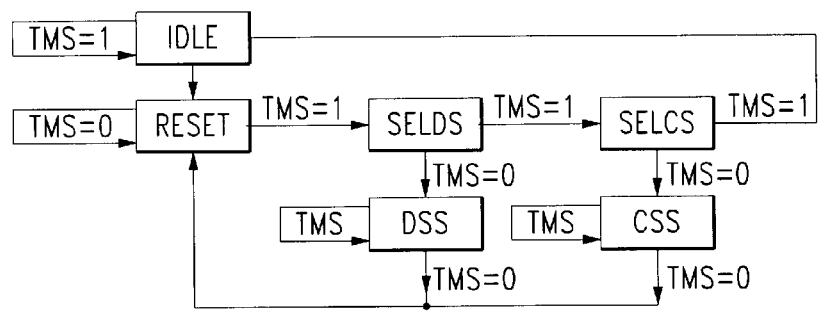
FIG. 2 depicts a state diagram of the states the 1149.1 bus transitions through in operation.

To understand the relationship between the invention and the standard 1149.1 serial bus, an overview of the 1149.1 serial bus operation is required. In FIG. 2 a simplified diagram of the operation of the 1149.1 serial bus is shown. Referring to FIG. 1, in operation the SBM outputs TMS and TCK control signals to the controllers of the TAPs of each IC on the board to cause the ICs to operate in step with the serial bus states of FIG. 2. The TAP of each IC operates synchronous to the TCK clock output from the SBM and responds to the TMS control output from the SBM, to transition into and out of the serial bus states of FIG. 2. The serial bus states include: RESET, IDLE, Select Data Scan (SELDS), Data Scan Sequence (DSS), Select Command Scan (SELCS), and Command Scan Sequence (CSS).

Referring to the board example depicted in FIG. 1, a description of each of the 1149.1 bus states is given in the following paragraphs. The board of FIG. 1 is comprised of ICs 5, with each IC having a TAP interface 7 and connection to the 1149.1 bus via the backplane connector 2. The TAP interfaces of each IC on board 3 are designed to receive and respond to the serial bus states of FIG. 2 to control serial access of the ICs. The SBM 1 connected to the backplane is designed to generate and transmit the serial bus states of FIG. 2 to serially access the ICs on the board.

RESET state—In response to a TMS input, the TAP of each IC on the board can be made to transition from any state into the RESET state as shown in FIG. 2. While in the RESET state, the TAP forces test logic in the IC into a disabled condition so that the test logic cannot interfere with the normal operation of the IC. The serial bus forces the TAP of each IC to remain in the RESET state while the TMS signal is high.

IDLE state—In response to a TMS input, the TAP of each IC can be transitioned from any state into the IDLE state. While in the IDLE state, the TAP responds to TMS control input to: (1) remain in the idle state, (2) enter into the data scan sequence, (3) enter into the command scan sequence, or (4) enter the reset state.

Data Scan Sequence—In response to TMS input, the TAP of each IC can be transitioned from the IDLE state into a data scan sequence (DSS), via the select data scan (SELDS) state. While the TAP is in the DSS state, additional TMS control is input to cause data to be shifted through the ICs test data register from TDI to TDO. After the shift operation is completed, additional TMS control is input to cause the TAP to exit the DSS and enter the IDLE state.

Command Scan Sequence—In response to a TMS signal input, the TAP of each IC be transitioned from the IDLE state into a command scan sequence (CSS), via the SELDS and Select Command Scan (SELCS) states. While the TAP is in the CSS, additional TMS control is input to cause data to be shifted through the ICs test command register from TDI to TDO. After the shift operation is completed, additional TMS control is input to cause the TAP to exit the CSS and enter the IDLE state.

In summary, the ICs on the board, when connected to the backplane 1149.1 serial bus signals, operate in step with the serial bus as it transitions through or operates in any of its defined states. The TMS signal, output from the SBM, is used to control the operation of the TAP of each IC on the board.

Figure 3:
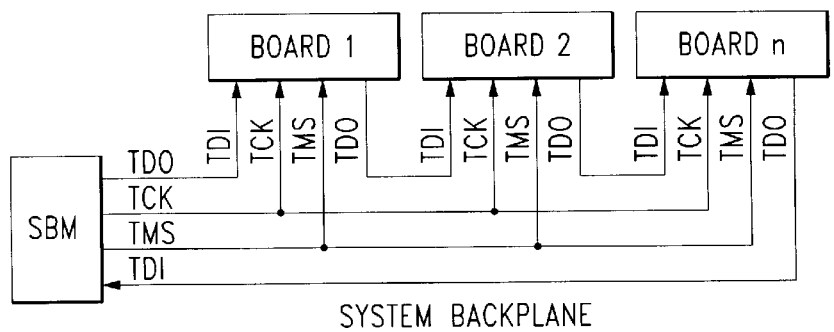
FIG. 3 depicts a typical prior art ring configuration of an 1149.1 standard bus used in a backplane environment.

FIG. 3 depicts a backplane with boards BOARD1, BOARD2 to BOARDN coupled to the 1149.1 standard or JTAG bus in the prior art "ring" configuration, which is further coupled to serial bus master SBM. In the prior art backplane ring configuration, any number of boards N are coupled to the 4-wire 1149.1 serial bus residing in the backplane wiring. All boards receive the TCK and TMS control outputs from an SBM connected to the backplane. As shown is FIG. 3, the TDO output of the SBM is input to the first board's TDI input, passes through the board's ICs (as shown in FIG. 1) and is output onto the backplane via the board's TDO output. The TDO output of the first board is input to the second board's TDI input, passes through the board's ICs and is output onto the backplane via the board's TDO output, and so on. The TDO of the last board (N) is output onto the backplane via the board's TDO output, and is input to the SBM's TDI input.

The TCK output from the SBM provides the clocking for data and command shift operations. The TMS output from the SBM provides the control to enable shift operations through all boards in the backplane ring configuration. The shift operation works only if all the boards are included in the ring and are operable to shift data from their TDI input to TDO output in response to TMS and TCK control input from the SBM. If one of the boards is removed from the backplane or if a board is unable to shift data due to a fault in one of its ICs or connections between one of its ICs, the SBM will be unable to shift data and command information through the boards in the backplane.

The main problem in using the 1149.1 ring configuration as a backplane level serial bus as shown in FIG. 3 is that the scan operations will only work as long as each board is electrically connected to the backplane serial bus and is operable to shift data from it's TDI input to it's TDO output in response to the backplane TCK clock and TMS control signals. In most applications, it is required that the SBM maintain serial access to boards in the backplane when one or more boards are removed for repair and/or replacement. Since the backplane ring configuration does not allow serial access to remaining boards when one or more of the boards are removed, it does not meet the needs of a backplane level serial bus.

Although this description of the ring configuration has been in terms of ring connected boards in a backplane, the same problems occur for multiple circuits ring-connected in an IC, multiple ICs ring-connected on a common substrate, multiple boards ring-connected in a backplane, multiple subsystems ring-connected in a system, and multiple ring-connected systems.

Figure 4:
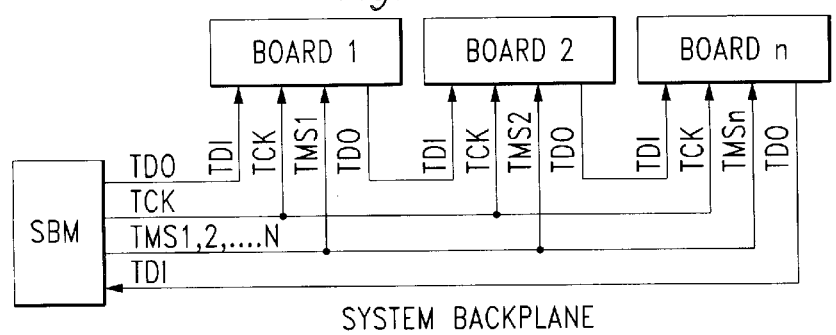
FIG. 4 depicts a typical prior art star configuration of an 1149.1 bus in a backplane environment.

FIG. 4 depicts a prior art backplane star configuration wherein up to N boards BOARD1, BOARD2, BOARDN are coupled to the 4-wire 1149.1 serial bus residing in the backplane wiring, and further coupled to serial bus master SBM. All boards receive the TCK and TDI bus signals from the SBM and output a TDO bus signal to the SBM. Also each board receives a unique TMS (1,2 . . . n) signal from the SBM. In the star configuration only one board at a time can be enabled by the SBM to shift data from the SBM's TDO output into the board's TDI input, through the board level ICs (see FIG. 1) and back to the SBM's TDI input via the board's TDO output. Because the boards all share a common TDO output wiring connection, only one board at a time can be enabled to drive serial data out on TDO to be received by the SBM.

When one board is enabled for scan access, the TMS signal associated with that board is active while all the other TMS signals to the other boards are inactive. When scan access to the enabled board is complete another board may be enabled via its TMS signal to allow the SBM to scan data and command information to and from that selected board.

The prior art star configuration disadvantageously requires each board have its own TMS signal and backplane wire connection. For example, in a backplane with 100 boards, the SBM would have to have 100 individually controllable TMS signals, to enable access to each of the 100 boards. In addition, the backplane would have to have wiring channels to support 100 TMS signals, one TMS signal wire for each board in the backplane. Due to a limited number of wiring channels in today's backplane bus standards, the star configuration cannot be used in most applications because it requires a TMS signal for each board in the backplane.

Again, although this description relates to star-connected boards in a backplane, the same problem occurs for: multiple circuits star-connected in an IC, multiple ICs star-connected on a common substrate, multiple boards star-connected in a backplane, and multiple subsystems star-connected in a system.

Serial backplane busses exist or are in development that overcome some or all of the problems that have been described in using the 1149.1 serial bus for a backplane applications. For example, a military backplane bus, referred to as a test and maintenance bus (TMBus), exists and can be used to access a board containing 1149.1 compatible ICs. Further, two IEEE serial bus backplane standards (P1149.5 and P1394) are in development that can also be used to access a board containing 1149.1 compatible ICs. However, all known backplane serial buses operate differently from the 1149.1 serial bus and therefore are not directly compatible, and all require translation hardware and software which comprehends at least two different bus standards.

In order to interface one of the mentioned proposed backplane serial buses to a standard board level 1149.1 serial bus, special interface circuits must be developed to translate between each of the different backplane serial bus protocols and the 1149.1 board level serial bus protocol. These serial bus interface circuits are unique for each backplane serial bus since each backplane serial bus operates according to a different protocol. Thus multiple interfaces must be developed, one for each backplane serial bus protocol type. Also each interface disadvantageously requires a complex IC to be placed on the board to translate between one of the backplane serial bus and the 1149.1 board level serial bus. In addition, the introduction of an interface circuit between a backplane and 1149.1 board level serial bus significantly reduces the bandwidth of the serial data to and from an 1149.1 board environment. Further, the aforementioned backplane serial bus types are complex, compared to the 1149.1 serial bus, and require expert engineering skills to develop the sophisticated and expensive interfaces and software. While certain military and high-end commercial applications may be able to adopt this sophisticated and expensive approach, these solutions are inappropriate and unworkable for most commercial applications and systems.

Section I
Addressable Shadow Port and Protocols

Figure 5:
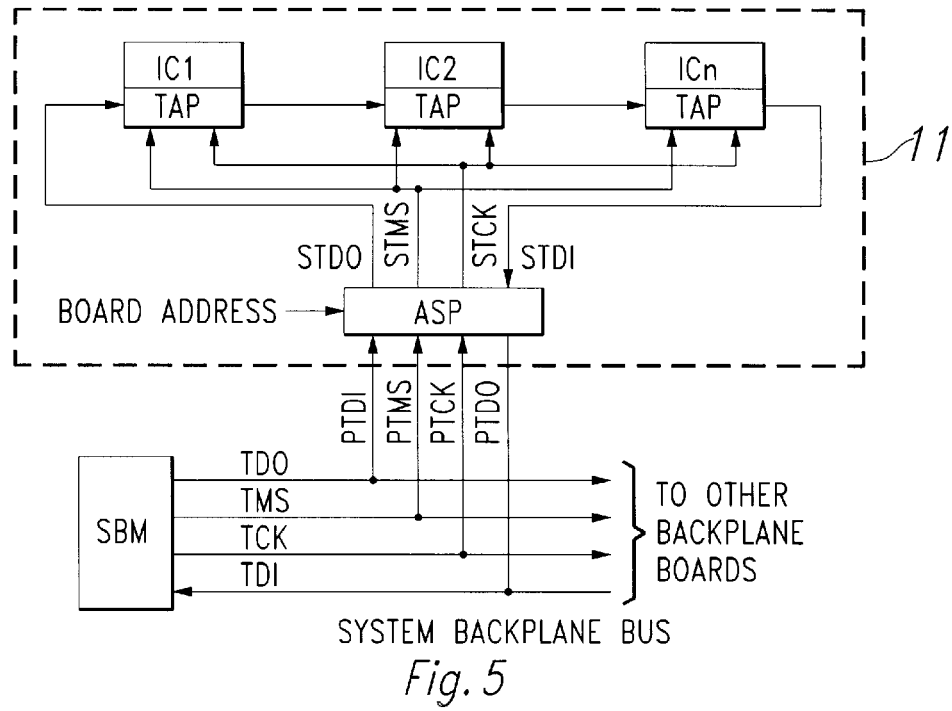
FIG. 5 depicts an embodiment of a connection between a serial bus master and a single board in a backplane environment using the 1149.1 standard bus and incorporating the addressable shadow port of the invention.

A first embodiment of a board example using the invention is shown in FIG. 5. Board 11 is comprised of multiple ICs IC1, IC2, ICN and an Addressable Shadow Port ASP, coupled to a system backplane bus using the 1149.1 standard bus and further coupled to serial bus master SBM. The ICs operate, when coupled to the 1149.1 serial bus via the ASP, exactly as described in the board of FIG. 1. The ASP has a backplane interface for connection to the backplane level 1149.1 serial bus signals, a board interface for connection to the board level 1149.1 serial bus signals, and an address input. The backplane 1149.1 serial bus signals are referred to as; primary TDI (PTDI), primary TDO (PTDO, primary TCK (PTCK), and primary TMS (PTMS). The board 1149.1 serial bus signals are referred to as; secondary TDI (STDI), secondary TDO (STDO), secondary TCK (STCK), and secondary TMS (STMS). The address input to the ASP is used to identify the board on which the ASP mounted.

The invention defines a serial bus protocol and circuitry that provides an addressable method of coupling the SBM up to one of many boards in a backplane, via the 1149.1 serial bus network. The circuit and related protocol is referred to herein as an Addressable Shadow Port (ASP). The term "shadow" indicates the nature of the protocol and circuitry, since it exists in the background of the serial bus it is associated with. While the 1149.1 serial bus is in operation, the ASP is inactive and does not interfere with the operation of the bus. The ASP can be enabled when the 1149.1 backplane serial bus is in either the IDLE or RESET states (FIG. 2). The ASP is enabled when it is required to connect the SBM up to one of the boards in the backplane. After the ASP has been used to connect a board to the SBM, it is disabled and is transparent to the normal operation of the 1149.1 serial bus or whatever bus it is associated with.

Since the invention operates via its own unique protocol that is not part of the 1149.1 protocol, it provides a solution to the extension of the 1149.1 standard to the backplane environment without modification of the 1149.1 standard or the need for additional hardware translation circuitry.

The ASP protocol can select or deselect boards while the 1149.1 backplane serial bus is in either the IDLE or RESET states. This is a critical advantage over other suggested or existing approaches, because by allowing the 1149.1 bus to remain in the IDLE state when selecting a new board the invention supports the simultaneous execution of self test or other high level functions on each board. If it were necessary to transition back through the RESET state of the 1149.1 standard to select the next board, the ASP protocol would not support these higher level test functions running simultaneously on multiple boards. Desirable tests also could not be executed between boards, because when the board's IC's see the RESET state on the bus, the test mode is aborted and the IC's on the board enter the functional mode. This situation could arise if one wanted to test board to board operations, for example.

Although in FIG. 5 the board address is shown to be externally input to the ASP, it could be hard-coded or electrically programmable inside the ASP circuit as well. The protocol of the invention provides the ability to select a particular board by having the SBM output the address of the board to be selected using a unique serial protocol that does not affect the existing standard protocol developed for the 1149.1 serial bus.

Figure 6:
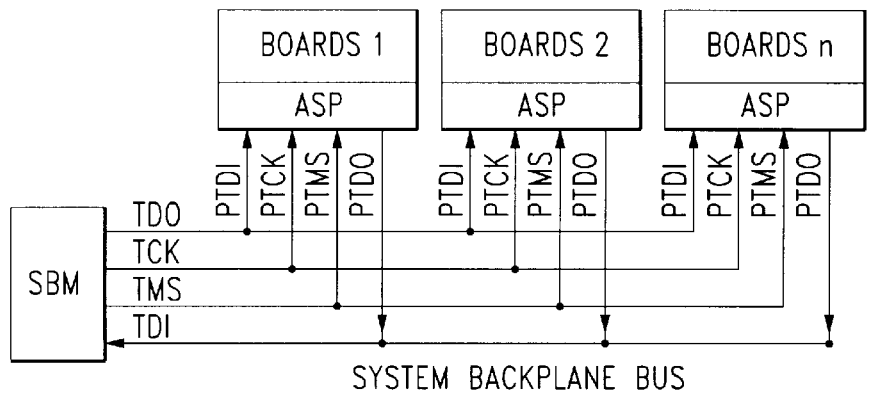
FIG. 6 depicts a system backplane having multiple boards connected to a serial bus master with a 1149.1 serial bus using the protocol and hardware of the invention.

In FIG. 6, multiple boards BOARD1, BOARD2, BOARDN, each similar to the one in FIG. 5, are shown being interfaced to the SBM via ASPs. In operation, when one of the boards needs to be accessed, the SBM transmits a select protocol that addresses and enables the ASP of the selected board. Embedded in the ASP select protocol is an address that is used to match against the address associated with each ASP. All ASPs receive the select protocol from the SBM, but only the one with the matching address is selected.

In response to the SBM select protocol, the selected ASP transmits an acknowledge protocol, containing its address, back to the SBM to verify the connection. After transmitting the acknowledge protocol, the selected ASP makes a connection between the backplane and board 1149.1 signals, such that the PTDI backplane signal couples to the STDO board signal, likewise PTMS couples to STMS, PTCK couples to STCK, and PTDO couples to STDI. In response to the ASP acknowledge protocol, the SBM communicates further commands and data to the selected board, via the now transparent ASP, using the standard 1149.1 serial bus protocol.

After the SBM has completed its 1149.1 serial access to the currently selected board, it can select another board by transmitting a new select protocol that addresses and enables another board's ASP. The new selection protocol can be transmitted by the SBM while the serial bus is in either the IDLE or RESET state, (or any other 1149.1 state where the TDO and TDI signals are disabled). In response to the new select protocol the newly selected ASP transmits an acknowledge protocol back to the SBM then makes a connection between the backplane and board level 1149.1 buses. When a new ASP is selected, the previously selected ASP disconnects from the backplane 1149.1 backplane bus. The disconnecting ASP remains in the state the backplane bus was in when the disconnect occurred, i.e. IDLE or RESET. In response to the new ASP acknowledge protocol, the SBM can output the standard 1149.1 protocol to transmit serial data into and out of the ICs of the newly selected board. This process is repeated each time a new board is selected.

The acknowledge protocol part of the ASP protocol scheme additionally allows the SBM to verify that it has successfully selected a board. For example, if the SBM outputs a select protocol to address a board in the backplane, and that board address does not exist or the addressed board is disabled or has been removed from the backplane, the SBM will not receive the acknowledge protocol. If the SBM does not receive the acknowledge protocol it will not attempt to communicate to the board using the 1149.1 serial bus protocol. Also the SBM can identify the problem and output an error indication that connection to that particular backplane board address failed.

A key feature of the invention is its capability to electronically connect the backplane level serial bus to a board level serial bus in response to a uniquely designed protocol. The ASP protocol has two parts; a select protocol transmitted from the SBM to the ASP of each board in the backplane, and an acknowledge protocol transmitted from the selected board's ASP to the SBM. This protocol is transmitted between the SBM and the ASP of each board in the backplane using the existing 4-wire serial bus signals defined by the 1149.1 serial bus. No additional backplane signals are required to use the invention. In addition, the protocol is transmitted so that it does not infringe upon the existing 1149.1 serial bus protocol.

This result is achieved by making use of the dead-time of the 1149.1 serial bus to transmit the ASP select and acknowledge protocols. In the 1149.1 serial bus configuration of FIG. 6, the SBM's TDO and TDI signals are only active to transfer serial data between the SBM and the selected board when the 1149.1 serial bus is active in its DSS or CSS states of FIG. 2. When the 1149.1 serial bus is in its RESET or IDLE states, the TDO and TDI signals of the 1149.1 serial bus are disabled. While the 1149.1 serial bus is in the RESET or IDLE state, the SBM can therefore output the invention's select protocol from the SBM's TDO output to the PTDI inputs of the ASPs, and receive the invention's acknowledge protocol from the selected ASP's PTDO output on the SBM's TDI input. Since the 1149.1 serial bus does not require use of the TDO and TDI signals while they are being used to transmit the invention's select and acknowledge protocols, these transactions do not interfere with or impinge upon the operation of the 1149.1 serial bus.

The ASP and the protocol expand the functionality of the SBM's 1149.1 TDO output and TDI input signals so that when not being used by the 1149.1 serial bus, they can be used to transmit the invention's protocol to address and select one of the boards connected to the backplane serial bus via the ASP circuit. Comparing the prior art star configuration of FIG. 4 against the ASP configuration of FIG. 6, the advantages of the ASP circuit and protocol are realized from the fact that the ASP approach eliminates the need for the additional TMS signals required in the 1149.1 star configuration. The ASP provides a method of overcoming the problems associated with the 1149.1 star configuration shown in FIG. 4, and creates an effective use of the 1149.1 serial bus at the backplane level to serially access boards.

Also when comparing the use of different backplane buses to interface into 1149.1 board environments versus using the ASP to achieve the same result, the invention advantageously does not require use of sophisticated, expensive, and inefficient translation circuitry, and the protocol of the invention advantageously allows the SBM to select, access and deselect multiple boards without the necessity of resetting the serial bus and its interfaces.

Figure 7:
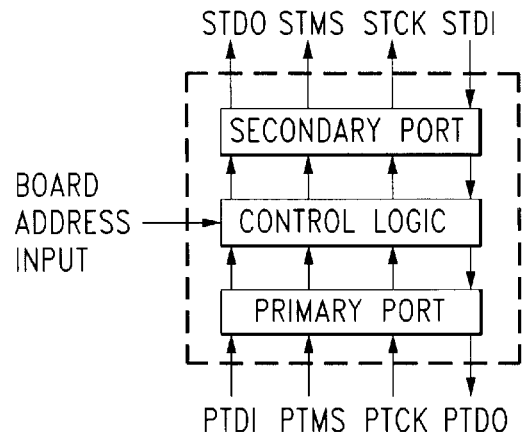
FIG. 7 depicts a block level diagram of the circuitry required to implement the addressable shadow port circuit of the invention.

A block diagram of the ASP circuit is shown in FIG. 7. The Addressable Shadow Port circuit consists of a primary port for interfacing to the backplane level 1149.1 serial bus signals (PTDI,PTMS,PTCK,PTDO), a secondary port for interfacing to the board level 1149.1 serial bus signals (STDO,STMS,STCK,STDI), and a control logic section. The control logic section provides the interface between the primary and secondary ports and also receives a board address input.

During a select protocol, the control logic receives a PTDI input sequence from the SBM. If the address received during the select protocol transmission matches the board address input to the control logic, the control logic makes a connection between the primary and secondary ports and transmits an acknowledge protocol, containing the board address, back to the SBM via the PTDO output. In response to receiving the acknowledge protocol, the SBM outputs the 1149.1 serial bus protocol onto the backplane to serially input data to and output data from the selected board, via the connection made between the primary and secondary ports of the ASP by the control logic.

If the address received during the select protocol transmission does not match the board address input, the control logic does not make a connection between the primary and secondary ports, and does not transmit an acknowledge protocol to the SBM. In response to not receiving the acknowledge protocol, the SBM detects that the board address does not exist or is unable to respond and does not attempt to transfer serial data to the board using the 1149.1 serial bus protocol.

Recalling FIG. 1, the 1149.1 serial bus has four bus signals, two signals for data transfer (TDI & TDO), one signal providing a clock (TCK), and one signal controlling the operation of the bus (TMS). The TMS signal controls the state of the bus as shown in the diagram of FIG. 2. The TMS signal determines whether the serial bus shifts data on the TDO and TDI signal paths or is placed in an IDLE or RESET state. Thus the 1149.1 serial bus uses separate signal paths for controlling the operation of the bus (TMS) and transferring serial data on the bus (TDO & TDI). Since the objective of the invention is not to intrude on the normal operation of the bus it is used with, the invention cannot reuse the TMS signal for controlling its select and acknowledge protocols.

In order for the SBM and ASP to communicate the invention's select and acknowledge protocols without using the 1149.1's TMS control signal, an encoding scheme was developed to allow control and data information to be transmitted together on a single wiring channel. In FIG. 6, the encoding scheme allows the SBM to transmit the select protocol from its TDO output to the ASP's PTDI inputs. Likewise, the encoding scheme allows the selected ASP to transmit the acknowledge protocol from its PTDO output to the SBM's TDI input. In both transactions, the protocols are transmitted over a single backplane wiring channel. The select protocol passes through the wiring channel between the SBM's TDO output and the ASP's PTDI inputs. The acknowledge protocol passes through the wiring channel between the selected ASP's PTDO output and the SBM's TDI input.

While this description illustrates the select and acknowledge protocols as being transmitted on separate single wiring channels, they could be transmitted on a common single wiring channel as well, since the protocols are never transmitted simultaneously. The reason the preferred embodiment presented here uses separate single wiring channels for the select and acknowledge protocols is to maintain compatibility with the 1149.1 serial bus standard, which uses two separate wiring channels so that serial data input and output transmissions can occur simultaneously.

Both the select and acknowledge protocols of the invention require a method of transmitting control to indicate; (1) an idle condition, (2) a start data transfer condition, and (3) a stop data transfer condition. In addition, both protocols require a method of transmitting data during the interval between the start and stop data transfer conditions.

To achieve the transmission of both control and data on a single wire, a unique bit-pair encoding scheme is used. The encoded bit-pairs are transferred between the SBM and ASP during select and acknowledge protocols synchronous to the backplane TCK signal. Two TCKs are required to transmit each encoded bit-pair. FIGS. 8–11 depict the inventions bit-pair encodings for: (8) an Idle bit-pair, (9) a Select bit-pair, (10) a logic 1 bit-pair, and (11) a logic 0 bit-pair respectively.

Figure 8:
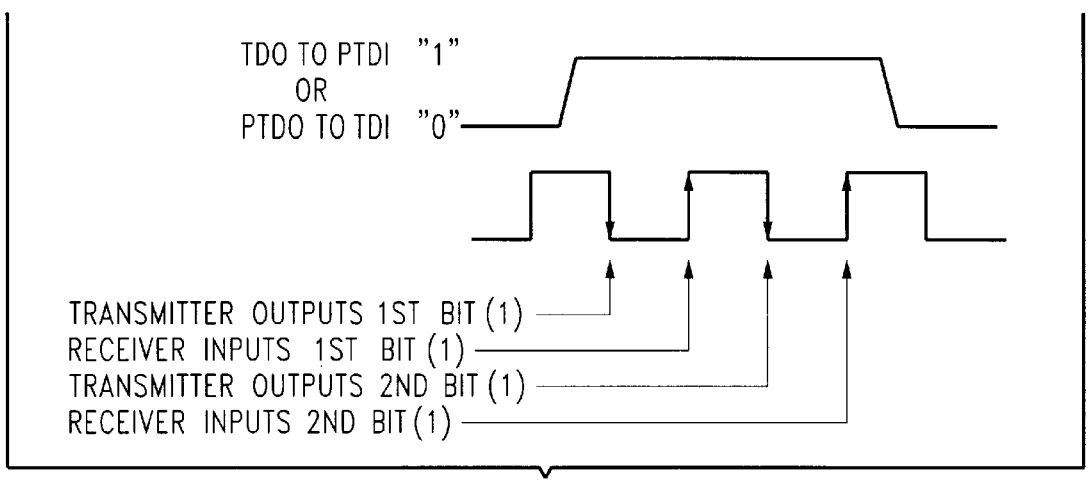
FIG. 8 depicts the timing of a transfer of an IDLE bit-pair of the protocol of the invention.

In FIG. 8, an encoded control signal, called Idle (I), is identified by the transfer of two successive logic one bits from a transmitter to a receiver. During the select protocol, the SBM (transmitter) outputs the Idle bit-pair on its TDO output to the ASP's (receivers) PTDI inputs. During the acknowledge protocol, the selected ASP (transmitter) outputs the Idle bit-pair on its PTDO output to the SBM's (receiver) TDI input. In the timing diagram of FIG. 8, it is seen that Idle bit-pairs are output from the transmitter on the falling edge of the TCK, and are input to the receiver on the rising edge of the TCK.

Figure 9:
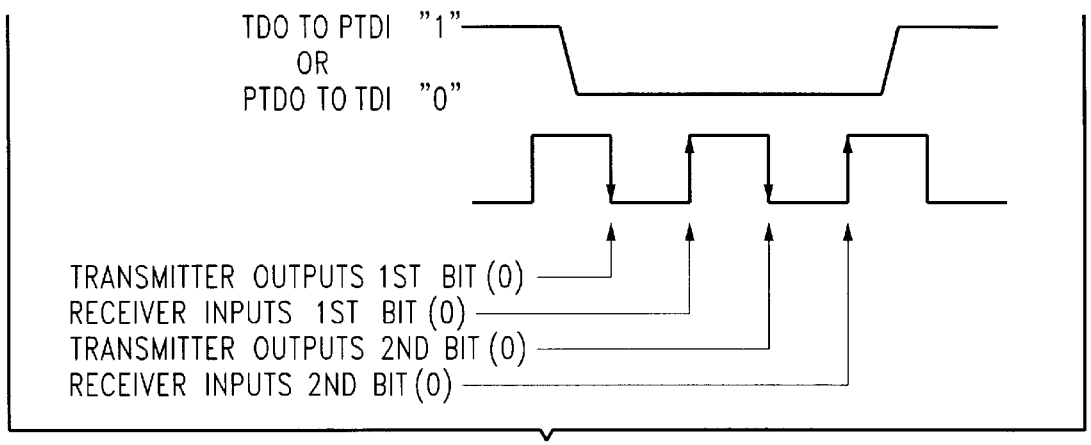
FIG. 9 depicts the timing of a transfer of a SELECT bit-pair of the protocol of the invention.

In FIG. 9, an encoded control signal, called Select (S), is identified by the transfer of two successive logic zero bits from a transmitter to a receiver. During the select protocol, the SBM (transmitter) outputs the Select bit-pair on its TDO output to the ASP's (receivers) PTDI inputs. During the acknowledge protocol, the selected ASP (transmitter) outputs the Select bit-pair on its PTDO output to the SBM's (receiver) TDI input. In the timing diagram of FIG. 9, it is seen that Select bit-pairs are output from the transmitter on the falling edge of the TCK, and are input to the receiver on the rising edge of the TCK.

Figure 10:
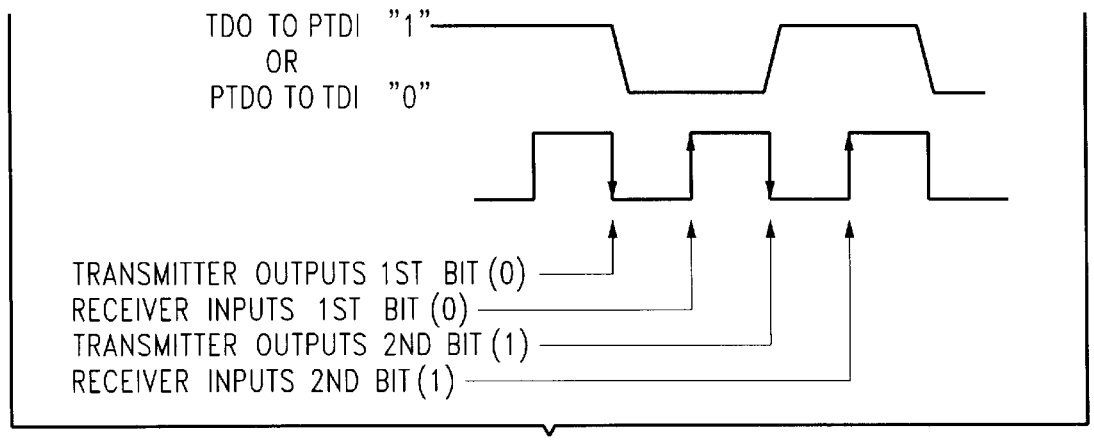
FIG. 10 depicts the timing of a transfer of a logic 1 data bit-pair of the protocol of the invention.

In FIG. 10, an encoded logic one signal, called Data (D), is identified by the transfer of a logic zero bit followed by a logic one bit from a transmitter to a receiver. During the select protocol, the SBM (transmitter) outputs the logic one Data bit-pair on its TDO output to the ASP's (receivers) PTDI inputs. During the acknowledge protocol, the selected ASP (transmitter) outputs the logic one Data bit-pair on its PTDO output to the SBM's (receiver) TDI input. In the timing diagram of FIG. 10, logic one Data bit-pairs are shown output from the transmitter on the falling edge of the TCK, and are input to the receiver on the rising edge of the TCK.

Figure 11:
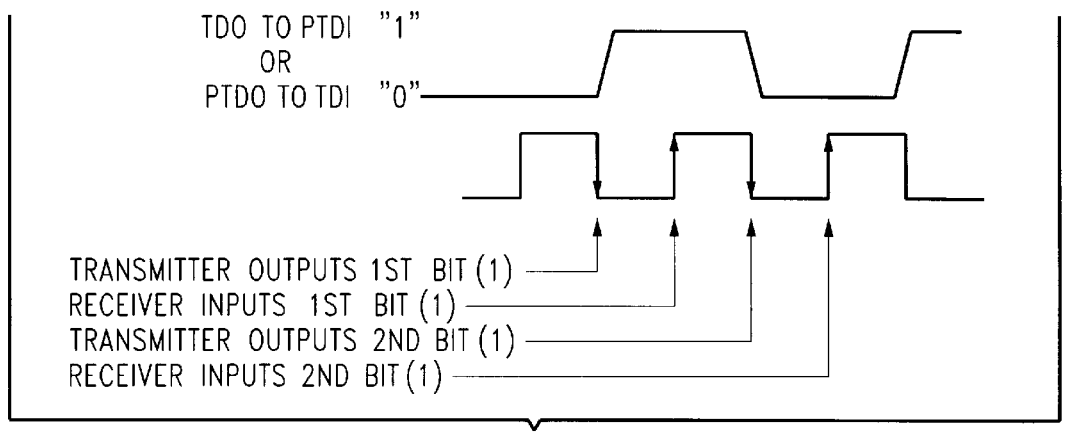
FIG. 11 depicts the timing of a transfer of a logic 0 data bit-pair of the protocol of the invention.

In FIG. 11, an encoded logic zero signal, called Data (D), is identified by the transfer of a logic one bit followed by a logic zero bit from a transmitter to a receiver. During the select protocol, the SBM (transmitter) outputs the logic zero Data bit-pair on its TDO output to the ASP's (receivers) PTDI inputs. During the acknowledge protocol, the selected ASP (transmitter) outputs the logic zero Data bit-pair on its PTDO output to the SBM's (receiver) TDI input. In the timing diagram of FIG. 11, logic zero Data bit-pairs are shown as output from the transmitter on the falling edge of the TCK, and are input to the receiver on the rising edge of the TCK.

Note that the definitions of a logic one DATA bit-pair represented by a 0 and 1 bit sequence and a logic zero DATA bit-pair represented by a 1 and 0 bit sequence could be reversed without departing from the nature of the invention. Also note that the rising edge and falling edge timing nature of the bit-pairs may be redefined as required in an application without departing from the nature of the invention.

The definitions of the Idle bit-pair represented by two successive 1's and the Select bit-pair represented by two successive 0's could be switched without departing from the nature of the invention. However, in the 1149.1 serial bus application of the invention, the definitions of the Idle and Select bit-pairs as shown in FIGS. 1 and 2 are very important. When the 1149.1 serial bus is in its RESET or IDLE state, the TDO output from the SBM and slave devices is disabled to a high logic level. While the 1149.1 serial bus is in the RESET or IDLE states, the inventions protocol can be output on the bus. Since both the select and acknowledge protocols start and stop by outputting IDLE bit-pairs, it makes sense that the Idle bit-pairs be of the same logic level as the disabled TDO outputs are in, i.e. a high logic level. Thus the definition shown for the Idle bit-pair, two success logic ones, enables a clean transition between the 1149.1's protocol and the inventions protocol. Unintentional entry into the ASP protocol of the invention is also avoided by the use of this definition of the Idle bit-pair.

Figure 12:
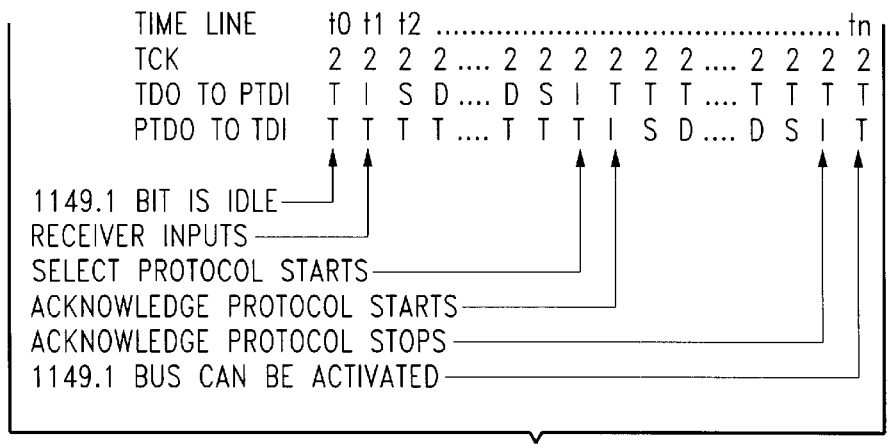
FIG. 12 depicts the transactions which occur between the serial bus master and the addressable shadow port of the invention during the select and acknowledge transactions of the shadow protocol.

In the diagram of FIG. 12 an example of the ASP select and acknowledge protocols are shown. In the diagram the sequence framed between the first and second Idle (I) bit-pair signals following the "TDO to PTDI" indication is the select protocol output from the SBM's TDO output to the ASP's PTDI inputs. The sequence framed between the first and second Idle bit-pair signals (I) following the "PTDO to TDI" indication is the acknowledge protocol output from the selected ASP's PTDO output to the SBM's TDI input. The select protocol always precedes the acknowledge protocol, as shown in the diagram.

Inside the select and acknowledge protocols, first and second Select bit-pair signals (S) frame a sequence of Data (D) bit-pair symbols. The sequence of "2's" following the TCK indication represents the number of test clocks required for each bit-pair signals transferred during each protocol. For clarification, a time line reference is shown to indicate the order in time in which the bit-pair signals are transferred. As shown in FIG. 12, the ASP protocol can be executed during times when the 1149.1 serial bus is idle in its RESET or IDLE states, to select a board for serial access.

The "T" signals in the protocol sequences in FIG. 12 indicate tri-state conditions on the TDO output from the SBM and the PTDO output from the ASP. The tri-state conditions are placed on the TDO and PTDO outputs whenever the 1149.1 serial bus is idle in the RESET or IDLE state. When a T signal is shown in the protocol sequence, the logic level on the wiring channel will be a logic one due to pull-up resistance on the TDI and PTDI inputs connected to the PTDO and TDO outputs.

The ASP protocol of the invention takes advantage of this 1149.1 pull-up requirement by defining the Idle bit-pair to be two logic ones, so that when the invention's protocol is idle, i.e. when no select or acknowledge protocols are being transmitted, the logic level it drives onto the bus is indistinguishable from the T signal logic level. Thus the Idle bit-pair encoding is necessary to making the invention transparent to the normal operation of the 1149.1 serial bus. In an alternative serial bus, where the inactive state of the bus drives the data wiring channels to a low logic level, it would be necessary to encode the Idle bit-pair as two logic zeros and the Select bit-pairs as two logic ones to enable the invention to operate transparently with that serial bus protocol.

The I signals in the protocol sequences indicate the transfer of an Idle bit-pair (two logic ones). The I signals are transferred at the beginning and ending of both the select and acknowledge protocols, to frame the protocols. The I signal transfer at the beginning of the select and acknowledge protocols is indistinguishable from the existing logic state of the wiring channel, since the T signals indicate that the wiring channel is pulled up to a logic one level. However, the I signal transfer at the end of the select and acknowledge protocol is distinguishable from the other preceding Select and Data bit-pairs (S & D) since the I signal is the only bit-pair defined by a two bit sequence of logic ones.

The S signals in the protocol sequences indicate the transfer of a Select bit-pair (two logic zeros). The S signals are transferred at the beginning and ending of a sequence of Data bit-pair (D) transfers, to frame the data transfer operation. Framing of the Data bit-pair transfer is possible since the S signals at the beginning and ending of the data transfer are distinguishable from the I and D signals, since the S signals are the only bit-pair defined by a two bit sequence of logic zeros.

The D signals in the protocol sequences indicate the transfer of a Data bit-pair. A logic zero Data bit-pair is a logic one bit followed by a logic zero bit. A logic one Data bit-pair is a logic zero bit followed by a logic one bit. The D signals are transferred after the first S signal is transferred and continue until the second S signal is transferred. The logic zero D signal is distinguishable from the I, S, and logic one D signals. The logic one D signal is distinguishable from the I, S, and logic zero D signal. A series of D signal transfers between the first and second S signals in the select and acknowledge protocols is referred to hereinafter as an address or an "A" signal. The number of D signals transferred within an address frame can be selected to be either a fixed or variable number. If fixed address framing is selected, all addresses framed between first and second S signals will be contain the same number of D signals. If variable address framing is selected, the number of D signals transferred within an address is determined by the occurrence of the first and second S signals. The advantage of fixed address framing over variable address framing is that address lengths are predictable during fixed framing, thus short or long addresses can be detected as failures, improving the fault tolerance of the invention's select and acknowledge protocols.

Figure 13:
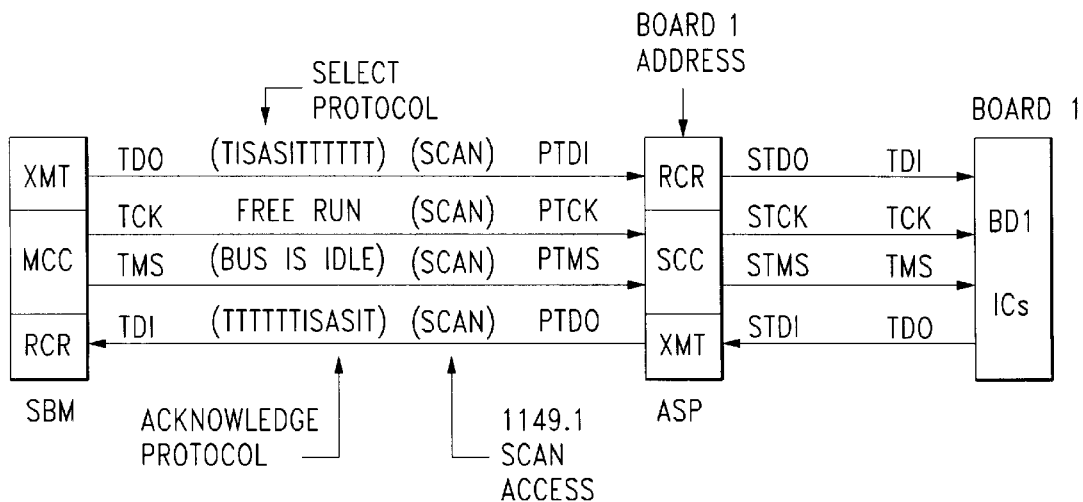
FIG. 13 depicts the signal transitions on the serial bus lines which occur during the select and acknowledge transactions between the addressable shadow port and the serial bus master using the protocol of the invention.

FIG. 13 depicts an example of select and acknowledge protocol signals (I,S,A) as transferred between an SBM and board resident ASP to enable scan access of board ICs Bd1 via the 1149.1 serial bus. In FIG. 13, the SBM is shown to be connected to only one board, however multiple boards are actually connected to the SBM as shown in FIG. 6.

The SBM has a transmitter circuit XMT to output the select protocol to the ASP from TDO to PTDI, a receiver circuit RCR to receive the acknowledge protocol from the ASP from PTDO to TDI, and a master control circuit MCC to regulate the operation of the transmitter and receiver circuits. When the SBM's transmitter circuit is not being used to output the select protocol, it can be used to output serial data to the selected board via the ASP during 1149.1 scan operations. Likewise, when the SBM's receiver circuit is not being used to receive the acknowledge protocol, it can be used to receive serial data from the selected board via the ASP during 1149.1 scan operations. The SBM's transmitter and receiver circuits are controlled by the master control circuit to either transmit and receive the 1149.1 serial bus protocol or the inventions protocol.

The ASP has a receiver circuit RCR to receive the select protocol from the SBM, a transmitter circuit XMT to output the acknowledge protocol to the SBM, and a slave control circuit SCC to regulate the operation of the transmitter and receiver circuits. The receiver, transmitter, and slave control circuits are part of the control logic section of the ASP block diagram of FIG. 7. If the ASP's receiver and transmitter circuits are not being used to communicate the select and acknowledge protocols, and if the ASP is selected, the receiver and transmitter circuits allow serial data to flow through the ASP from PTDI to STDO and from STDI to PTDO during 1149.1 scan operations. Also when the ASP is selected the TCK and TMS outputs from the SBM pass through the ASP via the PTCK to STCK and PTMS to STMS signal paths to control the board ICs during 1149.1 scan operations.

When scan access of board BD1 is required, the SBM's master control circuit causes the transmitter to output the select protocol signal sequence of ISASI to the ASP's receiver while the 1149.1 bus is idle. The "A" signal framed between the first and second S signals is a series of D signals equal to the address of board 1. At the end of the select protocol transmission from the SBM, the slave control circuit of the ASP checks the address input to the receiver circuit to see if it matches the boards address. If a match occurs the ASP's slave control circuit enables the ASP's transmitter circuit to output the acknowledge protocol signal sequence of ISASI to the SBM's receiver and then electronically connects the backplane and board level serial bus signals together. At the end of the acknowledge protocol transmission from the ASP, the master control circuit of the SBM checks the address input to the receiver circuit to see if the expected board address has been returned. If the expected address is returned, the master control circuit of the SBM enables the transmitter and receiver circuits to perform 1149.1 scan operations to serially access the ICs of board 1. During the scan operation the SBM outputs serial data and control to the board, via the ASP, from its TDO and TMS outputs and receives serial data from the board, via the ASP, on its TDI input. The SBM's TCK output free-runs, so it always provides a clock input to the ASP and board.

Figures 14, 15:
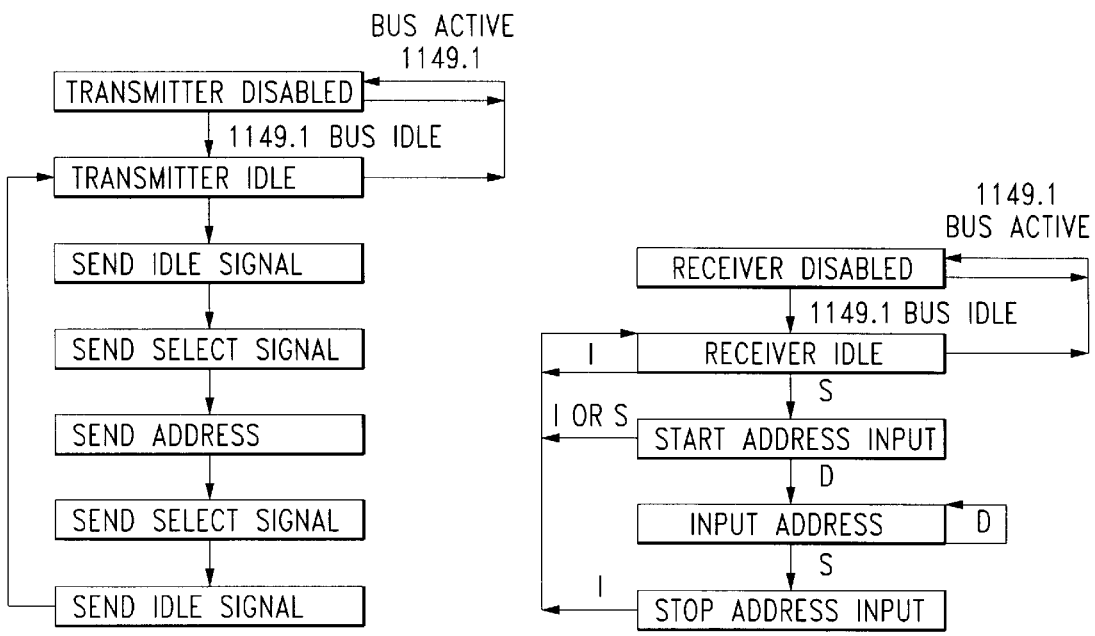
FIG. 14 is a state diagram depicting the states the transmitter circuitry resident in the serial bus master and the addressable shadow port of the invention transitions through during the transactions of the protocol.
FIG. 15 is a state diagram depicting the states the receiver circuitry resident in the serial bus master and the addressable shadow port of the invention transitions through during the transactions of the protocol.

A state diagram of the operation of the SBM's and ASP's transmitter circuits is shown in FIG. 14. The SBM's transmitter circuit is a master transmitter and the ASP's transmitter is a slave transmitter. The SBM uses its transmitter circuit to send the select protocol sequence and the ASP uses its transmitter circuit to send the acknowledge protocol sequence. The SBM outputs on its transmitter whenever it is necessary to send a select protocol, but the ASP can only output the acknowledge protocol on its transmitter in response to a select protocol transmission from the SBM. Since the select and acknowledge protocol sequences are identical, a common transmitter circuit design can be used in both SBM and ASP devices, simplifying the implementation of the invention circuitry.

In the state diagram, the transmitter circuit is forced into the Transmitter Disabled state while the 1149.1 bus is active. This state insures that the transmitter cannot be inadvertently enabled, while the 1149.1 bus is in operation, to output select or acknowledge protocols. When the 1149.1 bus is idle, the transmitter circuit enters into the Transmitter Idle state. If it is not necessary to output a select or acknowledge protocol, the transmitter circuit remains in the Transmitter Idle state until the 1149.1 bus becomes active again, in which case the transmitter circuit returns to the Transmitter Disabled state.

If it is necessary to output a select or acknowledge protocol, while in the Transmitter Idle state, the transmitter circuit enters the Send Idle Signal state to output the first I signal, then enters the Send Select Signal state to output the first S signal, then enters the Send Address state to output a series of D signals indicating the address, then enters the Send Select Signal state to output the second S signal, then enters the Send Idle Signal state to output the second I signal, and then returns to the Transmitter Idle state. After the protocol has been sent, the transmitter returns to the Transmitter Disabled state whenever the 1149.1 bus becomes active.

A state diagram of the operation SBM's and ASP's receiver circuits is shown in FIG. 15. The ASP uses its receiver circuit to receive the select protocol sequence and the SBM uses its receiver circuit to receive the acknowledge protocol sequence. Since the received select and acknowledge protocol sequences are identical, a common receiver circuit design can be used in both SBM and ASP devices, simplifying the implementation of the invention.

In the state diagram, the receiver circuit is forced into the Receiver Disabled state while the 1149.1 bus is active. This state insures that the receiver cannot be inadvertently enabled, while the 1149.1 bus is in operation, to receive a false input condition. When the 1149.1 bus is idle, the receiver circuit enters into the Receiver Idle state. If the 1149.1 bus becomes active again, the receiver circuit returns to the Receiver Disabled state. While in the Receiver Idle state, the receiver circuit polls for the occurrence of an I or S signal. In response to an I signal, the receiver remains in the Receiver Idle state. In response to an S signal, the receiver signals the occurrence of a first S signal to the associated master or slave control circuits MCC or SCC and transitions into the Start Address Input state to start the address input operation.

When a transition into the Start Address Input state occurs, the receiver circuit polls for the occurrence of an I, S, or D signal. In response to an I or S signal input, the receiver circuit will transition from the Start Address Input state back into the Receiver Idle state and signal the master or slave control circuit that a false first S signal had been received. This transition path provides; (1) a method of returning receiver circuit to the Receiver Idle state in the event that the receiver transitioned into the Start Address input state in response to an error input, and (2) a method of signaling the associated master or slave control circuit that a select or acknowledge protocol had not actually been started and to reset and begin looking for the next occurrence of a first S signal indication. In response to a D signal input, the receiver circuit transitions from the Start Address input state into the Input Address state and starts receiving the transmitted address. The receiver remains in the Input Address state and continues receiving the address while D signals are being input. In response to an S signal, the receiver circuit stops inputting the address, signals the occurrence of the second S signal to the associated master or slave control circuit, and transitions from the Input Address state into the Stop Address Input state. When the ASP's receiver enters the Stop Address Input state, the slave control circuit matches the address input to the ASP against the board's address to see if the board has been selected. The ASP's receiver transitions from the Stop Address Input state to the Receiver Idle state in response to an I signal input from the SBM. If the address input matches the board address, the ASP's slave control circuit instructs the ASP's transmitter circuit to send an acknowledge protocol to the SBM's receiver and then connects the backplane serial bus to the boards serial bus.

When the SBM's receiver enters the Stop Address Input state, the master control circuit matches the address input to the SBM against the expected board address to see if the correct board has been selected. The SBM's receiver transitions from the Stop Address Input state to the Receiver Idle state in response to an I signal input from the ASP. If the address input matches the expected board address, the SBM's master control circuit can serially access the board using the 1149.1 serial bus protocol. If the address input does not match the expected board address, the SBM's master control circuit will not attempt to serially access the board and will report the failure.

Figures 16, 17:
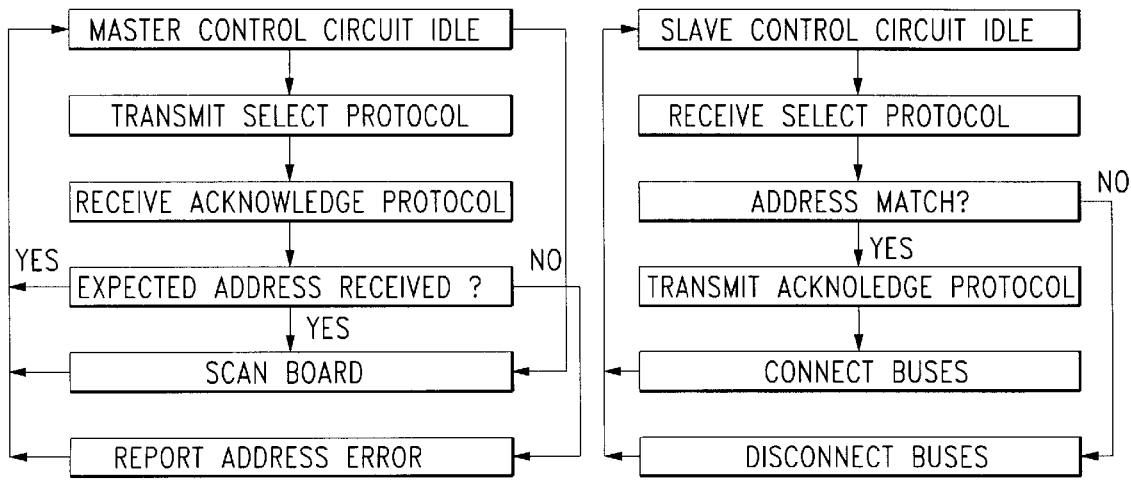
FIG. 16 is a state diagram depicting the states the master control circuitry of the serial bus master circuit transitions through during the transactions of the protocol of the invention.
FIG. 17 is a state diagram depicting the states the slave control circuitry of the addressable shadow port circuit transitions through during the transactions of the protocol of the invention.

A state diagram of the operation of the SBM's master control circuit is shown in FIG. 16. The master control circuit regulates the operation of the SBM's transmitter and receiver circuits. The master control circuit can enable the SBM's transmitter and receiver circuits to communicate to the ASPs using either the 1149.1 serial bus protocol or the inventions select and acknowledge protocols. Initially, the master control circuit will communicate to the ASPs using the inventions select and acknowledge protocols to select a board for serial access. After a board has been selected the master control circuit serially accesses the board using the 1149.1 serial bus protocol.

The state diagram of FIG. 16 shows that when no board is being accessed, the master control circuit is in the Master Control Circuit Idle state. If access is required to a board whose ASP has previously been selected, the master control circuit can transition from the Master Control Circuit Idle state to the Scan Board state and serially access the board using the 1149.1 protocol. However, if the boards ASP has not been previously selected or if a new board is to be accessed, the master control circuit must select the board's ASP before entering the Scan Board state. To select a board's ASP, the master control circuit transitions from the Master Control Circuit Idle state into the Transmit Select Protocol state. In the Transmit Select Protocol state, the master control circuit loads the SBM's transmitter circuit with the address of the board to be selected, and then enables the transmitter circuit to transmit a select protocol sequence to select the board's ASP.

After enabling the transmitter circuit to send the select protocol, the master control circuit transitions from the Transmit Select Protocol state to the Receive Acknowledge Protocol state. In the Receive Acknowledge Protocol state, the master control circuit enables the SBM's receiver circuit to receive the acknowledge protocol from the selected ASP. After the acknowledge protocol is received, the master control circuit transitions from the Receive Acknowledge Protocol state into the Expected Address Received? state to verify that the address of the selected ASP was received. If an incorrect address was received, the master control circuit aborts the board select operation and transitions from the Expected Address Received? state into the Report Address Error state. In the Report Address Error state, the master control circuit reports the address failure and places the SBM's transmitter and receiver circuits into their idle state.

If the correct address is received, the master control circuit may either transition from the Expected Address Received? state into the Master Control Circuit Idle state and access the selected board at a later time, or transition into the Scan Board state to immediately access the board using the 1149.1 serial bus protocol. In either case, when the master control circuit does enter the Scan Board state, it configures the SBM's transmitter and receiver circuits to where they can be used to communicate with the board using the 1149.1 serial bus protocol. After the board has been serially accessed in the Scan Board state, the master control circuit transitions from the Scan Board state into the Master Control Circuit Idle state, where it disables the SBM's transmitter and receive circuits and remains until it is required to serially access the same or another board.

A state diagram of the operation of the ASP's slave control circuit is shown in FIG. 17. The slave control circuit regulates the operation of the ASP's transmitter and receiver circuits. The slave control circuit enables the ASP's transmitter and receiver circuits to communicate to the SBM using the inventions select and acknowledge protocols. After the ASP has been selected by the SBM, the slave control circuit enables the transmitter and receiver circuits to pass the serial data input and output through the ASP during 1149.1 scan operations.

In the state diagram, it is seen that when no select protocols are being sent from the SBM to the ASP, the slave control circuit will be in the Slave Control Circuit Idle state. When the start of a select protocol is received by the ASPs receiver circuit the slave control circuit will transition from the Slave Control Circuit Idle state into the Receive Select Protocol state. After the select protocol is received, the slave control circuit transitions from the Receive Select Protocol state into the Address Match? state. In the Address Match? state the slave control circuit reads the address received by the ASP's receiver circuit and compares the address against the board address. If the address does not match the ASP's board address, the slave control circuit transitions from the Address Match? state into the Disconnect Buses state to disconnect any previously connected board to backplane bus signals inside the ASP. From the Disconnect Buses state the slave control circuit transitions into the Slave Control Circuit Idle state and waits for the start of another select protocol sequence.

If the address matches the ASP's board address, the slave control circuit transitions from the Address Match? state into the Transmit Acknowledge Protocol state. In the Transmit Select Protocol state, the slave control circuit loads the board address into the ASP's transmitter circuit and then enables the ASP's transmitter circuit to transmit an acknowledge protocol sequence to the SBM's receiver circuit to verify the ASP is selected and the board to backplane connections are made. After the acknowledge protocol is sent the slave control circuit disables the ASP's transmitter and transitions from the Transmit Acknowledge Protocol state into the Connect Buses state. In the Connect Buses state the slave control circuit outputs control to connect the board and backplane bus signals inside the ASP, enabling the SBM to serially access the board ICs using the 1149.1 serial bus protocol. After the buses are connected the slave control circuit transitions from the Connect Buses state into the Slave Control Circuit Idle state to wait for the start of another select protocol input from the SBM.

Figure 18:
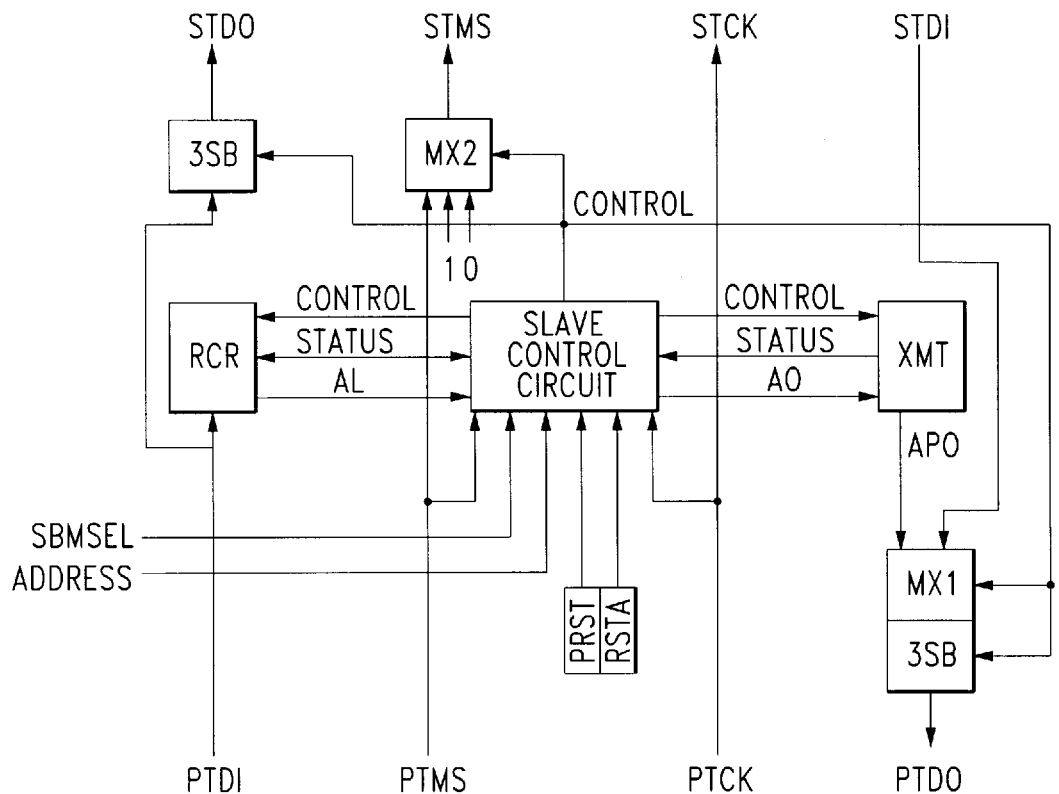
FIG. 18 depicts the subcircuits required in one preferred embodiment of the addressable shadow port circuit of the invention.

FIG. 18 depicts one possible circuit implementation of the Addressable Shadow Port hardware.

The receiver circuit RCR consists of a controller for regulating the protocol input from the SBM, and a serial input/parallel output SIPO register for receiving the serial address from the SBM and outputting the address in parallel to the slave control circuit. The PTDI signal is input to the SIPO register to supply the serial address during select protocols, and is input to the controller for regulating the operation of the receiver during select protocols. The parallel address output from the SIPO register is input to the slave control circuit via the address input to the slave controller circuit to indicate when a select protocol has started, when the address is ready to read, and when the select protocol has completed.

The receiver's RCR controller determines when a first "I then S then D" signal sequence occurs on PTDI, indicating the start of the select protocol and the start of the address input. In response to this input the controller enables the SIPO to receive the serial address input on PTDI. The RCR controller next determines when a first "D then S then I" sequence occurs on the PTDI signal, indicating the end of the address input and select protocol. In response to this input sequence, the RCR controller sends status to the slave control circuit to enable the address in the SIPO register to be parallel input to the slave control circuit via the AI bus, and terminates the select protocol input operation.

The transmitter circuit XMT consists of a controller for regulating the acknowledge protocol output from the ASP, and a parallel input/serial output or PISO register for receiving the parallel ASP address from the slave control circuit and outputting the address serially to the PSBM. The PISO register receives parallel data from the slave control circuit via the address output bus AO, and outputs the address serially to multiplexer MX1 via the acknowledge protocol output signal APO. The XMT controller receives control input from the slave control circuit via the control bus, and outputs status to the slave control circuit via the status bus. Control input on the XMT control bus regulates the parallel to serial conversion process that takes place during the acknowledge protocol. The status output from the transmitter XMT informs the slave control circuit of the transmitters status during the acknowledge protocol, i.e. whether the acknowledge protocol is in progress or is completed.

At the beginning of an acknowledge protocol, the slave control circuit enables multiplexer MX1 and the tri-state buffer 3SB to pass the APO signal from the transmitter to the PTDO output. The slave control circuit then inputs the ASP address to transmitter XMT via the AO bus, which is then to be shifted out on PTDO. In response to the address input, the transmitter XMT outputs a I and S signal on output PTDO to start the acknowledge protocol, then serially transmits the address on PTDO. After the address is shifted out, the transmitter circuit XMT outputs an S and I signal sequence to stop the acknowledge protocol.

The slave control circuit is a controller that regulates the operation of the ASP transmitter circuit, receiver circuit RCR, and multiplexers MX1 and MX2 in response to matching address input during a select protocol. The slave control circuit receives the PTMS and PTCK signals from the primary port of the ASP, the address input AI and status buses from the receiver RCR, the status bus from transmitter XMT, the external ASP board address signals, a reset signal from the power up reset circuit PRST, and reset address signals from the reset address circuit RSTA. The slave control circuit outputs control to the receiver circuit RCR, transmitter circuit XMT, tri-state buffers 3SBs, and multiplexers MX1 and MX2.

The slave control circuit is clocked by the PTCK input from the primary port. The PTMS input from the primary port indicates to the slave control circuit when the 1149.1 bus is busy, idle or reset. The status inputs from the receiver and transmitter circuits inform the slave control circuit of the receiver and transmitter circuit status. The AI bus from the receiver is used to input the address received during a select protocol to the slave control circuit. The reset input from the PRST circuit resets the slave control circuit at powerup. The reset address input from the RSTA circuit allow resetting the slave control circuit via a reset address input from a select protocol operation.

The control output from the slave control circuit controls the operation of the receiver, transmitter, and MX1 and MX2. The AO bus output from the slave control circuit is used to input the ASPs parallel address to the transmitter during acknowledge protocols.

During select protocols, the slave control circuit receives parallel address input from the receiver RCR via the AI bus. The status bus input from the receiver RCR informs the slave control circuit when a select protocol has started, when the address input is ready, and when the select protocol is complete. From the address input AI, the slave control circuit determines whether a match occurred and it has been selected. If the received address matches the board address the ASP responds by outputting an acknowledge protocol, then connects the ASP primary and secondary ports together.

During acknowledge protocols, the slave control circuit outputs control to the transmitter XMT to start an acknowledge protocol, and also to input the ASP address to the transmitter XMT via the AO bus for output during the acknowledge protocol. The status bus input from the transmitter XMT informs the slave control circuit when the acknowledge protocol starts and completes. After the acknowledge protocol completes, the slave control circuit outputs control to enable the STDO and PTDO tri-state buffers 3SBs, and connects PTMS to STMS via multiplexer MX2, and STDI to PTDO via mux MX1.

Multiplexer MX1 receives selection control input from the slave control circuit and the APO signal from the transmitter XMT and the STDI signal from the secondary port of the ASP. MX1 outputs the selected input (STDI or APO) to the PTDO output signal via 3-state output buffer 3SB. The output buffer 3SB is enabled or disabled (tri-stated) by a control input from the slave control circuit.

Multiplexer MX2 also receives selection control from the slave control circuit, the PTMS signal from the primary port, and a logic 0 and 1 input. In response to the control input MX2 outputs the selected data input PTMS, logic 0, or logic 1 to the STMS output signal.

When power is first applied to the ASP hardware, the slave control circuit is reset by an input from the power-up reset circuit PRST, which deselects the ASP from the backplane. When reset, the slave control circuit outputs control to: reset the transmitter and receiver circuits to their idle states, disable the STDO and PTDO outputs to a logic 1 via their tri-state buffers 3SB, cause the STMS signal to output a logic 1 from multiplexer MX2, and cause the STCK signal to output the PTCK clock. The logic 1 output on the STMS signal and the free running clock on STCK insure that the board level serial bus is disabled and the TAPs of the ICs on the board are transitioned into their RESET state as shown in FIG. 2. While an internal power-up reset PRST circuit is illustrated, the reset could also be achieved by other means, such as inputting a reset signal to the slave control circuit using an external reset input signal.

The ASP can also be reset by inputting a select protocol with an address that matches the reset address RSTA as shown in FIG. 18. The reset address is a fixed address that is input to the slave control circuit and matched against the address input from the receiver circuit after a select protocol has been received. If the address input matches the reset address, the ASP is reset to the same state as described in the power-up reset. The fixed reset address is the same for all ASPs so that a global reset of all ASPs can be achieved by the transmission of a single select protocol containing the reset address. Since the reset address is used to reset the ASP, it must be unique and not reused as a board address. A preferred value for the ASP reset address is zero, since board address numbering will usually start with an address of 1 and go up through address N as shown in FIG. 6. When the SBM of FIG. 6 inputs a select protocol containing the reset address zero, the ASPs respond by resetting and deselecting themselves from the backplane serial bus. Also there is no acknowledge protocol transmitted from the ASPs to the SBM whenever a reset address is input via a select protocol. Elimination of the acknowledge protocol is required to avoid contention of logic states that would occur between the PTDO outputs of multiple ASPs during an acknowledge protocol transmission.

When the SBM places the 1149.1 backplane serial bus in the RESET state (as shown in FIG. 2), the PTMS signal will be at a logic 1 state, the PTCK signal will be active, and the PTDI and PTDO signals will be disabled to a high logic state (T condition of FIG. 12). If, during the RESET state, the SBM inputs a select protocol to the ASP and the address matches the ASP's board address, the ASP will be selected and respond back to the SBM with an acknowledge protocol. During the acknowledge protocol, the slave control circuit enables the PTDO tri-state buffer 3SB and selects the acknowledge protocol output APO as data output by multiplexer MX1 so that the transmitter circuit XMT can output the acknowledge protocol.

After transmitting the acknowledge protocol, the slave control circuit connects the board and backplane serial buses together. During the connection process, the STDO tri-state buffer 3SB is enabled to output the PTDI backplane signal, mux MX1 is switched from outputting the APO input on PTDO to outputting the STDI board signal input on PTDO, the PTDO tri-state buffer 3SB remains enabled, and mux MX2 is switched from outputting either the logic 1 or 0 input on STMS to outputting the PTMS backplane signal input. The following three scenarios describe what happens on the STMS output when an ASP that has previously been: (1) reset, (2) deselected and left in the RESET state, or (3) deselected and left in the IDLE state, is selected while the backplane 1149.1 bus is the RESET state.

(1) If the ASP is selected (while the backplane bus is in the RESET state) after being reset, multiplexer MX2 switches from outputting the logic 1 input on STMS to outputting the present PTMS backplane signal on STMS. Since the PTMS signal is a logic 1 when the backplane bus is in the RESET state, the STMS output signal remains at a logic 1 during the connection process.

(2) If the ASP is selected (while the backplane bus is in the RESET state) after having been previously deselected while the backplane bus was in the RESET state (PTMS is a logic 1 level in the RESET state), mux MX2 switches from outputting the previous PTMS state (logic 1 input) on STMS to outputting the present PTMS backplane signal on STMS. Since signal PTMS is a logic 1 when the backplane bus is in the RESET state, the signal STMS output remains at a logic 1 during the connection process.

(3) If the ASP is selected (while the backplane bus is in the RESET state) after having been previously deselected while the backplane bus was in the IDLE state (PTMS is a logic 0 level in the IDLE state), mux MX2 switches from outputting the previous PTMS state (logic 0 input) on STMS to outputting the present PTMS backplane signal on STMS. Since the PTMS is a logic 1 when the backplane is in the RESET state, the STMS output changes from outputting a logic 0 to outputting a logic 1 during the connection process.

When the SBM places the 1149.1 backplane serial bus in the RESET state (FIG. 2), the PTMS signal will be at a logic 1 state, the PTCK signal will be active, and the PTDI and PTDO signals will be disabled to a high logic state (T condition of FIG. 12). If, during the RESET state, the SBM inputs a select protocol to select a new ASP, the presently selected ASP becomes deselected and disconnected from the backplane bus by control output from the ASP's slave control circuit. During the disconnection process, the STDO and PTDO outputs are disabled to a logic 1 state via their tri-state buffers 3SB, mux MX1 continues to select and output the STDI signal to the input of the PTDO 3SB, and mux MX2 is switched from outputting the high logic level from the PTMS backplane signal (PTMS is high when backplane bus is in the RESET state) on STMS to outputting the logic 1 input on STMS. By forcing MX2 to select and output the logic 1 input on the STMS output, the board level 1149.1 serial bus remains in the RESET state after the ASP is deselected. The invention thus allows the ASP to keep the board level 1149.1 serial bus in the RESET state after it has been deselected.

When the SBM places the 1149.1 backplane serial bus in the IDLE state (FIG. 2), the PTMS signal will be at a logic 0 state, the PTCK signal will be active, and the PTDI and PTDO signals will be disabled to a high logic state (T condition of FIG. 12). If, during the IDLE state, the SBM inputs a select protocol to the ASP and the address matches the ASP's board address, the ASP will be selected and respond back to the SBM with an acknowledge protocol. During the acknowledge protocol, the slave control circuit enables the PTDO tri-state buffer 3SB and selects the acknowledge protocol output signal APO to mux MX1 so that the transmitter circuit can output the acknowledge protocol.

After transmitting the acknowledge protocol, the slave control circuit connects the board and backplane serial buses together. During the connection process, the STDO tri-state buffer 3SB is enabled to output the PTDI backplane signal, mux MX1 is switched from outputting the APO input on PTDO to outputting the STDI board signal input on PTDO, the PTDO tri-state buffer 3SB remains enabled, and mux MX2 is switched from outputting either the logic 1 or 0 input on the STMS signal to outputting the PTMS backplane signal input on the STMS signal. The following three scenarios describe what happens on the STMS output when an ASP that has previously been; (1) reset, (2) deselected and left in the RESET state, or (3) deselected and left in the IDLE state, is selected while the backplane 1149.1 bus is the IDLE state.

(1) If the ASP is selected (while the backplane bus is in the IDLE state) after having been previously reset, MX2 switches from outputting the logic 1 input on STMS to outputting the present PTMS backplane signal on STMS. Since PTMS is a logic 0 when the backplane bus is in the IDLE state, the STMS output changes from outputting a logic 1 to outputting a logic 0 during the connection process.

(2) If the ASP is selected (while the backplane bus is in the IDLE state) after having been previously deselected while the backplane bus was in the RESET state (PTMS is a logic 1 level in the RESET state), mux MX2 switches from outputting the previous PTMS state (logic 1 input) on STMS to outputting the present PTMS backplane signal on STMS. Since PTMS is a logic 0 when the backplane bus is in the IDLE state, the STMS output changes from outputting a logic 1 to outputting a logic 0 during the connection process.

(3) If the ASP is selected (while the backplane bus is in the IDLE state) after having been previously deselected while the backplane bus was in the IDLE state (PTMS is a logic 0 level in the IDLE state), MX2 switches from outputting the previous PTMS state (logic 0 input) on STMS to outputting the present PTMS backplane signal on STMS. Since the PTMS is a logic 0 when the backplane is in the IDLE state, the STMS output remains at a logic 0 during the connection process.

When the SBM places the 1149.1 backplane serial bus in the IDLE state (FIG. 2), the PTMS signal will be at a logic 0 state, the PTCK signal will be active, and the PTDI and PTDO signals will be disabled to a high logic state (T condition of FIG. 12). If, during the IDLE state, the SBM inputs a select protocol to select a new ASP, the presently selected ASP becomes deselected and disconnected from the backplane bus by control output from the ASP's slave control circuit. During the disconnection process, the STDO and PTDO outputs are disabled to a logic 1 state via their tri-state buffers 3SB, multiplexer MX1 continues to select and output the STDI signal to the input of the PTDO 3SB, and mux MX2 is switched from outputting the low logic level from the PTMS backplane signal (PTMS is low when backplane bus is in the IDLE state) on STMS to outputting the logic 0 input on STMS. By forcing multiplexer MX2 to select and output the logic 0 input on the STMS output, the board level 1149.1 serial bus remains in the IDLE state after the ASP is deselected. The invention thus allows the ASP to keep the board level 1149.1 serial bus in the IDLE state after it has been deselected.

Although this application has discussed the ASP protocol in terms of the standard 1149.1 serial bus, the ASP protocol herein described may be used with any other serial bus and protocol, as will be recognized by those skilled in the art. The invention can be used with other pre-existing or newly defined serial buses to provide a method of serially connecting a slave device (IC, board, etc) up to an SBM. For example, a typical serial bus is comprised of the following signal types. A control signal (like TMS) that regulates the normal operation of the serial bus. A clock signal (like TCK) that times the flow of serial data through devices on the serial bus. A serial data input signal (like TDI) for inputting data to a slave device. A serial data output signal (like TDO) for outputting data from a slave device. Since the normal operation of the serial bus is regulated by a control signal (like TMS), the protocol developed for the ASP avoids using this signal to select or deselect slave devices. By designing the ASP's protocol to be independent of a particular serial bus's control signal, the inclusion of invention into existing serial buses does not require modifying the serial bus's normal mode of operation.

The ASP circuit can exist as a packaged IC for assembly on a printed circuit board, an unpackaged die for assembly on a multi-chip module substrate, a subcircuit within an integrated circuit, or an embedded circuit in a multi-chip module semiconductor substrate. Other alternative implementations are possible and are considered within the scope of this application and its claims.

While the description of the invention herein illustrates the ASP circuit as being a board mounted device operable to selectively interface 1149.1 serial bus signals at the backplane level into 1149.1 serial bus signals at the board level, the ASP circuit can be used at any level of electronic assembly to provide a serially addressable interface between an SBM and slave devices on a serial bus. For example, in FIG. 6 the ASP circuit could be viewed as a circuit providing interface between the SBM and: (1) multiple subcircuits (1-n) connected to a common serial bus inside an IC, (2) multiple ICs (1-n) connected to a common serial bus on a multi-chip module, (3) multiple ICs (1-n) connected to a common serial bus on a board, (4) multiple boards (1-n) coupled to a common serial bus on a backplane, (5) multiple backplanes connected to a common serial bus in a subsystem, (6) multiple subsystems (1-n) connected to a common serial bus in a system, or (7) multiple systems (1-n) connected to a common serial bus network. These and other applications are also considered within the scope of this application.

Figure 19:
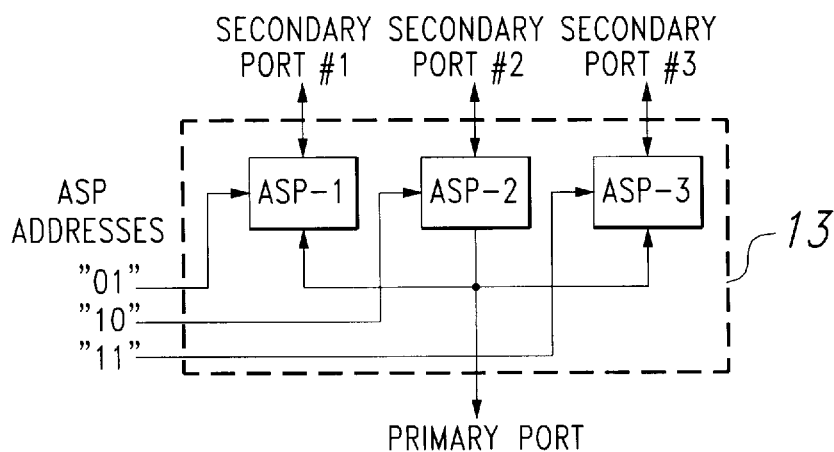
FIG. 19 depicts an alternative embodiment wherein an integrated circuit with multiple secondary ports contains several independently addressable shadow port circuits each connected to a single primary port coupled to the serial bus.

FIG. 19 depicts an alternative preferred embodiment of the invention in a circuit 13 having three separate secondary ports, each coupled to the primary ports by means of separately addressable ASP circuits ASP-1, ASP-2 and ASP-3. In some board designs, the 1149.1 serial bus may be partitioned into separate scan paths. To individually select and access each scan path from the backplane 1149.1 bus, via the primary port, separate ASPs are required. However, to reduce the number of ASP circuits on a board, multiple ASP circuits may be packaged in one IC as shown in FIG. 19. Each ASP circuit ASP-1, ASP-2, ASP-3 has its own unique address (01, 10, 11) and a common connection to the primary port so that it and only it can be selected and enabled to allow the backplane 1149.1 bus to access the desired boards level scan path via the respective ASPs secondary port (SP1-SP3 in the figure.) To reduce the IC package size, the individual ASP addresses may be hardwired inside the IC or programmed using fuse, RAM, ROM or other programmable logic inside the device, thus eliminating the need for IC package pins for the ASP addresses.

Figure 20:
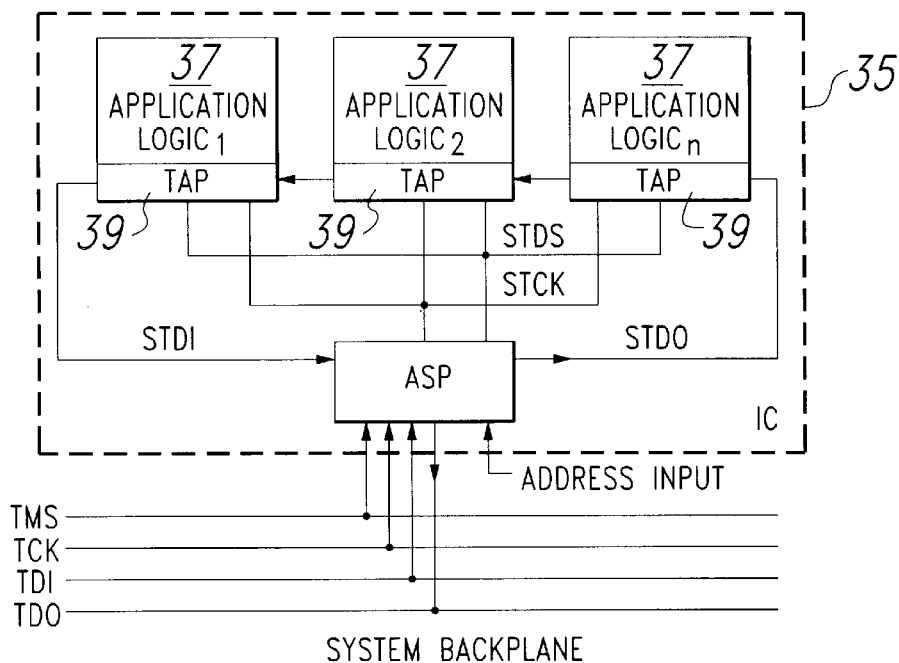
FIG. 20 depicts an integrated circuit incorporating the invention and containing the addressable shadow port of the invention, a primary port coupled to the serial backplane bus, and an internal serial bus coupled to a plurality of application specific logic circuitry blocks.

FIG. 20 depicts an application specific IC or ASIC 35 which has a built in ASP, an address input, and an internal serial test bus coupled to various large application logic blocks 37, each of which has a separate TAP test port 39. This figure demonstrates that for highly dense VLSI IC's or multiple chip modules the ASP invention may be used to efficiently provide access to these internal scan paths as well.

Section II
Extending the ASP to larger systems

In small electronic systems, a single centralized primary serial bus master (PSBM) device using a simple ASP as shown above may be all that is necessary to serially access all the circuits (boards) in the system for test and maintenance operations. However, as electronic systems grow in size and complexity, the serial access task grows so large that a single centralized PSBM cannot handle the task in a timely manner.

As the need to move large computing tasks away from a single centralized computer to be shared among multiple distributed computers connected on a computer network arises, there is a need to move the serial access tasks away from a single PSBM, to be shared among multiple distributed remote serial bus master devices connected on a common serial bus network.

It is an objective of the invention described herein to provide a means for the primary serial bus master, hereafter a PSBM, to enable a remote serial bus master, hereafter an RSBM, to independently access and control the board level serial bus connected to the ASP. It is a further objective of the invention to provide a means for the PSBM to transfer data to and from a memory via the ASP and its select and acknowledge protocols. It is an objective of the invention to provide an means of detecting errors during select and acknowledge protocol transfers between the ASP and PSBM. It is an objective of this invention to provide a means of transferring interrupts between the PSBM and RSBMs via the ASP and its select and acknowledge protocols. It is an objective of this invention to provide a commanding means within the select protocol that allows the ASP to receive and respond to command input from the PSBM. It is an objective of this invention to provide a means of allowing the ASP to power up in a mode that allows the RSBM to have immediate access to the board level serial bus for initialization and testing purposes.

Figure 21:
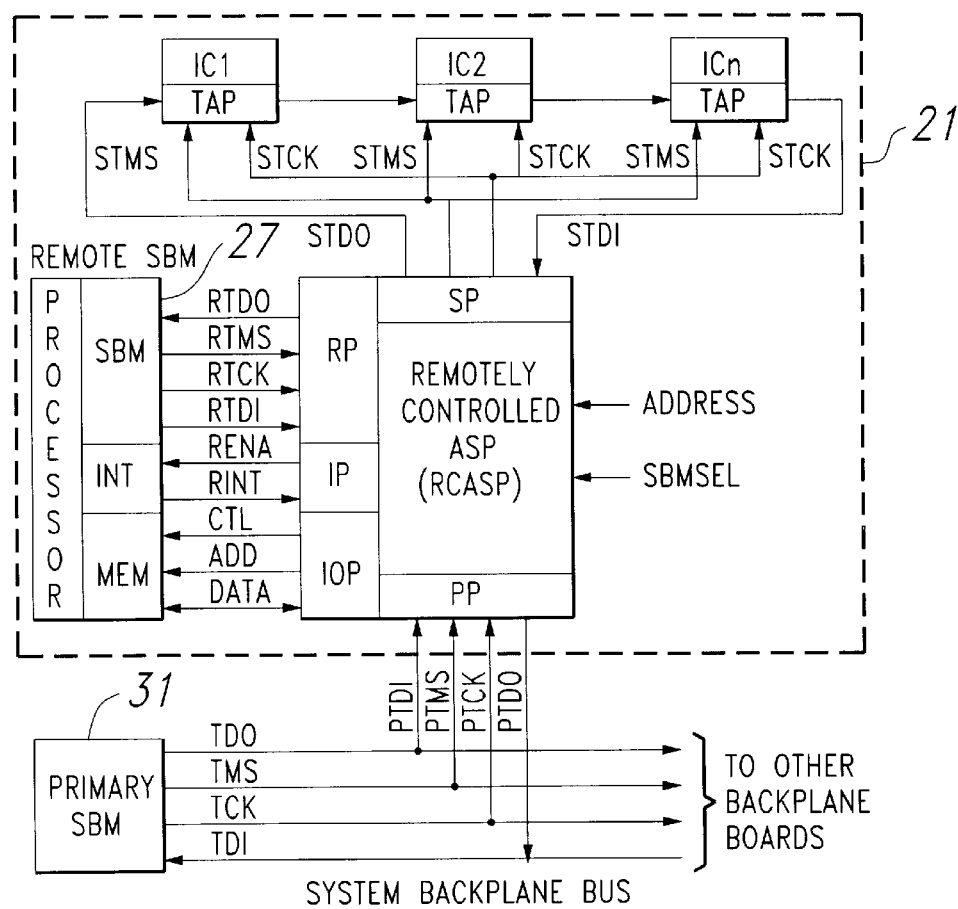
FIG. 21 depicts a typical circuit board located on a system backplane, coupled to a serial bus master by means of a system level serial bus and incorporating the remote serial bus master and remotely controllable addressable shadow port of the invention.

FIG. 21 depicts a board example incorporating the remotely controllable ASP (RCASP hereafter) embodiment of the invention. Board 21 is typical of many such boards in a backplane. Board 21 comprises multiple ICs IC1, IC2, ICn, an RCASP, and a RSBM 27. Board 21 is further coupled to a backplane and through the system backplane to the primary SBM 31.

The RSBM 27 consists of a processor, an 1149.1 serial bus control interface (SBM in the figure), interrupt circuitry (INT in the figure), and memory (MEM in the figure). The ICs operate on the 1149.1 serial bus as described in the board of FIG. 1. The RCASP has a primary port (PP in the figure) for connection to the PSBM 31, a remote port (RP in the figure) for connection to the board resident RSBM 27, a secondary port (SP in the figure) for connection to the serial bus routed through the ICs on the board, an interrupt port (IP in the figure) for connection to the RSBM's INT circuitry, an I/O port (IOP in the figure) for connection to the RSBM's memory, inputs for the RCASP address (ADDRESS in the figure), and an input for a serial bus master select (SBMSEL in the figure) signal.

The primary port PP of the RCASP is connected to the PSBM 31 via the primary TDI (PTDI) signal, primary TDO (PTDO) signal, primary TCK (PTCK) signal, and primary TMS (PTMS) signal. The remote port RP of the RCASP is connected to the RSBM 27 via the remote TDI (RTDI), remote TDO (RTDO), remote TCK (RTCK), and remote TMS (RTMS) signals. The secondary port SP is connected to the board serial bus via the secondary TDI (STDI), secondary TDO (STDO), secondary TCK (STCK), and secondary TMS (STMS) signals. The interrupt port IP of the RCASP is connected to the RSBM via the remote enable (RENA) and remote interrupt (RINT) signals. The I/O port IOP of the RCASP is connected to the RSBM via data (DATA), address (ADD), and control (CTL) buses. The address (ADDRESS) input to the RCASP is used to identify the particular board on which the RCASP is mounted.

The SBMSEL input signal selects either the primary or remote port as enabled when power is first applied to the ASP. If the SBMSEL input is wired low, the primary port is enabled at power-up, and the RCASP operates as an ASP described above. If instead the SBMSEL is wired high the remote port of the RCASP is enabled, and the RCASP outputs a RENA signal to the RSBM at power up. Enabling the remote port RP at power up allows the RSBM to autonomously access the secondary serial bus for initialization and testing purposes of the ICs immediately after power is applied to the system, without having to first receive a command input from the PSBM. After powerup is complete, the PSBM 31 can input a Disconnect RSBM command (described later) to disconnect the RSBM 27 from the board's serial bus independent of the logic level on the SBMSEL input.

Remote Serial Bus Master

Figure 22:
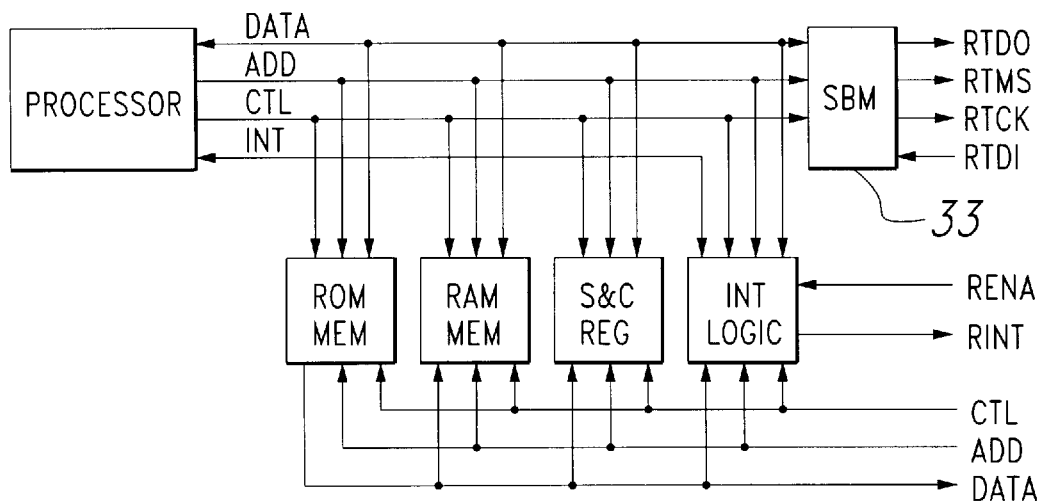
FIG. 22 depicts one preferred embodiment of the remote serial bus master circuit of the invention.

A block diagram of one preferred implementation of the remote serial bus master or RSBM of the invention is depicted in FIG. 22. The RSBM is comprised of a processor for executing remote serial bus access programs, ROM memory ROM MEM for program storage, RAM memory RAM MEM for uploading program code and scratch pad memory, status and command registers S&C REG for input and output of command and status information, interrupt logic INT LOGIC for input and output of interrupt signals, and an SBM interface 33 to allow the remote processor to serially access the board level serial bus.

In operation, the ROM MEM, RAM MEM, S&C REG, INT logic, and SBM 33 are connected to processor's address, data and control buses for parallel read/write accessibility. The ROM MEM, RAM MEM, S&C REG, and INT logic are dual ported, allowing each of them to be further connected to the RCASP's address, data, and control buses for parallel read/write access.

The INT logic receives the RENA input from the RCASP and outputs an INT signal to the processor and a RINT signal to the RCASP. The processor receives the INT signal when the RCASP sends a RENA signal to the INT logic, or when the RCASP sends an interrupt to the INT logic via a parallel write operation. The RCASP receives the RINT signal when the processor sends an interrupt to the INT logic via a parallel write operation.

The S&C REG contains a status register which can be written to and read from by either the processor or RCASP. The status register passes status information back and forth between the RSBM and PSBM via the RCASP. The S&C REG contains a command register that can be written to and read from by either the processor or RCASP. The command register is used to pass commands back and forth between the RSBM and PSBM via the RCASP.

The SBM 33 is an 1149.1 test bus controller (such as TI's SN74ACT8990) that can serially access the board level 1149.1 serial bus in response to parallel access from the RSBM's processor. Other serial bus master logic devices may be used, and for a bus other than the 1149.1 a serial bus master compatible with the alternative bus protocol would be used.

The processor in FIG. 22 may be one of many different typical processor types that have address, data, control buses and an interrupt input. One example operation that the processor may perform is described as follows. In response to an INT input from the INT logic, the processor reads the command register in the S&C REG to determine what command has been input from the PSBM. The command is input to the S&C REG by the PSBM, via the RCASP, prior to sending the RENA input that generates the INT signal to the processor. The command instructs the processor to execute a program, residing in either the ROM or RAM, to access the board's serial bus. If the program is executed from RAM, the PSBM must have uploaded the program into RAM, via the RCASP's I/O port, prior to sending the INT and command to the processor. When the processor completes the execution of the program, it writes status into the status register of the S&C REG and sends a RINT signal to the RCASP by writing an interrupt to the INT logic. The PSBM receives the RINT signal from the RCASP and, in response reads the status from the S&C REG via the RCASP's I/O port. From the RSBM status input the PSBM determines that the command operation has been successfully completed.

The architecture of the primary serial bus master or PSBM is similar to the RSBM, except that the PSBM does not require the INT logic and S&C REG sections. Also the PSBMs memory is not dual ported, since only the PSBM's processor accesses the memory.

Figure 23:
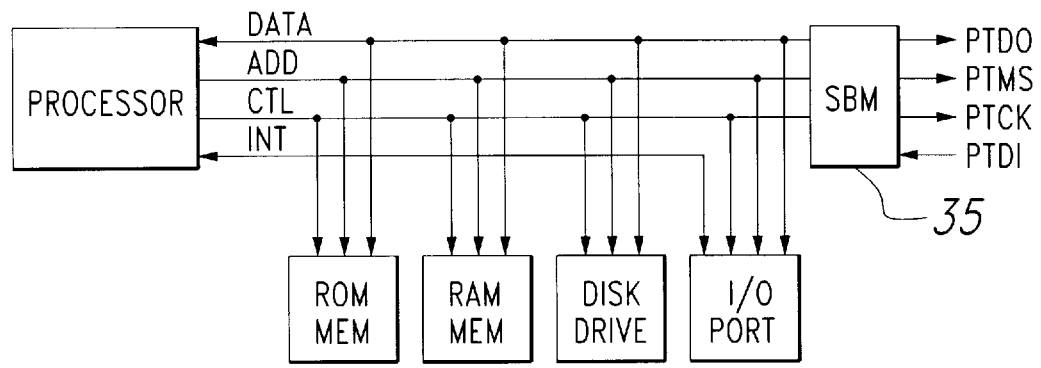
FIG. 23 depicts an embodiment of the primary serial bus master of the invention.

FIG. 23 depicts a block diagram of one preferred implementation of the primary serial bus master or PSBM. The PSBM has a processor for executing system level serial bus access programs, ROM memory ROM MEM for program storage, RAM memory RAM MEM for uploading program code and scratch pad memory, disk drive storage DISK DRIVE for large data storage, SBM interface 35 for communicating with the RSBM via the select and acknowledge protocols or the 1149.1 serial bus protocols, and an I/O port for data transfer and for connecting the PSBM up to external devices such as keyboards, video monitors, disk drives and printers.

The ROM, DISK DRIVE, RAM, I/O port and SBM 35 logic blocks are connected to the processors address, data and control buses for parallel read/write access. The I/O port is also connected to the processor's interrupt input to allow an external devices to interrupt the processor for I/O access. The SBM 35 is an 1149.1 test bus controller that can serially access 1149.1 serial buses in response to parallel access from the processor, and is also capable of transmitting and receiving the protocol of the invention.

The processor in FIG. 23 is typical of many different processor types that have address, data, control buses and an interrupt input. One example operation that the processor may perform is described herein. In response to an interrupt input from the I/O port, the processor executes a program in ROM. The program causes the processor to load a command into an external RSBM via a RCASP. After the command is loaded, the processor outputs an enable RSBM command to the RCASP. After sending the enable RSBM command, the processor polls the status of the RCASP to determine when the remote access operation is completed. When the remote access operation is complete, the processor reads the results from the remote access operation and outputs the data to a video monitor for human interpretation.

Expanded Select Protocol

To allow for commands to be input to the RCASP from the PSBM, the select protocol of the ASP as described above is expanded to allow for command transfers. In the ASP embodiment of the invention, a select protocol was defined by the transfer of a first idle (I) signal to start the select protocol, followed by the transfer of an address frame (of D signals) bounded by first and second select (hereafter S) signals, followed by a second I signal to stop the select protocol. The protocol of the RCASP embodiment of the invention described herein follows this format but expands the definition of the address frame into what is referred to as a message frame. The select protocol of the RCASP is defined by the transfer of a first I signal to start the select protocol, followed by a message frame bounded by first and second S signals, followed by a second I signal to stop the select protocol.

Figure 24:
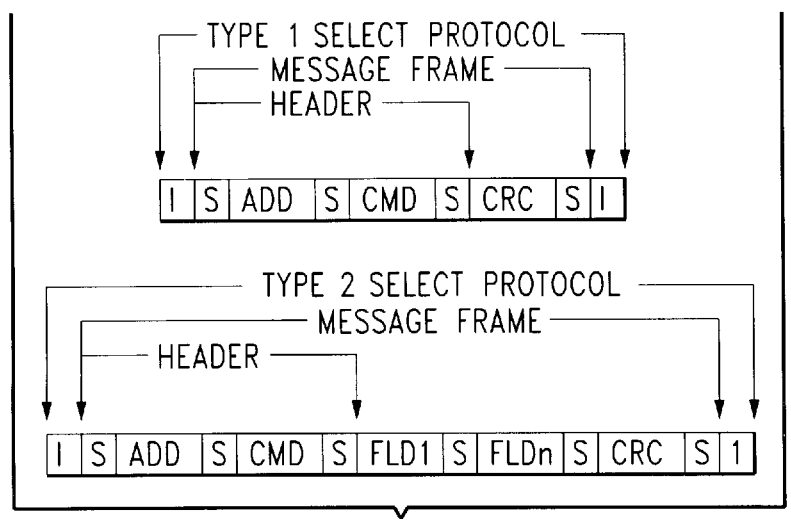
FIG. 24 depicts the select protocols of the invention, including an example of the simple select message and an expanded select message using the protocol of the invention.

FIG. 24 depicts example Type 1 and Type 2 select protocols used in the RCASP protocol of the invention.

The Type 1 select protocol message frame consists of a header comprising a RCASP address and command field, and a cyclic redundancy check (CRC) value field. The CRC field is optional and may be removed if error detection is not required. The RCASP address and command fields in the header are separated by an S signal, and the CRC field is separated from the header by a S signal. The Type 2 message frame shown in FIG. 24 includes one or more optional fields between the header and the CRC field as required by the command sent in the header. The optional fields are also separated by an S signal. The header and optional fields can be transmitted in either fixed or variable D signal bit-pair length, although for error detection a fixed field length is preferred, since it is easier to calculate CRCs on fixed length data fields than on variable length data fields.

The S signals separating the fields play a key role in the ability of the extended select protocol to transfer multiple fields within a single message frame. When an S signal is received at the end of a field, the receiving circuit determines whether the message frame of the select protocol is being terminated or whether another field is being transferred by checking what signal follows the S signal. If an I signal follows the S signal, the message frame of the select protocol is being terminated. If a D signal follows the S signal, the message frame of the select protocol is transferring another field. If a second S signal immediately follows the first S signal received the protocol is being paused.

Expanded Acknowledge Protocol with Error Detection

To allow the PSBM to verify that the command input was received correctly by the RCASP and RSBM, the acknowledge protocol of the RCASP allows for status message transfers. In the ASP protocol described above, the acknowledge protocol was defined by the transfer of a first I signal to start the acknowledge protocol, followed by the transfer of an address frame bounded by first and second S signals, followed by a second I signal to stop the acknowledge protocol. The acknowledge protocol of the RCASP embodiment is defined by the transfer of a first I signal to start the acknowledge protocol, followed by a message frame bounded by first and second S signals, followed by a second I signal to stop the acknowledge protocol.

Figure 25:
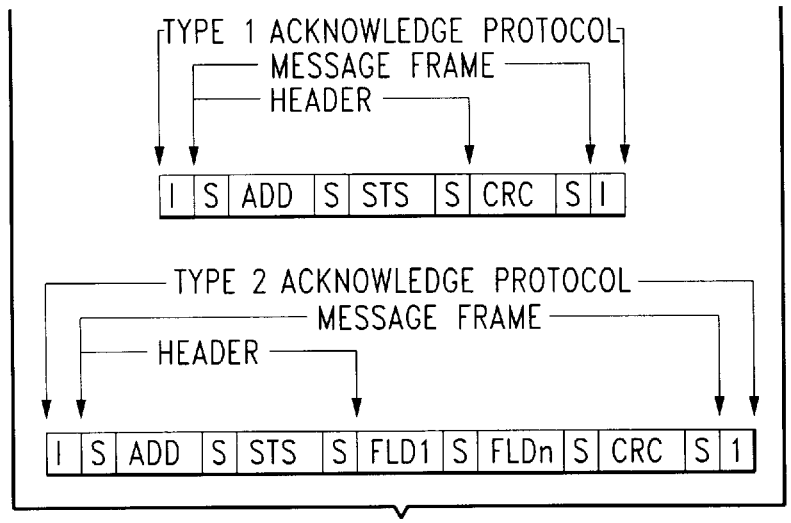
FIG. 25 depicts the acknowledge protocols of the invention, including an example of the simple acknowledge message and an expanded acknowledge message using the protocol of the invention.

FIG. 25 depicts the example messages using the expanded acknowledge protocol of the invention. The Type 1 acknowledge protocol message frame consists of a header comprising a RCASP address and status field and a CRC field. The address field identifies the RCASP which is transmitting the acknowledge message, and the status field informs the PSBM of the status of the RCASP. The CRC field is optional and may be removed if error detection is not required. The address and status fields in the header are separated by an S signal, and the CRC field is separated from the header by a S signal. The Type 2 message frame includes one or more optional fields between the header and the CRC field as required by the command sent in the previous select protocol. The optional fields are also separated by an S signal. The header and optional fields can be transmitted in either fixed or variable D signal bit-pair length, although for error detection a fixed field length is preferred, since it is easier to calculate CRCs on fixed length data fields than on variable length data fields.

The S signals separating the fields play a key role in the ability of the extended acknowledge protocol to transfer multiple fields within a single message frame. When a S signal is received at the end of a field, the receiving circuit determines whether the message frame of the acknowledge protocol is being terminated or whether another field is being transferred by checking what signal follows the S signal. If an I signal follows the S signal, the message frame of the acknowledge protocol is being terminated. If a D signal follows the S signal, the message frame of the acknowledge protocol is transferring another field. Again, if an S signal follows the S signal the protocol is being paused.

Port Connect/Disconnect Commands

The RCASP of FIG. 21 can be commanded to cause the secondary port to be connected to or disconnected from either the primary or remote ports. When the secondary port is connected to the primary port, the PSBM can access the board's serial bus directly using the 1149.1 bus protocol on the backplane bus. When the secondary port is connected to the remote port, the RSBM can access the board's serial bus using the 1149.1 bus protocol The following commands are defined for the RCASP to allow the primary or remote ports to be connected or disconnected from the secondary port.

Figure 26:
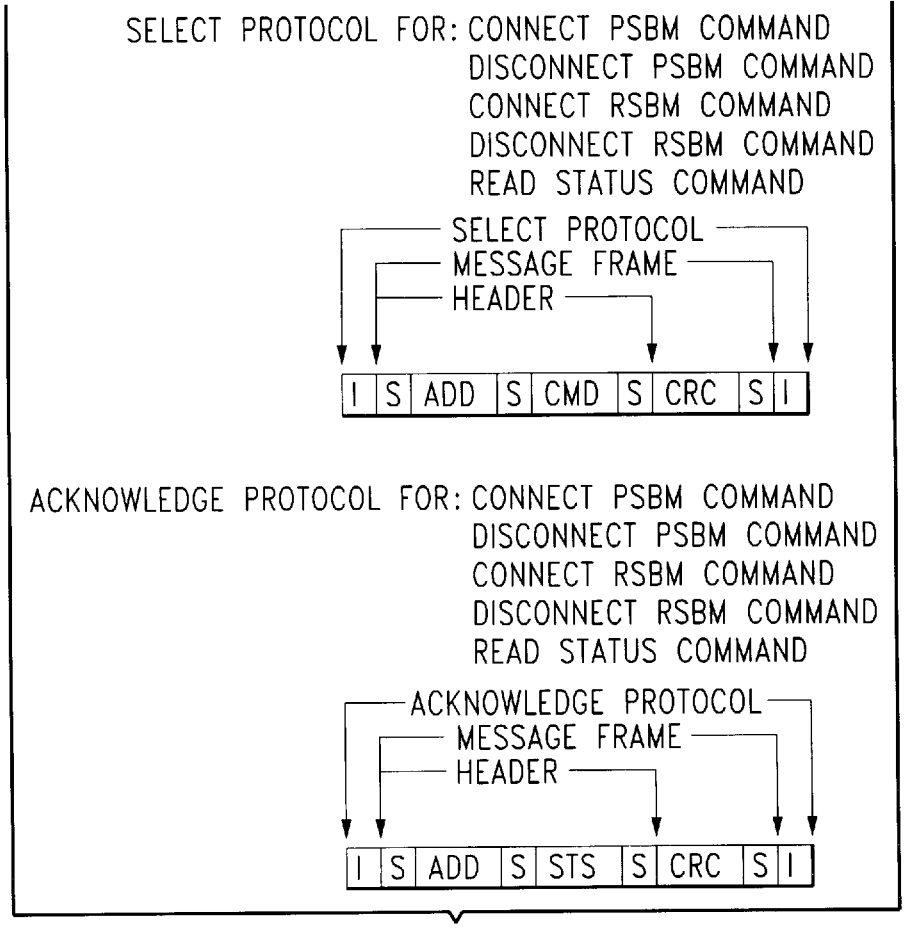
FIG. 26 depicts the select and acknowledge protocols of the invention for simple command transfers between a primary serial bus master and a remote serial bus master of the invention.

FIG. 26 depicts the select and acknowledge protocols for the commands described below.

Connect PSBM Command

When access of the board level serial bus in FIG. 21 is to be performed by the PSBM, the RCASP receives a Connect PSBM command via a select protocol from the PSBM. The Connect PSBM select protocol has a message frame containing a header consisting of the RCASP's address (ADD) and a Connect PSBM command (CMD), and CRC field as shown in FIG. 26.

At the beginning of the Connect PSBM command select protocol, the RCASP compares its address against the received address field. If the addresses do not match, the RCASP ignores the remainder of the select protocol, and does not send an acknowledge protocol to the PSBM. If the addresses match, the RCASP compares the CMD field against a predefined set of known commands to see what operation is to be performed. In response to an unknown CMD, the RCASP ignores the remainder of the select protocol, sets the CMD error bit in the status register, and sends an acknowledge protocol to inform the PSBM that an unknown command was received, after the select protocol completes. In response to a Connect PSBM command, the RCASP receives the remainder of the select protocol, transmits an acknowledge protocol, and executes the command. This address and command check protocol is followed for all of the select and command messages that follow.

The CRC field transmitted in the select protocol is calculated by the PSBM doing a check sum on the address and command fields transmitted in the select protocol. In response to the select protocol, the RCASP calculates its own CRC on the address and command fields received in the header and compares the calculated CRC against the CRC received in the select protocol. If the received CRC and calculated CRC values match, the address and command fields have been received from the PSBM without error. If a mismatch occurs between the received CRC and the calculated CRC, an error has occurred in the address and/or command fields transferred from the PSBM to the RCASP. In response to a CRC mismatch error the RCASP sets a CRC error bit in the status register. Again, the CRC calculation and transmittal is also followed for all of the command messages that follow.

After the select protocol has been transmitted, the RCASP outputs a Connect PSBM command acknowledge protocol to the PSBM with a message frame containing a header consisting of the RCASP's address (ADD) and status register (STS), and a CRC field as seen in FIG. 26. The CRC field transmitted in the acknowledge protocol is calculated by the RCASP doing a check sum on the address and status fields transmitted in the acknowledge protocol. After the acknowledge protocol is transmitted and if a CRC error has not occurred in the select protocol, the Connect PSBM command causes the RCASP to connect the primary and secondary ports. After the connection is made, the PSBM can access the board's serial bus using the 1149.1 serial bus protocol. If a CRC error occurred in the select protocol, the RCASP outputs the acknowledge protocol, bus does not make a connection between the primary and secondary ports.

In response to the acknowledge protocol, the PSBM calculates a CRC on the address and status fields received in the header and compares the calculated CRC against the CRC received in the acknowledge protocol. If the received CRC and calculated CRC values match, the acknowledge protocol has been received from the RCASP without error. If a mismatch occurs between the received CRC and the calculated CRC, an error has occurred in the acknowledge protocol from the RCASP. If no CRC error is detected in the acknowledge protocol, the PSBM inspects the address and status fields in the header to test that the correct RCASP address has been sent and that no errors are reported in the status register.

In response to an acknowledge protocol address or status error, the PSBM can resend the Connect PSBM command by performing another select protocol operation. In response to an acknowledge protocol CRC error the PSBM can either resend the Connect command, or send a Read Status command (described later) to re-read the RCASPs address and status registers. If no CRC, address, or status errors are found, the PSBM is assured that the RCASP has received the Connect PSBM command and has Connected the primary and secondary ports.

After the Connect PSBM command has been successfully input to the RCASP, other commands that do not effect the connection made between the primary and secondary ports, such as the Read and Write commands described herein, can be input to and executed by the RCASP.

Disconnect PSBM Command

When access of the serial bus by the PSBM of FIG. 21 is complete, the PSBM can disconnect the primary and secondary ports by inputting a Disconnect PSBM command via a select protocol. The Disconnect PSBM select protocol has a message frame containing a header consisting of the RCASP's ad dress (ADD) and a Disconnect PSBM command (CMD), and CRC field as shown in FIG. 26.

Again, the address, command and CRC fields are checked by the RCASP as previously described for the Connect PSBM Command.

After the select protocol has been transmitted, the RCASP outputs a Disconnect PSBM command acknowledge protocol to the PSBM with a message frame containing a header consisting of the RCASP's address (ADD) and status register (STS), and a CRC field as seen in FIG. 26. The CRC field transmitted in the acknowledge protocol is calculated by the RCASP by doing a check sum on the address and status fields transmitted in the acknowledge protocol. After the acknowledge protocol is transmitted and if a CRC error has not occurred in the select protocol, the Disconnect PSBM command causes the RCASP to disconnect the primary and secondary ports. If a CRC error occurred in the select protocol, the RCASP outputs the acknowledge protocol, bus does not disconnect the primary and secondary ports.

In response to the acknowledge protocol, the PSBM calculates a CRC on the address and status fields received in the header and compares the calculated CRC against the CRC received in the acknowledge protocol. If the received CRC and calculated CRC values match, the acknowledge protocol has been received from the RCASP without error. If no CRC error is detected in the acknowledge protocol, the PSBM inspects the address and status fields in the header to test that the correct RCASP address has been sent and that no errors are reported in the status register. If there is an error the PSBM can resend the command or check the status bits as before.

If no CRC, address, or status errors are found, the PSBM is assured that the RCASP has received the Disconnect PSBM command and has disconnected the primary and secondary ports.

Connect RSBM Command

When access of the serial bus is to be performed by the RSBM, the RCASP receives a Connect RSBM command via a select protocol from the PSBM. The Connect RSBM select protocol has a message frame containing a header consisting of the RCASP's address (ADD) and a Connect RSBM command (CMD), and CRC field as depicted in FIG. 26.

At the beginning of the Connect RSBM command select protocol, the RCASP checks its address against the received address field, and the received command against known commands, as described in the Connect PSBM command description. If the RCASPs address is received and the command is a Connect RSBM command, the RCASP receives the remainder of the select protocol, transmits an acknowledge protocol, and executes the command.

After the Connect RSBM select protocol has been transmitted, the RCASP checks the CRC field, as described in the Connect PSBM command, then outputs a Connect PSBM command acknowledge protocol to the PSBM with a message frame containing a header consisting of the RCASP's address (ADD) and status register (STS), and CRC field as seen in FIG. 26. If the CMD input was unknown, but the RCASP address was matched, the RCASP outputs the acknowledge protocol of FIG. 26 with the CMD error bit set in the status register, to inform the PSBM that an unknown command was sent in the select protocol.

After the acknowledge protocol is transmitted and if no CRC error occurred in the select protocol, the Connect RSBM command causes the RCASP to set the RENA output to the RSBM and connect the remote and secondary ports. In response to the RENA signal being set, the RSBM is enabled to access the board's serial bus using the 1149.1 serial bus protocol. While the RSBM is busy accessing the serial bus, the PSBM is free to do other tasks.

In response to the RCASP acknowledge protocol, the PSBM checks for CRC errors, address errors, and status errors as described in the Connect PSBM command description. If no errors are found the PSBM is assured that the RCASP has correctly received the Connect RSBM command, connected the remote and secondary ports, and set the RENA output. In response to an error, the PSBM can take the actions stated in the Connect PSBM command description.

After the Connect RSBM command has been successfully input to the RCASP, other commands that do not effect the connection made between the remote and secondary ports, such as the Read and Write commands described herein, can be input to and executed by the RCASP.

Disconnect RSBM Command

When remote access of the serial bus is complete the PSBM can disconnect the remote and secondary RCASP ports by inputting a Disconnect RSBM command via a select protocol. The Disconnect RSBM select protocol has a message frame containing a header consisting of the RCASP's address (ADD) and a Disconnect RSBM command (CMD), and CRC field as seen in FIG. 26.

At the beginning of the Disconnect RSBM command select protocol, the RCASP checks its address against the received address field, and the received command against known commands, as described in the Disconnect PSBM command description. If the RCASPs address is received and the command is a Disconnect RSBM command, the RCASP receives the remainder of the select protocol, transmits an acknowledge protocol, and executes the command.

After the Disconnect RSBM select protocol has been received, the RCASP checks the CRC field, as described in the Disconnect PSBM command description, then outputs a Disconnect RSBM command acknowledge protocol to the PSBM with a message frame containing a header consisting of the RCASP's address (ADD) and status register (STS), and CRC field as seen in FIG. 26. If the CMD input was unknown, but the RCASP address was matched, the RCASP outputs the acknowledge protocol of FIG. 26 with the CMD error bit set in the status register, to inform the PSBM that an unknown command was sent in the select protocol.

After the acknowledge protocol is transmitted and if no CRC error occurred in the select protocol, the Disconnect RSBM command causes the RCASP to reset the RENA output to the RSBM and disconnect the remote and secondary ports. In response to the RENA signal being reset, the RSBM is disabled from accessing the board's serial bus using the 1149.1 serial bus protocol.

In response to the RCASP acknowledge protocol, the PSBM checks for CRC errors, address errors, and status errors as described in the Disconnect PSBM command description. If no errors are found the PSBM is assured that the RCASP has correctly received the Disconnect RSBM command, disconnected the remote and secondary ports, and reset the RENA output. In response to an error, the PSBM can take the actions stated in the Disconnect PSBM command description.

Read Status Command

To allow the PSBM to read status information stored in the RCASP's status register, a read status register command is provided. When the status register is to be read, the RCASP receives a Read Status command via a select protocol from the PSBM. The Read Status command select protocol has a message frame containing a header consisting of the RCASP's address (ADD) and a Read Status command (CMD), and CRC field as shown in FIG. 26.

At the beginning of the Read Status command select protocol, the RCASP checks its address against the received address field, and the received command against known commands, as described in the Connect PSBM command description. If the RCASPs address is received and the command is a Read Status command, the RCASP receives the remainder of the select protocol, executes the command, and sends an acknowledge protocol back to the PSBM.

After the Read Status command select protocol has been transmitted, the RCASP checks the CRC field, as described in the Connect PSBM command, then outputs a Read Status command acknowledge protocol to the PSBM with a message frame containing a header consisting of the RCASP's address (ADD) and status register (STS), and CRC field as seen in FIG. 26. If the CMD input was unknown, but the RCASP address was matched, the RCASP outputs the acknowledge protocol of FIG. 26 with the CMD error bit set in the status register, to inform the PSBM that an unknown command was sent in the select protocol.

In response to the RCASP acknowledge protocol, the PSBM checks for CRC errors, address errors, and status errors as described in the Connect PSBM command description. If no errors are found the PSBM is assured that the RCASP has correctly received the Read Status command, executed the command, and transmitted the contents of the status register. In response to an error, the PSBM can re-send the Read Status command to the RCASP.

The Read Status command can be executed without effecting any other command currently in effect. The Read Status command allows the PSBM to monitor the internal status of RCASP, as well as external circuits associated with the RCASP, such as the RSBM, memory, and interrupt logic. For example, the Read Status command can be used to see if an interrupt input from the RSBM (RINT) has occurred. The RSBM may output a RINT signal to the RCASP when it has complete an operation commanded by the PSBM, or to indicate that it needs to communicate with the PSBM. The following list defines the status bits contained in the RCASP's internal status register. Other status bits can be added to the status register as required.

Command Error bit—A status bit in the RCASP status register indicating that the command field received in the select protocol message frame was not a known command.

CRC Error bit—A status bit in the RCASP status register indicating that the CRC field received in the select protocol message frame did not match the calculated CRC.

PSBM Connected bit—A status bit in the RCASP status register indicating that the primary and secondary ports are connected.

RSBM Connected bit—A status bit in the RCASP status register indicating that the remote and secondary ports are connected.

Interrupt Request bit—A status bit in the RCASP status register indicating that an interrupt signal has been received on the RINT input.

STMS State bit—A status bit in the RCASP status register indicating the state of the STMS output. This bit allows checking of the state the board level 1149.1 serial bus was left in when disconnected from the backplane 1149.1 bus.

Data Transfer Commands

It is sometimes necessary for the PSBM to transfer program code, a command, or data to a memory associated with the RSBM before the RSBM is enabled to access the serial bus. It is also sometimes necessary for the PSBM to receive data, command, or status information from a memory associated with the RSBM, to obtain status and data relating to serial bus access operation performed by the RSBM. To provide an input/output method between the PSBM and a memory, the RCASP includes a commandable I/O port consisting of a parallel address bus, parallel bidirectional data bus, and a control bus to regulate the input and output operations. To provide a method of transferring status information from the RCASP to the PSBM, the RCASP includes a status register whose contents can be read and transmitted to the PSBM. The following commands are defined to allow the RCASP's I/O port to read data from or write data to a memory, and to allow the RCASP's status register to be read.

Write Command

Figure 27:
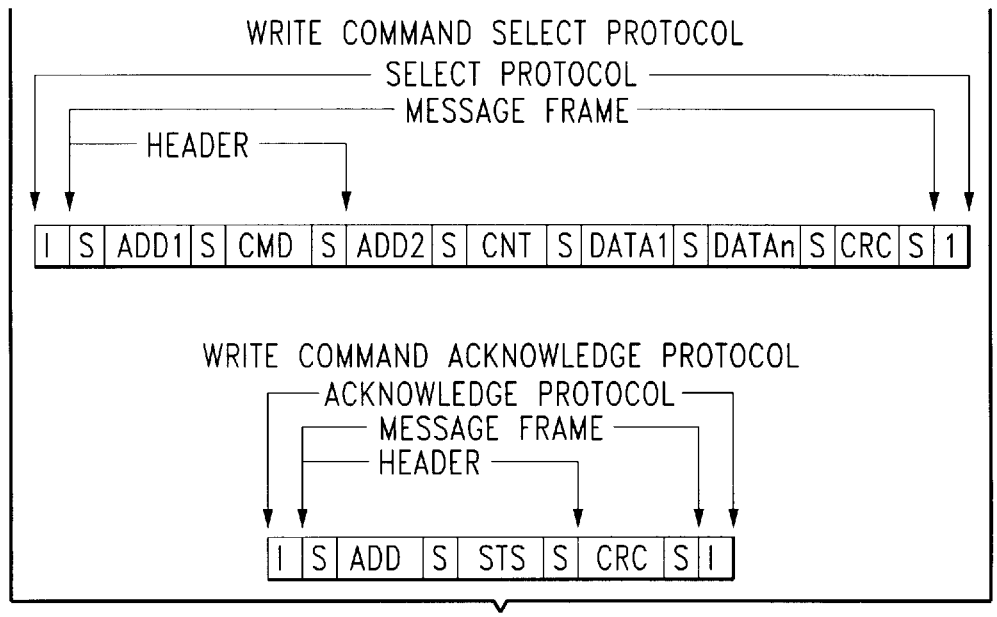
FIG. 27 depicts the write command select and acknowledge protocols of the invention.

FIG. 27 depicts the select and acknowledge message protocols for a Write command using the RCASP.

When data is transferred from the PSBM to a memory via the I/O port, the RCASP receives a Write command via a select protocol from the PSBM. As shown in the figure, the Write command select protocol has a message frame containing a header consisting of the RCASP address (ADD1) and Write command (CMD) fields, a starting memory address field (ADD2) where the first data value will be written, a count value field (CNT) indicating the number of data values to be written into memory, data value fields (DATA1-n) to write, and a CRC field. The CRC field is a value the RCASP receives and compares against a CRC it calculates on the received ADD1, CMD, ADD2, CNT, DATA1-n fields in the message frame of the select protocol.

At the beginning of the Write command select protocol, the RCASP checks its address against the received address field. If the addresses do not match, the RCASP ignores the remainder of the select protocol. If the addresses match, the RCASP checks the CMD field against known commands to see what operation is to be performed. In response to an unknown CMD, the RCASP will ignore the remainder of the select protocol and set the CMD error bit in the status register. In response to a known CMD, the RCASP will receive the remainder of the select protocol and execute the command.

In response to a correctly received Write command, the RCASP outputs the received starting memory address (ADD2), writes the first data value received (DATA1) into the addressed memory location, and decrements the received count value (CNT). If the count value is not zero following the first write operation, the RCASP increments the starting memory address (ADD1), writes the next data value received (DATA2) into the next memory location, and decrements the count value (CNT) again. These steps are repeated until the count value (CNT) has been decremented to zero.

When the count value decrements to zero, the RCASP detects that the last data value has been received and written to the memory. The next data value received in the select protocol after the count reaches zero is therefore the CRC value. The RCASP receives the CRC value and compares it to a CRC value it calculated on the ADD1, CMD, ADD2, CNT, and DATA1-n fields it received. If the received CRC and calculated CRC values match, the fields are known to have been received from the PSBM without error. If a mismatch occurs between the received CRC and the calculated CRC, an error has occurred in the fields transferred from the PSBM to the RCASP. In response to a CRC error the RCASP sets a CRC error bit in its status register.

After the select protocol is complete the RCASP outputs an Write acknowledge protocol to the PSBM with a message frame containing a header consisting of the RCASP's address (ADD), status register (STS), and CRC field as depicted in FIG. 27. If the CMD input was unknown, but the RCASP address was matched, the CMD error bit will be set in the RCASP's status register to inform the PSBM that an unknown command was sent in the select protocol. If a CRC error occurred the CRC error bit in the status register will be set to inform the PSBM of the CRC error.

In response to the RCASP's acknowledge protocol, the PSBM checks for CRC errors, address errors, and status errors as described previously. If no errors are found the PSBM is assured that the RCASP has correctly received the Write command and written the data to memory. In response to an acknowledge protocol CRC error, the PSBM can re-read the address and status register using a Read Status command (previously described). In response to status register errors (CRC and CMD error bits) from the RCASP the PSBM can repeat the Write command select protocol.

While multiple data values will usually be transferred during the Write command select protocol, a single data value can be transmitted by simply setting the CNT value to 1. Typically, the PSBM will transmit multiple data values when it is inputting a remote access program or a block of data to the RSBMs RAM memory, and a single data value when inputting a command value to the RSBM's status and control register (S&C REG). A command value written to the S&S REG can instruct the RSBM to execute a particular remote access program such as "initiate board self test" or "initiate board diagnostics", as examples.

Read Command

Figure 28:
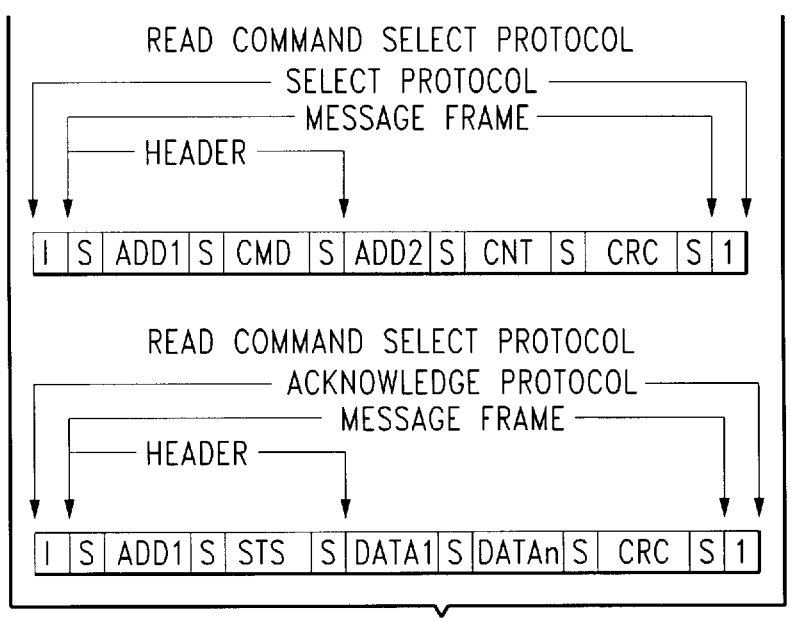
FIG. 28 depicts the read command select and acknowledge protocols of the invention.

FIG. 28 depicts the select and acknowledge protocols for the Read commands used with the RCASP. When data is to be transferred from a memory to the PSBM via the I/O port, the RCASP receives a Read command via a select protocol from the PSBM. The Read command select protocol has a message frame containing a header consisting of the RCASP address (ADD1), a Read command (CMD), a starting memory address field (ADD2) where the first data value will be read, a count value field (CNT) indicating the number of data values to be read from memory and transmitted back to the PSBM, and a CRC field as seen in FIG. 28. The CRC field is a value the RCASP receives and compares against a CRC it calculates on the received ADD1, CMD, ADD2, and CNT fields in the message frame of the select protocol.

At the beginning of the Read command select protocol, the RCASP checks its address against the received address field. If the addresses do not match, the RCASP ignores the remainder of the select protocol. If the addresses match, the RCASP checks the CMD field against known commands to see what operation is to be performed. In response to an unknown CMD, the RCASP will ignore the remainder of the select protocol and set the CMD error bit in the status register. In response to a known CMD, the RCASP will receive the remainder of the select protocol and execute the command.

After the Read command select protocol has been received, the RCASP outputs the starting memory address (ADD2) from the I/O port, reads the first data value (DATA1) from the addressed memory location, decrements the count value (CNT), and starts an acknowledge protocol to transfer the data read from the memory to the PSBM. If the count value is not zero following the first read operation, the RCASP increments the starting memory address (ADD1), reads the next data value (DATA2) from memory, and decrements the count value (CNT) again. These steps are repeated until the count value (CNT) has been decremented to zero. When the CNT decrements to zero, the RCASP detects that the last data value has been read from memory.

In response to a CNT of zero, the RCASP outputs a CRC that it has calculated on the ADD, STS, and DATA1-n fields it is transmitted to the PSBM during the acknowledge protocol. After the CRC is output on the message frame, the RCASP terminates the read command acknowledge protocol. The RCASP's acknowledge protocol has a message frame containing a header consisting of the RCASP's address (ADD) and status register contents (STS), a predetermined number of data value fields read from memory (DATA1-n), and a CRC field as shown in FIG. 28.

In response to the Read command acknowledge protocol, the PSBM calculates a CRC on the ADD, STS, and DATA1-n fields received from the RCASP. If the received and calculated CRCs match, the acknowledge protocol was received without error. If no CRC error is detected, the PSBM inspects the address and status fields to test that the correct RCASP address has been sent and that no errors are reported in the status register.

If no errors are found, the PSBM is assured that the Read command has been executed and the data received is correct. In response to an acknowledge protocol CRC error, the PSBM can re-read the address and status register using a Read Status command (described previously). In response to status register errors (CRC and CMD error bits) from the RCASP the PSBM can repeat the Read command select protocol.

While multiple data values will usually be transferred during the Read command acknowledge protocol, a single data value can be transmitted by simply setting the CNT value in the Read command select protocol to a count of 1. An example of a typical single data value Read command occurs when the PSBM needs only to read the status value in the status and command register (S&C REG) of the RSBM.

Other Command Types

While two types of commands have been described (Connect/Disconnect commands and Data Transfer commands) other command types can be developed with their own select and acknowledge protocol message frame formats. The only required constant part of the select protocol message frame is that all messages will start with a header consisting of at least an address and command field, and optionally include other fields defined by the command sent in the message protocol. Likewise, the only constant part of the acknowledge protocol message frame is that all will start with a header consisting of at least an address and status field, and optionally include other fields defined by the command sent in the message frame of the select protocol. Also the fields sent in a select or acknowledge protocol message frame will always be separated by at least one S signal.

Global commands may be added to the capability of the system by using the common command form with a slight modification. For example, an address can be reserved for global use, typically the highest address available, which all RCASP circuits in the system will recognize. The global command address will be followed by the command, which is either a commonly used command or a special global command which all RCASP circuits in the system will recognize. Unlike the other command types, however, the RCASP circuits will not respond to a global command with an acknowledge protocol message, to prevent bus clashes on the system serial bus. The use of global commands will allow all the RCASP circuits in the system to concurrently execute commands in response to a single command message from the PSBM. Without this capability, the PSBM would have to individually select and transmit a command to each of the RCASP circuits.

During the transmission of a select or acknowledge message frame it may be necessary to pause the transfer due to memory or processing limitations of the PSBM or the RCASP circuitry. If a large number of data fields are being sent, for example, from the RSBM to a RCASP during a Write command select protocol message, one or both devices may not have sufficient memory to allow all of the data to be transferred at once. A pausing capability is required to support the transfers so that the memories of the PSBM and the RCASP can be periodically downloaded from or uploaded to a larger memory, such as a disk drive.

This capability is easily realized by having the transmitting device output additional S signals following the S signal that normally separates the fields. This approach allows pausing between any two fields of a message frame as required. The length of the pause is controlled by the number of S signals output from the transmitting device to the receiving device. The transfer of data fields resumes when the transmitting device sends the next D signal to start the next field transfer.

Detailed Description of the RCASP circuitry

Figure 29:
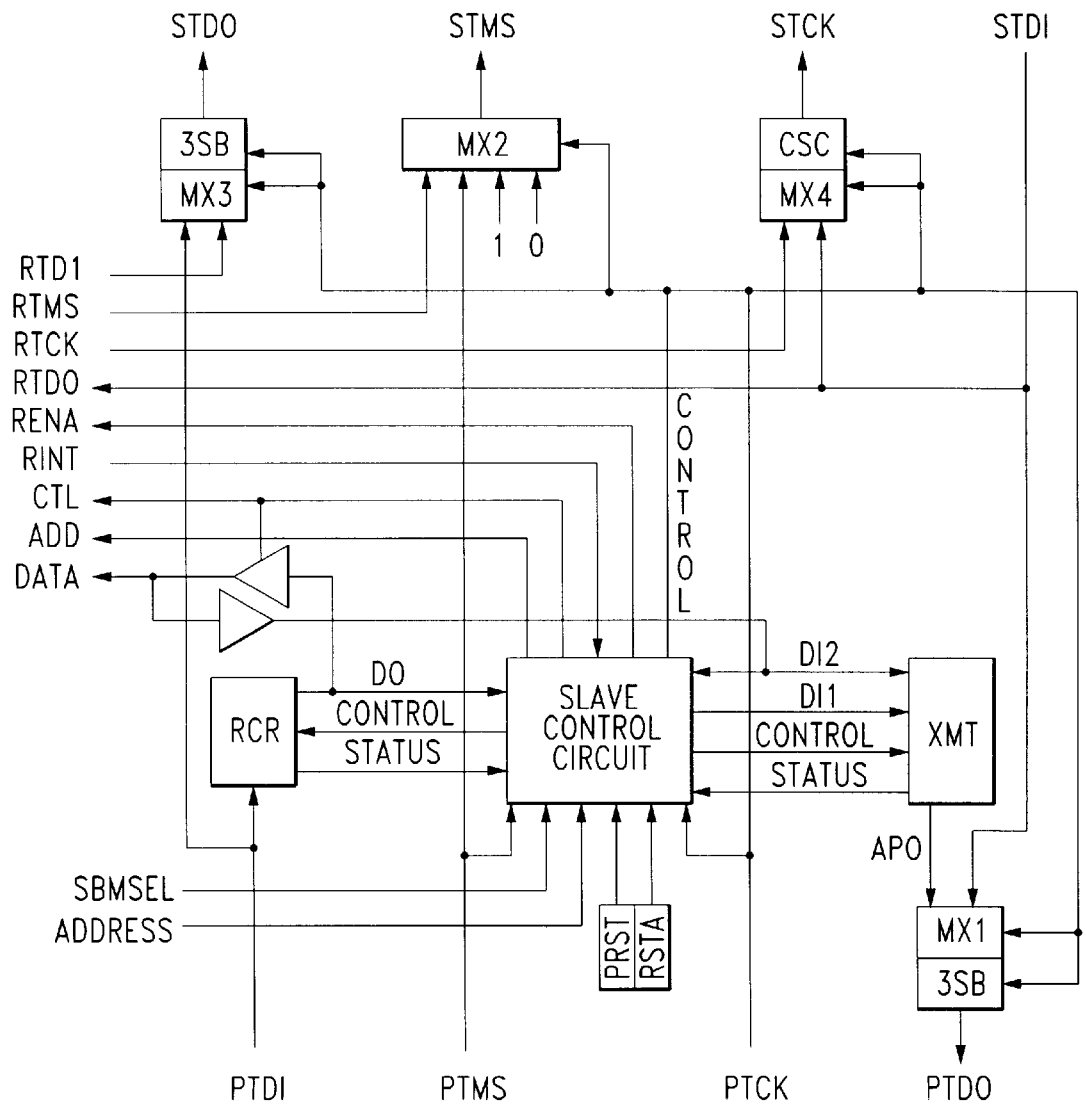
FIG. 29 depicts a block diagram of the circuitry of the remotely controllable addressable shadow port circuit of the invention.

FIG. 29 depicts one preferred implementation of the RCASP. The RCASP circuit is similar to the ASP circuit of the previously described embodiment but has additional remote, I/O, and interrupt ports and the multiplexing circuitry required to connect the remote or primary port up to the secondary port. The RCASP has inputs and outputs for the primary port signals (PTDI, PTMS, PTCK, PTCK), the secondary port signals (STDO, STMS, STCK, STDO), the remote port signals (RTDI, RTMS, RTCK, RTCK), the interrupt port signals (RENA, RINT), the I/O port signals (CTL, ADD, DATA), and the RCASP address and SMBSEL signals.

The RCASP depicted in FIG. 29 consists of a receiver RCR, a transmitter XMT, a slave control circuit, four multiplexers MX1,MX2,MX3,MX4, a clock synchronizer circuit CSC, a power up reset circuit PRST, and a reset address circuit RSTA.

RCASP Receiver Circuit RCR

The receiver circuit RCR in FIG. 29 consists of a controller for regulating the select protocol input from the PSBM, and a serial input/parallel output (SIPO) register for receiving serial data from the PSBM and outputting parallel data to the slave control circuit and I/O port. The PTDI signal is input to the SIPO register to supply the serial data during select protocols, and is input to the controller for regulating the operation of the receiver during select protocols. The parallel data output from the SIPO is input to the slave control circuit and I/O port via the data output (DO) bus. The status output from the receiver's controller is input to the slave controller circuit to indicate when parallel data from the SIPO is available to be read on the DO bus.

The receiver's controller determines when a first "I then S then D" signal sequence occurs on PTDI, indicating the start of a select protocol and the start of the first data field within the message frame. In response to this input sequence, the controller enables the SIPO to receive the serial data field input on PTDI. Within the message frame, the controller determines when a "D then S then D" signal sequence occurs on PTDI, indicating the end of a current data field input and the start the next data field input. In response to this input sequence, the controller enables the SIPO to start receiving the next serial data field input and outputs the previously received serial data field in parallel to the slave control circuit and I/O port via the DO bus. The controller determines when a first "D then S then I" signal sequence occurs on PTDI, indicating the end of the current select protocol and the end of the last data field within the message frame. In response to this input sequence, the controller enables a last parallel output from the SIPO to the slave control circuit and I/O port via the DO bus, and terminates the select protocol input operation.

RCASP Transmitter Circuit XMT

The transmitter circuit XMT in FIG. 29 consists of a controller for regulating the acknowledge protocol output from the RCASP, and a parallel input/serial output PISO register for receiving parallel data from the slave control circuit or the I/O port and outputting the data serially to the PSBM. The PISO register receives parallel data from either the I/O port via data input bus 1 DI1 or from the slave control port via data input bus 2 DI2, and outputs the data serially to MX1 via the acknowledge protocol output (APO) signal. The controller receives control input from the slave control circuit via the control bus, and outputs status to the slave control circuit via the status bus. Control input on the control bus selects which data bus (DI1 or DI2) inputs data to the PISO and regulates the parallel to serial conversion process that takes place during the acknowledge protocol. The status output from the transmitter informs the slave control circuit of the transmitters status during the acknowledge protocol, i.e. whether or not the PISO register is ready to receive the next parallel input or not.

The acknowledge protocol described herein is illustrated in FIG. 25. At the beginning of an acknowledge protocol, the slave control circuit enables multiplexer MX1 and the 3-state buffer to pass the APO signal from the transmitter to the PTDO output. The slave control circuit then inputs the RCASP address field to the transmitter via the DI2 bus to be shifted out on PTDO. In response to the address field input, the transmitter outputs a I and S signal on PTDO to start the acknowledge protocol message frame, then serially transmits the address field on PTDO. After the address field is transferred, the slave control circuit inputs the RCASP internal status register field via the DI2 bus to be shifted out to PTDO. The transmitter outputs a S signal prior to shifting out the status field, as a control signal to separate the fields. After the status field is transferred, the slave control circuit inputs the CRC field, it has calculated on the address and status fields, to be shifted out on PTDO. Once again the transmitter outputs an S signal prior to shifting out the CRC field as a control signal to separate the fields. After the CRC field is shifted out, the transmitter circuit outputs a S and I signal sequence to stop the message frame and acknowledge protocol.

If I/O data fields were required in the acknowledge protocol, as shown in FIG. 25 Type 2 message frame, data from the DI1 bus would be parallel loaded and shifted out of the transmitter after the header fields (address and status) have been transferred and before the CRC field is transferred. Once again the transmitter outputs an S signal between each data field transferred in the acknowledge protocol.

Slave Control Circuit

The slave control circuit is a state machine controller that regulates the operation of the RCASP transmitter circuit XMT, receiver circuit RCR, clock synchronizer circuit (CSC), and multiplexers MX1–MX4 in response to a command input during a select protocol. The slave control circuit receives the PTMS and PTCK signals from the primary port, the data output (DO) and status buses from the receiver, the status bus from transmitter, the data input bus 1 (DI1) from the I/O port, RINT signal from the interrupt port, the external RCASP address and SBMSEL signals, a reset signal from the power up reset circuit (PRST), and reset address signals from the reset address circuit (RSTA). The slave control outputs control to the receiver circuit, transmitter circuit, CSC, 3SBs, and multiplexers MX1–4. The slave control circuit also outputs the remote enable interrupt signal (RENA) to the interrupt port and read/write control (CTL) and memory address signals to the I/O port.

The slave control circuit is clocked by the PTCK input from the primary port. The PTMS input from the primary port indicates to the slave control circuit when the 1149.1 bus is busy, idle or reset. The status inputs from the receiver and transmitter circuits inform the slave control circuit of the receiver and transmitter circuit status. The DO bus from the receiver is used to input parallel data to the slave control circuit. The DI1 input from the I/O port allows the slave control circuit to include the data fields input to the transmitter from the I/O port in the CRC calculation it performs during acknowledge protocols. The RINT input from the interrupt port informs the slave control circuit of an external interrupt input. The reset input from the PRST circuit resets the slave control circuit at powerup. The reset address input from the RSTA circuit allows resetting the slave control circuit via a reset address input from a select protocol operation, as described in the first invention.

The control output from the slave control circuit controls the operation of the receiver RCR, transmitter XMT, clock synch circuitry CSC, and multiplexers MX1–4. The DI2 bus output from the slave control circuit is used to input parallel data to the transmitter. The CTL and address bus outputs from the slave control circuit are used to control I/O port read and write operations. The RENA interrupt output from the slave control circuit is used to output an external interrupt signal.

During select protocols, the slave control circuit receives parallel data from the receiver via the DO bus. The status bus input from the receiver informs the slave control circuit when a select protocol and message frame has been started, when each data field in the message frame is ready to be read, and when the message frame and select protocol is completed. The first data field received in a message frame is the RCASP address. From the address field input, the slave control circuit determines whether it has been selected to receive the remainder of the select protocol. The second data field received is the RCASP command. From the command field input, the slave control circuit determines what action is to be taken and what type of data fields follow the command field in the message frame. The last data field received is the CRC field. Depending upon the command, additional data fields may be received between the second (command) and last (CRC) data fields (see FIG. 24). The slave control circuit calculates a CRC on the data fields received during the select protocol, then compares the calculated CRC against the CRC field received in the last data field of the message frame to test the integrity of the data received in the select protocol.

During acknowledge protocols, the slave control circuit outputs parallel data from the transmitter via the DI2 bus. The status bus input from the transmitter informs the slave control circuit when parallel data can be sent to the transmitter to be shifted out on PTDO during the acknowledge protocol message frame. The first data field parallel input to and serially output from the transmitter in a message frame is the RCASP address. The second data field parallel input to and serially output from the transmitter is the status register in the slave control circuit. The last data field parallel input to and serially output from the transmitter is a CRC field. The slave control circuit calculates a CRC on the data fields transmitted during the acknowledge protocol, and includes the calculated CRC field in the message frame as the last field transmitted, to allow the receiving circuit to test the integrity of the data received in the acknowledge protocol. Depending upon the command, additional data fields may be transmitted between the second (status) and last (CRC) data fields. For example, during a Read command the I/O port inputs data fields to the transmitter to be included in the message frame of the acknowledge protocol as seen in FIG. 25. The data fields from the I/O port are also input to the slave control circuit, via the DI1 bus, so that they can be included in the CRC calculation performed on the data fields transferred in the acknowledge protocol message frame.

In response to a Connect PSBM command select protocol message frame (FIG. 26), the slave control circuit outputs control to enable the PTDO and STDO 3SBs, couple STDI to PTDO via MX1, couple STMS to PTMS via MX2, couple STDO to PTDI via MX3, and couple STCK to PTCK via MX4 and the clock synchronizer circuit CSC.

In response to a Connect RSBM command select protocol message frame (FIG. 26), the slave control circuit outputs control to enable the STDO 3SB, couple STDO to RTDI via MX3, couple STMS to RTMS via MX2, and couple STCK to RTCK via MX4 and the CSC.

In response to a Disconnect PSBM or RSBM command select protocol message frame (FIG. 26), the slave control circuit outputs control to disable the PTDO and STDO 3SBs, couple STMS to the logic 1 or 0 input to MX2 (logic 1 is selected if PTMS is 1 and logic 0 is selected if PTMS is 0), and couples STCK to PTCK via MX4 and the CSC.

In response to a Write command select protocol message frame (FIG. 27), the slave control circuit outputs memory write control (CTL) and the received address field (ADD2) to the I/O port to allow the received data fields (DATA1-n) to be output from the receiver via the DO bus and written to addressed memory location. The slave control circuit increments the address after each write operation to allow the next received data field to be output from the receiver and written to the next memory location. The slave control circuit contains a counter that decrements the count field (CNT) received in the message frame after each write operation. When the count reaches zero the last write operation has been performed and the write command is complete.

In response to a Read command select protocol message frame (FIG. 28), the slave control circuit inputs the memory address to read (ADD2) and the count (CNT) indicating the number of reads to be performed. After the select protocol completes, the slave control circuit outputs memory read control (CTL) and the received address field (ADD2) to the I/O port to read the memory data and input it to the transmitter via the DI1 bus.

Simultaneously, the slave control circuit starts an acknowledge protocol message frame to serially output the data fields read from memory (FIG. 28). The slave control circuit decrements the read count and increments the address after each read operation to allow the next memory data field to be read, input to the transmitter, and output in the acknowledge protocol message frame. When the read count decrements to zero, the slave control circuit stops reading data and terminates the acknowledge protocol.

In response to a Read Status command select protocol message frame (FIG. 26), the slave control circuit starts an acknowledge protocol message frame to serially output the contents of its status register on the PTDO output via the receiver circuit.

Multiplexers

MX1 receives selection control input from the slave control circuit and the APO signal from the transmitter and the STDI signal from the secondary port. MX1 outputs the selected input (STDI or APO) to the PTDO output, via a 3-state output buffer (3SB). The tri-state buffer 3SB is enabled or disabled (tri-stated) by control input from the slave control circuit.

MX2 receives selection control from the slave control circuit, the PTMS signal from the primary port, the RTMS signal from the remote port, and a logic 0 and 1 input. MX2 outputs the selected input (PTMS, RTMS, logic 0, or logic 1) to the STMS output.

MX3 receives selection control input from the slave control circuit, the PTDI signal from the primary port, and the RTDI signal from the remote port. MX3 outputs the selected input (PTDI or RTDI) to the STDO output, via a 3-state output buffer (3SB). The 3SB is enabled or disabled (tri-stated) by control input from the slave control circuit.

MX4 receives selection control input from the slave control circuit, the PTCK signal from the primary port, and the RTCK signal from the remote port. MX3 outputs the selected input (PTCK or RTCK) to the STCK output, via the clock synchronizer circuit (CSC).

Clock Synchronizer Circuit

The clock synchronizer circuit (CSC) receives clock synchronization control input from the slave control circuit and the selected clock output from MX4, and outputs a synchronized clock signal on the STCK output. The purpose of the CSC is to ensure that when MX4 switches between the two input clocks (PTCK and RTCK), the STCK outputs a clean, glitch free clock signal to the ICs connected on the serial bus.

Adapting the RCASP for a Two-Wire Serial Backplane Bus

In some of the newer IEEE backplane standards under development, only two wires are reserved for serial access to boards plugged into the backplane. Since the IEEE 1149.1 serial bus requires four wires, it cannot be used in backplanes designed for a two-wire serial bus. Under these conditions, a RSBM on each board must be solely responsible to control the serial access to ICs on the board using the remote port of the RCASP. Also the primary port of the RCASP must be modified so that it can interface to a PSBM via the inventions select and acknowledge protocols using a two-wire interface instead of the four-wire 1149.1 interface.

As described in the description of the ASP embodiment above, the select and acknowledge protocols can be operated on a common wire connection. This is possible because the two protocols are never active at the same time. The reason they are shown being operated over the four-wire 1149.1 bus was to allow the PSBM to access the selected application (ICs) using the 1149.1 serial bus.

Figure 30:
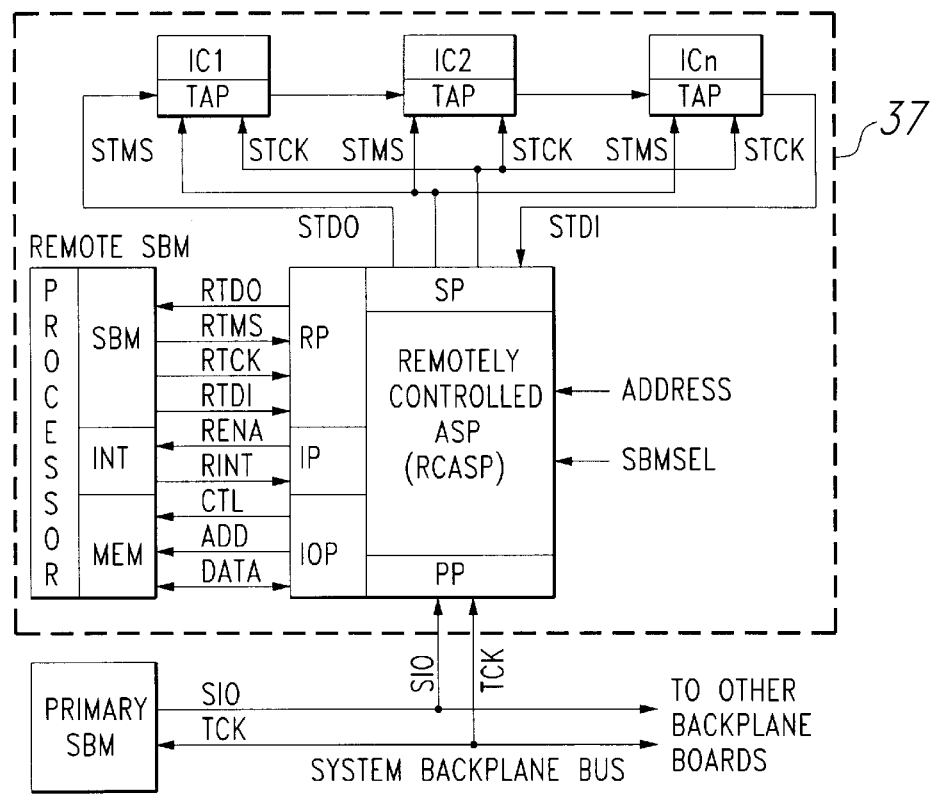
FIG. 30 depicts a block diagram of the circuitry required for a board having the RCASP circuit adopted for a two wire backplane serial bus.

FIG. 30 depicts, as an example of an alternative preferred embodiment, the RCASP's primary port interfaced to the PSBM via a two-wire backplane connection consisting of a bidirectional serial input/output (SIO) data wire and a TCK clock wire. While only one RCASP and associated board 37 are shown, normally the backplane would contain multiple boards, with each having an RCASP connected to the PSBM similar to the one shown in FIG. 6. The PSBM shown in FIG. 30 is similar to the PSBM of FIG. 21, with the exceptions that the TDO and TDI signals both share a common wire, and the TMS signal is deleted. Also the PSBM of FIG. 30 only supports the invention's select and acknowledge protocols, it does not support the 1149.1 protocol.

RCASP Circuit Adapted for a Two-Wire Primary Port Interface

Figure 31:
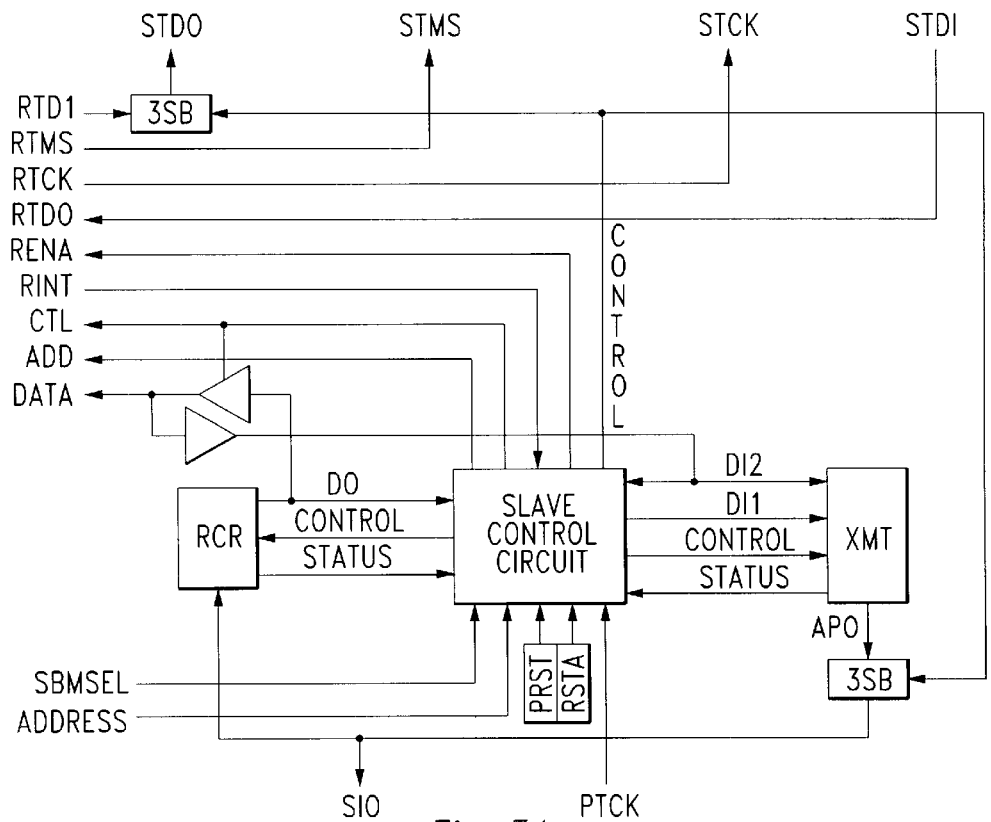
FIG. 31 depicts a block diagram of the RCASP circuit adopted for a two wire backplane serial bus and having a two wire primary port.

In FIG. 31, a detailed view of the adapted RCASP circuit is shown. The changes required to adapt the RCASP to interface with a two-wire primary interface include; (1) combining the PTDI and PTDO signals shown in FIG. 29 into one bidirectional signal called PSIO, (2) removing the PTMS input signal since no 1149.1 protocol is received from the PSBM, (3) removing the MX1, MX2, MX3, and MX4 since an 1149.1 connection between the primary and secondary ports is not possible in a two-wire interface, and (4) inputting the RTMS signal from the RSBM to the slave control circuit so that the slave control circuit can monitor when the RSBM is accessing the ICs via the secondary port.

In addition to these architectural changes, the adapted RCASP circuit of FIG. 31 does not require the commands described above for connecting or disconnecting the primary port and secondary port and does not require the PSBM connected status bit. All other commands, functions, and protocols of the adapted RCASP remain the same as those described previously for the non-adapted RCASP.

During a select protocol, the adapted RCASP receives the select protocol from the PSBM on the PSIO signal as the previously described RCASP received the select protocol on the PTDI signal. After the select protocol is completed, the adapted RCASP outputs the acknowledge protocol to the PSBM on the PSIO signal as the previously described RCASP output the acknowledge protocol on the PTDO signal. Thus the RCASP can exist and operate in a two-wire serial bus backplane environment without modifying the select and acknowledge protocols of the invention.

This description describes the use of the RCASP circuitry and protocol as applied to a system using the 1149.1 standard serial bus. It is important to understand that the RCASP protocol can be used with other pre-existing or newly defined serial buses. The RCASP circuit of the invention provides a method of enabling a primary SBM to input and output data from a memory using the I/O port and select and acknowledge protocols. The invention also provides a system level distributed test architecture.

In alternative embodiments to the ones detailed here, the RCASP circuit can exist as a packaged IC for assembly on a printed circuit board, an unpackaged die for assembly on a multi-chip module substrate, a subcircuit within an integrated circuit, or an embedded circuit in a multi-chip module semiconduct or substrate.

Section III

Hierarchical Addressable Shadow Port and Protocol

Another extension of the ASP concept of the invention provides a means of hierarchically connecting the root environment of a system up to any environment level in a system for multiple level systems and networks comprised of nested levels. Further, once a connection is made, the Hierarchical ASP (or HASP) circuitry provides a means to communicate to the connected environment from the root environment via the SBM and 1149.1 serial bus protocol.

Throughout the remainder of this disclosure the words "Environment" and "Application" are used. The word "Environment" is used to indicate a physical level within a system architecture. The "Root Environment" is the lowest level environment, and is where the SBM resides. One physical level up from the root environment is referred to as environment level 1, two levels up is referred to as environment level 2, an so on. The word "Application" is used to indicate a target within an environment that can be accessed by the SBM once the invention has been used to make a connection the target and SBM.

While both the ASP and RCASP circuits and protocols previously described can be connected to an SBM via the HASPs, only ASPs will be used in this disclosure to simplify the description.

Figure 32:
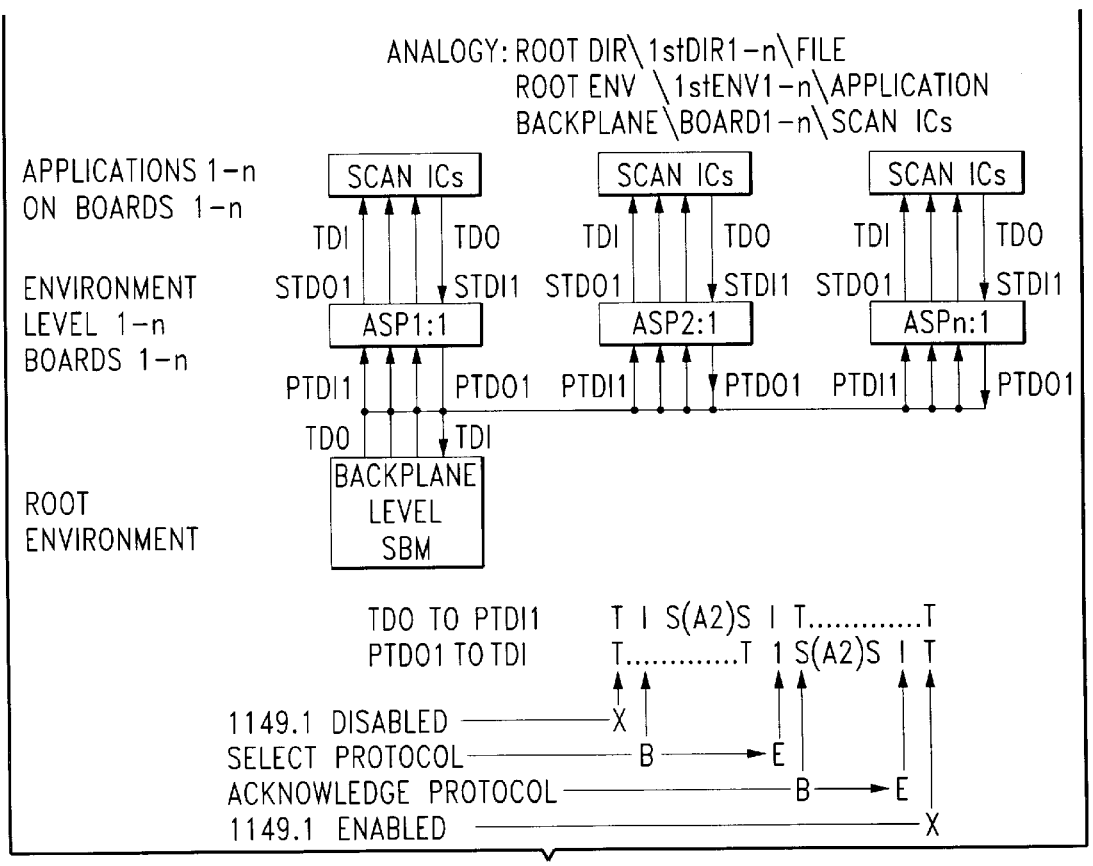
FIG. 32 depicts a block diagram of a one-level bus connection and the HASP protocol scheme of the invention.

FIG. 32 depicts a hierarchical ASP or HASP used in a single level environment, wherein an SBM in the backplane root environment is connected to board level ASPs 1-n:1 in the level 1 environment via a backplane 1149.1 serial bus. Each of the board level ASPs 1-n:1 are further connected to the SCAN ICs of the board (application) via a board level 1149.1 serial bus. The naming convention given to the ASPs in FIG. 32 is "ASPy:z", where "y" indicates the ASP's address and "z" indicates the environment level the ASP exists on. This naming convention is followed throughout hereafter for both ASPs and HASPs. For simplification, only the TDO and TDI type bus signal names are shown, while only the TMS and TCK signal wires are shown.

Before the application (ICs) on one of the boards (1-n) can be serially accessed by the SBM, a connection must be made between the backplane root environment and the board level 1 environment. In the example shown in FIG. 32, environment 1 consists of boards 1-n, each associated with ASPs 1-n. The address of each board is indicated by the 1,2 . . . n numbering scheme given to each ASP. The ASPs of environment 1 are connected such that their primary port (PTDI, PTMS,PTCK,PTDO) is connected to the SBM of the root environment, and their secondary port (STDI,STMS,STCK, STDO) is connected to the application (ICs). Also the environment level number (1) of the ASPs is included in the interface signal names, i.e. PTDI1, PTDO1, STDO1, and STDO1.

To connect an application on environment 1 to the SBM in the root environment, the SBM outputs a select protocol (TDO to PTDI1), using the I, S, and A signals and framing method defined in the ASP protocol above, to all the ASPs. In this example shown in the figure, the chosen address sent in the select protocol is address 2 (A2) and the beginning (B) and ending (E) of the select protocol is indicated. In response to receiving the select protocol with an address of 2, ASP2 outputs an acknowledge protocol (PTDO1 to TDI) with an address of 2 (A2) to the SBM, then connects the application (ICs) of board 2 up to the SBM via the 1149.1 serial bus. As with the select protocol, the beginning (B) and ending (E) of the acknowledge protocol is indicated.

This connection process is identical to the one described above with respect to the ASP circuitry on a single master backplane bus, since the connection is made between only two environments, board and backplane. Also it is seen that the connection process takes place during a time interval when the 1149.1 serial bus is in a disabled state, i.e. the time interval between the first and second X in the figure.

An analogy of this connection scheme is also shown in FIG. 32, the analogy compares the operation of selecting a 1st level directory from a root directory in a computer to gain access to a file, with selecting a 1st level environment from a root environment in the system to gain access to an application.

The HASP circuitry capability of hierarchically selecting and accessing an application in a hardware system environment as though it was a file in a hierarchical directory in a computer hard disk provides a method of overcoming the access limitations associated with traditional serial bus networks in such environments.

Two Level Access Using HASPs

Figure 33:
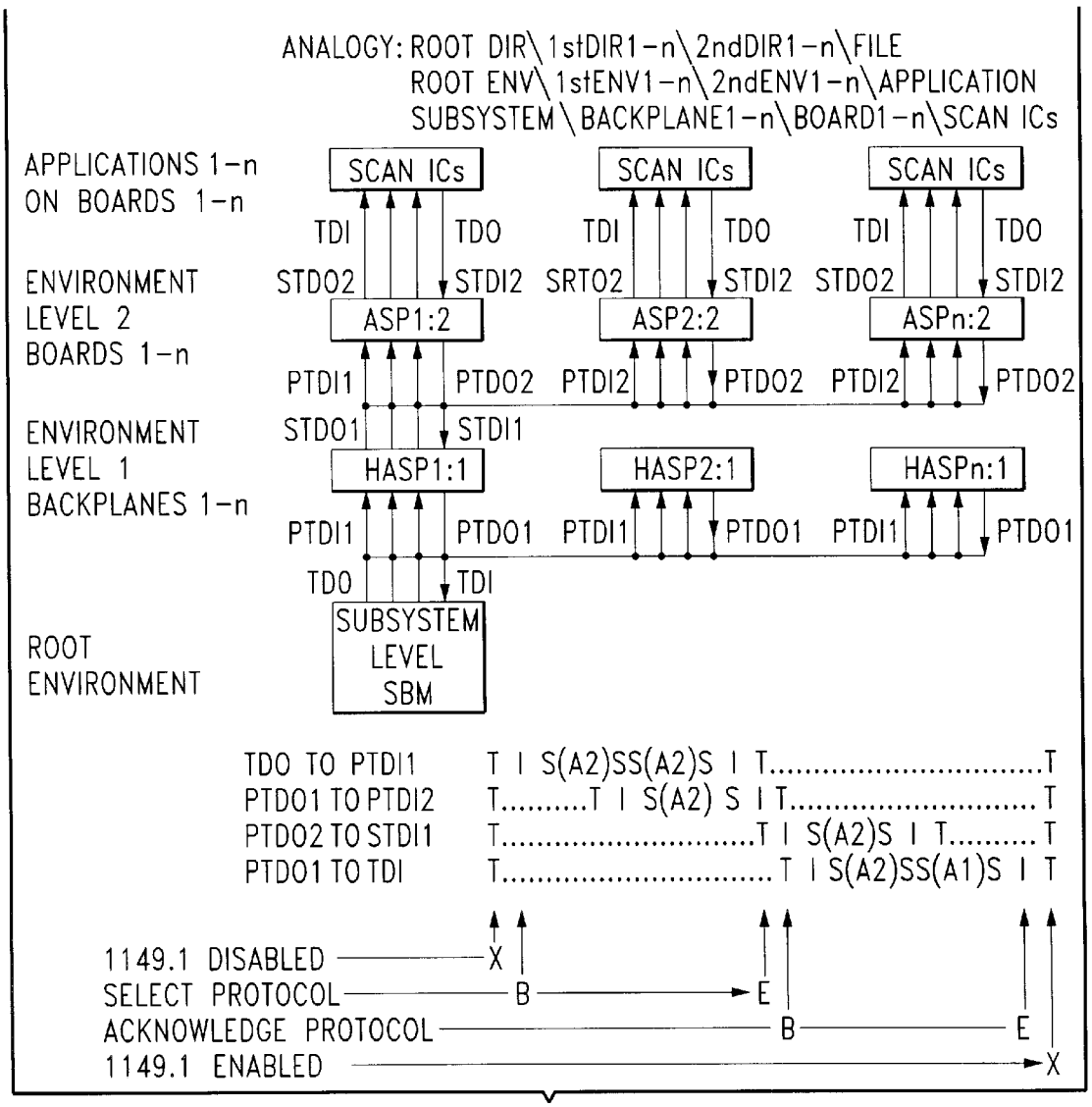
FIG. 33 depicts a block diagram of a two-level bus connection and the HASP connection protocol scheme of the invention.

In the two level environment of FIG. 33, an SBM in the subsystem root environment is connected to backplane level HASPs 1-n in the level 1 environment via a subsystem 1149.1 serial bus. Each of the backplane level HASPs 1-n are further connected to a series of board level ASPs 1-n via a backplane 1149.1 serial bus. Each of the board level ASPs 1-n are further connected to applications (ICs) via a board level 1149.1 serial bus. While connections are only shown between the HASPs and ASP where the described connection is to be made, all HASPs are connected to higher level environments.

The HASPs 1-n:1 are connected such that their primary ports (PTDI,PTMS,PTCK,PTDO) are connected to a lower level environment, and their secondary ports (STDI,STMS, STCK,STDO) are connected to a higher level environment. For example the HASPs 1-n in the backplane level 1 environment are connected to the SBM of the root environment (lower level environment) via their primary ports, and to the ASPs 1-n:2 of the board level 2 environment (higher level environment) via their secondary ports. Also the environment level number of each HASP/ASP port is included in the signal names. For example the primary and secondary signal names of HASPs 1-n of environment 1 end with the number "1", i.e. PTDI1, PTDO1, STDO1, and STDO 1.

Before the application (SCAN ICs) on one of the boards (1-n) can be serially accessed by the SBM, a hierarchical connection must be made between the subsystem root environment, the backplane level 1 environment, and the board level 2 environment. Environment 2 consists of boards 1-n, with each board having an ASP. The address of each board ASP is indicated by the 1,2, . . . n numbering scheme given to each ASP. Environment 1 consists of backplanes 1-n, with each backplane having a HASP. The address of each backplane HASP is indicated by the 1,2, . . . n numbering scheme given to each HASP.

To connect board 2 of environment 2 (ASP2:2)—in backplane 1 of environment 1 (HASP1:1)—to the SBM in the root environment of FIG. 32, the SBM outputs a hierarchical select protocol (TDO to PTDI1) using the previously defined I, S, and A signals and framing method. This select protocol differs from the first inventions select protocol in that multiple first and second S signals can be transmitted between the first and second I signals. This allows multiple addresses (A's) to be framed and transmitted during one select protocol sequence. The first framed address (A1) transmitted in the hierarchical select protocol sequence is used to select HASP1:1, i.e. HASP1 of environment 1. The second framed address (A2) transmitted in the hierarchical select protocol sequence is used to select ASP2:2, i.e. ASP2 of environment 2. The hierarchical select protocol output from the SBM terminates when a second I signal is transmitted, just as the non-hierarchical select protocol of the first invention terminates.

After HASP1:1 has received its address frame (SA1S) transmission from the SBM it looks to see what signal follows the address frame. If an I signal follows the address frame, HASP1:1 recognizes that the select protocol is complete and start its acknowledge protocol. If an S signal follows the address frame, HASP1:1 recognizes that the select protocol is hierarchical and that a new address frame is being transmitted. If a D signal follows the address frame, HASP1:1 recognizes that the select protocol is hierarchical and that a new data field within a message frame (see RCASP message frame description in the second invention) is being transmitted. After the HASP recognizes that a hierarchical select protocol is being transmitted it does not respond to any of the additional address frames or data fields it receives, thus it cannot be deselected or reset by subsequent address frames or data fields transmitted within the current hierarchical select protocol. Also when a selected HASP recognizes that a select protocol is hierarchical, it sets an internal flag bit which modifies the way it operates during the acknowledge protocol that follows the select protocol. The hierarchical acknowledge protocol is described later herein.

Note that when a select protocol message frame is being hierarchically transmitted from a SBM to a RCASP, via one or more HASPs, the HASP(s) will recognize the D-S-D signal sequence that separates the fields within the message frame. The HASP handles data fields within a message frame as it does address frames, and relays them from the SBM to the RCASP.

In response to seeing the start of the second address frame (SA2S), HASP1:1 enables its STDO1 output so that it can start a select protocol operation to transfer the second address frame (SA2S) to the ASPs/HASPs of the next higher level environment, which in this case is ASP2:2. HASP1:1 starts the select protocol by outputting a first I signal, then transfers the address frame (SA2S), and then terminates the select protocol by outputting a second I signal. The beginning (B) and ending (E) of the 2-level hierarchical select protocol sequence is indicated in FIG. 33. Notice that there is one signal latency between the ending of the hierarchical select protocol output from the SBM and the hierarchical select protocol output from HASP2 of environment 1. This latency is caused by the decision step that HASP2 performs to determine what signal (S or I) follows its address frame input (SA2S). A latency of one signal will be introduced for each additional environment level accessed by a hierarchical select protocol.

When the SBM completes the transmission of the hierarchical select protocol, it will output T signals on its TDO output and start monitoring its TDI input for the start of an acknowledge protocol from the PTDO1 output of HASP1:1. Likewise, when HASP1:1 completes relaying the hierarchical select protocol from the SBM to ASP2:2, it will output T signals on its STDO1 output and start monitoring its STDI1 input for the start of an acknowledge protocol from the PTDO2 output of ASP2:2.

After ASP2:2 receives its address frame (SA2S) in the select protocol transmission from HASP1:1, it starts its' acknowledge protocol output to HASP1:1. After transmitting a first I signal to initiate the acknowledge protocol, ASP2:2 outputs its' address frame sequence (SA2S) from its' PTDO2 output to the STDI1 input of HASP1:1. In response to the first S signal of the address frame input from ASP2:2, HASP1:1 enables its' PTDO1 output and starts relaying the acknowledge protocol from ASP2:2 to the SBM's TDI input by outputting a first I signal. After ASP2:2 has transmitted its address frame to the STDI1 input of HASP1:1, it terminates its' acknowledge protocol by outputting a second I signal to the STDI1 input of HASP1:1, then connects the 1149.1 serial bus from environment 1 to the application on board 2 of environment 2.

In response to the second I signal input from ASP2:2, HASP1:1 continues the acknowledge protocol sequence by outputting its own address frame (SA1S) to the TDI input of the SBM. After HASP1:1 transmits its' address frame to the TDI input of the SBM, it terminates the hierarchical acknowledge protocol by outputting a second I signal to the TDI input of the SBM, then connects the 1149.1 serial bus from the root environment to the backplane 1 1149.1 serial bus of environment 1. After the SBM receives the second I signal it determines that the hierarchical acknowledge protocol transmission is complete and examines the addresses received to confirm the correct hierarchical connection has been made. As with the select protocol, the beginning (B) and ending (E) of the hierarchical acknowledge protocol is indicated in FIG. 33.

Note that when an acknowledge protocol message frame is being hierarchically transmitted from a RCASP to a SBM, via one or more HASPs, the HASP(s) will recognize the D-S-D signal sequence that separates the fields within the message frame. The HASP handles data fields within a message frame as it does address frames, and relays them from the RCASP to the SBM.

Note that there is symmetry in form between the hierarchical select protocol output from the SBM and the hierarchical acknowledge protocol received by the SBM. The only difference in the protocols is that in hierarchical select protocol, the lowest environment level address frame is transmitted first and in the hierarchical acknowledge protocol the highest environment level address frame is transmitted first.

The ordering of the address frames in the hierarchical acknowledge protocol is key to making the hierarchical acknowledge protocol scheme work. By having the highest accessed environment level initiate the hierarchical acknowledge protocol, HASPs in lower environment levels only have to monitor their STDI inputs to determine when the hierarchical acknowledge protocol has been started. Since the upper acknowledge protocols are framed by first and second I signals, it is simple for a lower level HASP to determine when an upper acknowledge protocol transmission is completed so that it can insert its own address frame acknowledge indication in the hierarchical acknowledge protocol being relayed to the SBM. The operation is of the hierarchical acknowledge protocol is thus simple and structured and is independent of the number environment levels used.

The hierarchical connection process made possible by the HASP circuitry and protocol differs slightly from the ASP protocol described earlier, since the connections at each environment level are made in the order that the acknowledge protocols are sent. For example, in FIG. 33 the ASP2:2 connects after transmitting its acknowledge protocol, then HASP1:1 connects after including its address frame and terminating the hierarchical acknowledge protocol sequence. However, the same results are achieved since at the end of the hierarchical acknowledge protocol all environments are connected and ready for serial access via the SBM in the root environment. Also it is seen that the hierarchical connection process takes place during a time interval when the 1149.1 serial bus is in a disabled state, i.e. the time interval between the first and second X in the figure.

An analogy of this connection scheme is also shown in FIG. 33, which compares the operation of selecting a 2nd level directory from a root directory in a computer to gain access to a file, with selecting a 2nd level environment from a root environment in the system to gain access to an application.

Three Level Access Using HASPs

Figure 34:
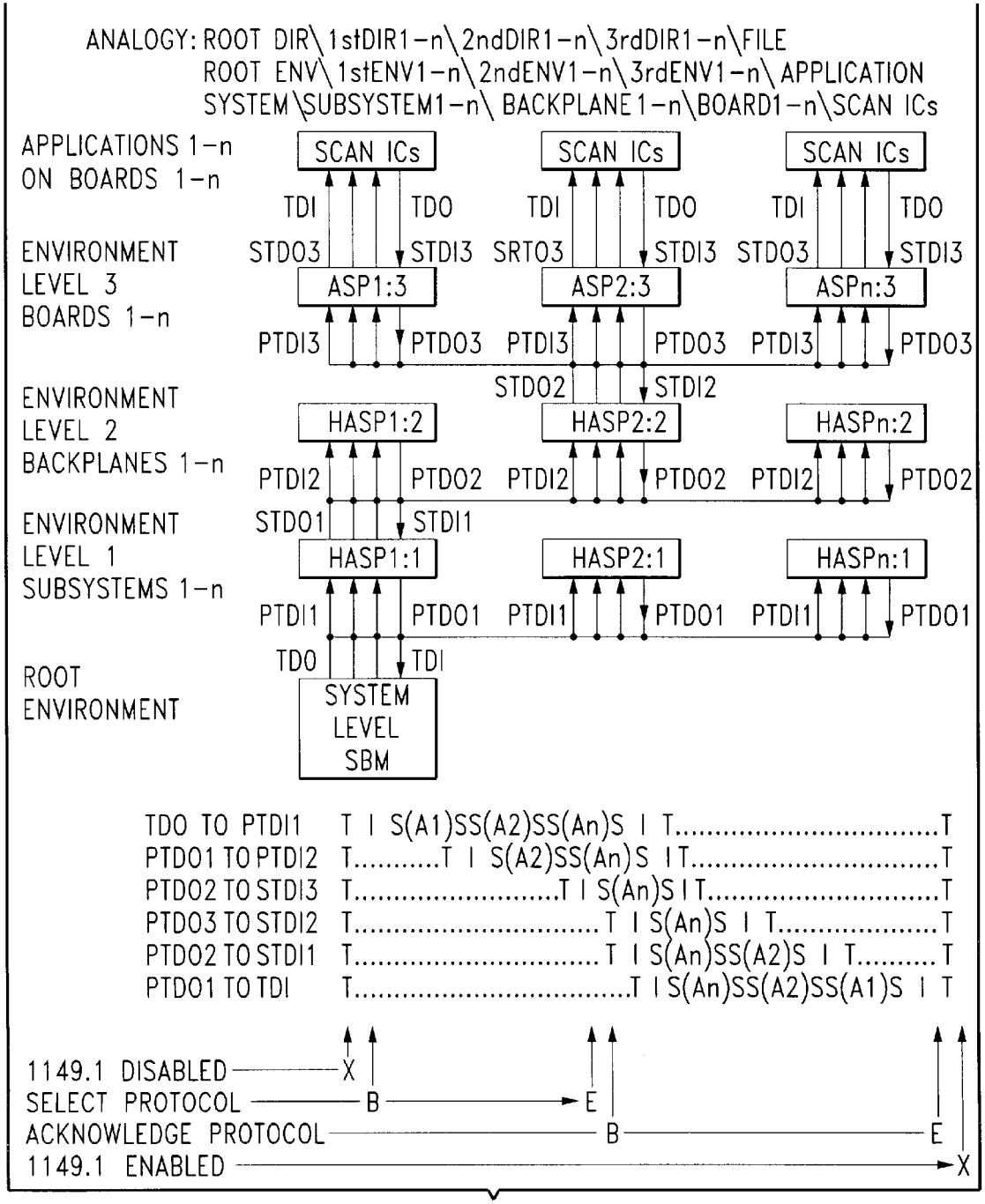
FIG. 34 depicts a block diagram of a three-level bus connection and the HASP connection protocol scheme of the invention.

In the three level environment of FIG. 34, an SBM in the system root environment is connected to subsystem level HASPs 1-n:1 in environment 1. The subsystem level HASPs 1-n:1 are connected to backplane level HASPs 1-n:2 in environment 2. The backplane level HASPs 1-n:2 are connected to board level ASPs 1-n:3 in environment 3. Each ASP is connected to an application (SCAN ICs) on each board 1-n. While connections are only shown between the HASPs and ASP where the described connection is to be made, all HASPs are connected to higher level environments. Before an application can be accessed by the system level SBM, a hierarchical connection must be made between the system level root environment, the subsystem level 1 environment, the backplane level 2 environment, and the board level 3 environment.

To connect the application associated with ASPn:3 to the SBM in the root environment of FIG. 3, the SBM outputs a hierarchical select protocol (TDO to PTDI1) to make a connection between the different environment levels. The first framed address (A1) in the hierarchical select protocol selects HASP1:1 in subsystem environment 1. The second framed address (A2) selects HASP2:2 in the backplane environment 2. The third framed address (An) selects ASPn:3 of board "n" in environment 3. The hierarchical select protocol output from the SBM terminates by transmitting the second I signal.

After ASPn:3 receives its address frame (SAnS) from the select protocol output from HASP2:2, it transmits an acknowledge protocol back to HASP2:2. In response to receiving the acknowledge protocol from ASPn:3, HASP2:2 transmits an acknowledge protocol to HASP1:1 which includes the address frame sent from ASPn:3 (SAnS) followed by its own address frame (SA2S). In response to receiving the acknowledge protocol from HASP2:2, HASP1:1 transmits an acknowledge protocol to the SBM in the root environment which includes the address frames sent from ASPn:3 (SAnS) and HASP2:2 (SA2S), followed by its own address frame (SA1S).

After each device completes their acknowledge protocol transmission, it connects its primary and secondary ports together to enable access via the 1149.1 serial bus. When the SBM receives the complete hierarchical acknowledge protocol output from HASP1:1, it verifies that the correct hierarchical connection was made. After the verification process, the SBM serially accesses the application on board "n" in environment 3 via the connections made between HASP1:1, HASP2:2, and ASPn:3.

To aid in understanding, an analogy of this connection scheme is shown in FIG. 34, which compares the operation of selecting a 3rd level directory from a root directory in a computer to gain access to a file, with selecting a 3rd level environment from a root environment in the system to gain access to an application.

Mth-Level Access Using HASPs

While the previous examples have shown the HASP invention accessing 1, 2, and 3 level system environments, the invention can be used to access any environment level (M) within a system by simply increasing the number of address frames transmitted in the hierarchical select protocol. The ability of the third invention to hierarchically connect a master device (SBM) to a slave device (ASP) at any environment level, provides an extremely flexible connection method that can precisely access a desired target application. The target application can be a system, a subsystem, a backplane, a board, a multi-chip module, an IC, a sub-circuit in an IC, a circuit within a subcircuit of an IC, . . . etc.

For example, the hierarchical select and acknowledge protocols of FIG. 35 illustrate the invention connecting an application in environment level "m" to a SBM in the root environment (RE) via intermediate environment levels 1,2,3 . . . m-2,m-1. Each address frame in the hierarchical select and acknowledge protocols is indicated by the sequence "Sm:aS", where the first S is the select signal that starts the address frame, "m" is a number from 1 to M included simply to illustrate the environment level the address is located in, "a" is a number from 1 to n that represents the address frame transmitted to or received from the environment level (m), and the second S is the select signal that stops the address frame.

In FIG. 35, the SBM of the root Environment (RE) outputs a hierarchical select protocol to HASPa of environment 1 (El). The hierarchical select protocol consists of an address frame (a) for each environment level 1 through M. HASPa of environment 1 receives the select protocol from the SBM, deletes its address frame (S1:aS), and transfers the remaining address frames on to HASPa of environment 2 (E2). HASPa of environment 2 receives the select protocol from HASPa of environment 1, deletes its address frame (S2:aS), and transfers the remaining address frames on to HASPa of environment 3 (E3). HASPa of environment 3 receives the select protocol from HASPa of environment 2, deletes its address frame (S3:aS), and transfers the remaining address frames on to HASPa of the next higher environment level. This process continues until HASPa of environment m-1 receives the select protocol from HASPa of environment m-2, deletes its address frame (Sm-1:aS), and transfers the last address frame (Sm:aS) on to ASPa of environment m.

Note that if a hierarchical connection is being made to a RCASP instead of a ASP, the last frame output from the SBM in the hierarchical select protocol will be a message frame, instead of the address frame (Sm:aS) shown in FIG. 4. A message frame has first and second S signals like an address frame, but inside a message frame additional fields exist which are separated by S signals. The message frame is described in detail above with respect to FIG. 26.

In response to the hierarchical select protocol of FIG. 35, ASPa of environment m outputs a hierarchical acknowledge protocol to HASPa of environment m-1. The hierarchical acknowledge protocol consists of the address of ASPa framed by first and second S symbols (Sm:aS). HASPa of environment m-1 receives the acknowledge protocol from ASPa of environment m, inserts its address frame (Sm-1:aS), and transfers the acknowledge protocol down to HASPa of environment m-2. HASPa of environment m-2 receives the acknowledge protocol from HASPa of environment m-1, inserts its address frame (Sm-2:aS), and transfers the acknowledge protocol down to the next lower environment level.

Eventually HASPa of environment 3 receives the acknowledge protocol from the next higher level environment, inserts its address frame (S3:aS), and transfers the acknowledge protocol to HASPa of environment 2. HASPa of environment 2 receives the acknowledge protocol from HASPa of environment 3, inserts its address frame (S2:aS), and transfers the acknowledge protocol down to HASPa of environment 1. HASPa of environment 1 receives the acknowledge protocol from HASPa of environment 2, inserts its address frame (S1:aS), and transfers the acknowledge protocol down to the SBM in the root environment (RE). When the SBM receives the second I symbol from HASPa of environment 1, the hierarchical acknowledge protocol is completed.

Note that when a hierarchical connection is being made to a RCASP instead of a ASP, the first frame input to the SBM in the hierarchical acknowledge protocol will be a message frame, instead of the address frame (Sm:aS) shown in FIG. 35. A message frame has first and second S signals like an address frame, but inside the message frame additional fields exist which are separated by S signals.

After the hierarchical acknowledge protocol has been output from each HASP, a connection is made between the device's primary and secondary ports to form a connection which will allow the SBM of the root environment to hierarchically access the target application connected to the selected ASP in environment m.

In general, the process involved during the hierarchical select protocol is for the SBM to output of a series of address frames within a single select protocol frame defined by first and second I signals. At each successive environment level, the selected HASP subtracts or deletes its address frame from the hierarchical select protocol and transmits the other address frames on up to the next higher level environment. This address frame deletion process continues at each environment level until the last address frame is transmitted to the selected HASP in the highest level environment. After the highest level HASP has been selected, the hierarchical select protocol is terminated with the second I signal.

In general, the process involved during the hierarchical acknowledge protocol is the inverse of the hierarchical select protocol. A hierarchical acknowledge protocol is initiated by the selected HASP in the highest level environment outputting its address frame within a single acknowledge protocol frame defined by first and second I signals. In response to the acknowledge protocol output from the HASP in the highest environment, HASPs in lower level environments pass on the acknowledge protocol and address frame to the SBM in the root environment. At each successive lower environment level, the address frame for that environment is added or inserted into the hierarchical acknowledge protocol after the upper address frame(s) have been transmitted on to the next lower environment level. This address frame insertion process continues until all the address frames from all the HASPs have been transmitted to the SBM in the root environment. After the address frame of the lowest level HASP has been transmitted to the SBM, the hierarchical acknowledge protocol is terminated with the second I signal.

Hierarchically Resetting HASPs in a System

If for some reason the SBM fails to receive a hierarchical acknowledge protocol in response to a hierarchical select protocol, it can issue a hierarchical select protocol consisting of multiple reset address frames (as described in above with respect to the ASP) to globally reset all HASP/ASP devices in the system. Alternately, local resetting of only the HASP/ASP devices existing in or above a selected environment is also possible using the hierarchical select protocol. If local resetting is desired, the SBM can output actual address frames before outputting the reset address frame(s) to direct the reset action to only the HASP/ASP devices in the environment(s) that are to be reset. Examples of globally resetting all HASP/ASP devices in a system and locally resetting only the ASPs of environment "m" are shown in the hierarchical select protocols of FIG. 36.

The "r" in the address frames of each environment level (1-m) in FIG. 36 indicates the reset address. The "a" in the address frames of each environment level (1-m) indicates an actual addresses. All HASP/ASP devices in each environment level respond to the reset address "r" in the hierarchical select protocol after it either terminates or has been transmitted or relayed on up to the next higher environment level.

Global commands and local commanding can be accomplished in much the same way as the local and global resetting described above. As discussed previously with respect to the use of global commands with the ASP circuitry of the invention, support for global commands which are concurrently executed by the RCASP and ASP circuits in the system can be accomplished by reserving one or more addresses for this use. As with the global reset commands, the device receiving the command must be certain not to send an acknowledge message, as this would result in a bus clash situation.

SBM and HASP Connection and Circuit Description

Figure 37:
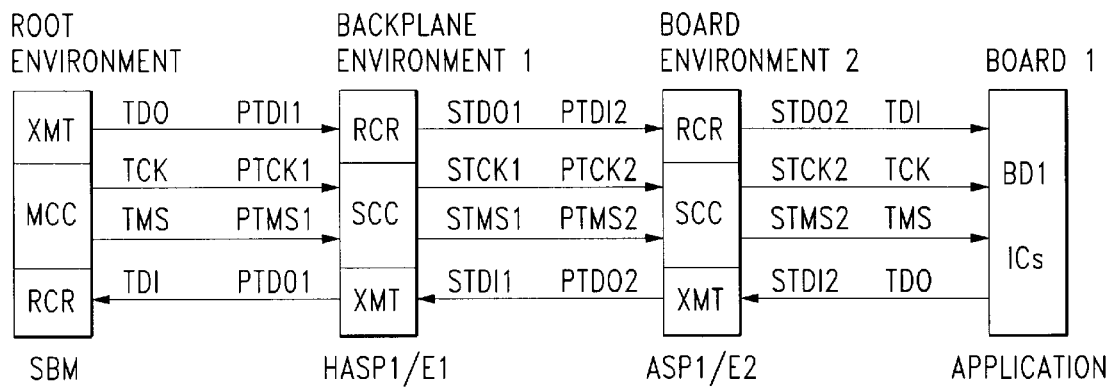
FIG. 37 depicts the synchronous timing of message transfers using the invention in a two level system.

In FIG. 37, a connection between an SBM, a HASP, and a ASP is shown. The SBM of the root environment is connected to HASP1 of backplane environment 1 (HASP1/E1). HASP1/E1 is connected to ASP1 of board environment 2 (ASP1/E2). ASP1/E2 is connected to the application on board 1 (ICs). While any number of HASPs can be connected between the SBM and ASP1/E2, only one is shown for simplicity. Also while a single HASP is shown in environment level 1 and a single ASP is shown in environment 2, any number the devices could exist in either environment.

The SBM has a transmitter circuit XMT to output the select protocol to HASP1/E1 from TDO to PTDI1, a receiver circuit RCR to receive the acknowledge protocol from the HASP1/E1 from PTDO1 to TDI, and a master control circuit MCC to regulate the operation of the transmitter and receiver circuits. When the SBM's transmitter circuit is not being used to output the select protocol, it can be used to output serial data to the ICs of board1, via HASP1/E1 and ASP1/E2, during 1149.1 scan operations. Likewise, when the SBM's receiver circuit is not being used to receive the acknowledge protocol, it can be used to receive serial data from the ICs of board1, via HASP1/E1 and ASP1/E2, during 1149.1 scan operations. The SBM's transmitter and receiver circuits are controlled by the master control circuit MCC to either transmit and receive the 1149.1 serial bus protocol or the inventions protocol.

The HASP/ASP devices have a receiver circuit RCR to receive the select protocol from the SBM, a transmitter circuit XMT to output the acknowledge protocol to the SBM, and a slave control circuit SCC to regulate the operation of the transmitter and receiver circuits. If the receiver and transmitter circuits are not being used to communicate the select and acknowledge protocols, and if the HASP/ASP is selected, the receiver and transmitter circuits allow serial data to be transferred from PTDI to STDO and from STDI to PTDO during 1149.1 scan operations.

When scan access of the ICs of board 1 is required, the SBM's master control circuit causes the transmitter to output a hierarchical select protocol from the SBM's TDO output to the PTDI1 input of HASP1/E1's receiver. In response to the select protocol, HASP1/E1's receiver strips off its address frame and transmits the select protocol from its STDO1 output to the PTDI2 input of the ASP1/E2's receiver. After the select protocol terminates, the slave control circuit of ASP1/E2 causes the transmitter circuit to output a hierarchical acknowledge protocol, containing its address frame, from ASP1/E2's PTDO2 output to the STDI1 input of HASP1/E1's transmitter, then connects its primary and secondary ports together.

In response to the acknowledge protocol, HASP1/E1's transmitter inserts its address frame into the acknowledge protocol as it passes the acknowledge protocol from its PTDO1 output to the SBM's TDI input, then connects its primary and secondary ports together. After receiving the hierarchical acknowledge protocol, the master control circuit of the SBM enables the transmitter and receiver circuits to perform 1149.1 scan operations to serially access the ICs of board 1 via HASP1/E1 and ASP1/E2.

Synchronous Transfer between Primary and Secondary ports

Figure 38:
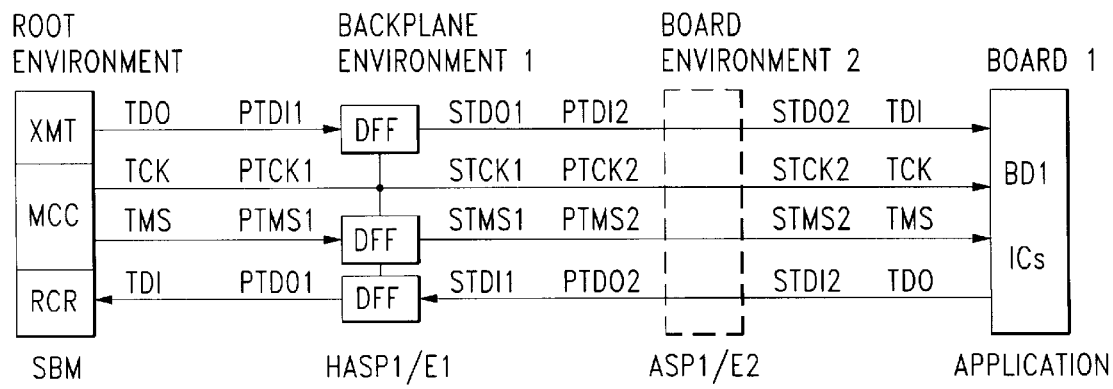
FIG. 38 depicts the synchronization of message transfers using D type F/Fs with the HASP circuitry of the invention in a two level system.

FIG. 38 depicts the synchronization circuitry for the hierarchical message transfers between levels. One very important difference between the ASP embodiment of the invention and the HASP embodiment of the invention is the method used to connect the primary and secondary bus signals. In the ASP protocol a simple electronic switch or multiplexer could be used to connect the primary and secondary bus signals, since only a single environment level connection was made by the ASP. However, since any number of environment levels may be connected using the HASP, it is very important to provide a method of synchronizing the signal transfer between the primary and secondary HASP ports using clocked storage elements such as the D-flip flops (DFF) as shown in FIG. 38.

If the primary and secondary bus signal connections of the HASP were made by a simple electronic switch, as in the ASP of the first invention, the accumulation of delays through the switches of multiple HASPs in a hierarchical connection would limit the number of environment levels the invention could serially access. However, with the primary and secondary connections of the HASP synchronized through DFFs as shown in FIG. 38, the delays do not accumulate as more HASPs are included in the hierarchical connection, thus no limitations exist on the number of environment levels that can be hierarchically connected using the HASP.

FIG. 38 illustrates the connection made in the HASP and ASP of FIG. 37 between the SBM and application, following a select and acknowledge protocol. The HASP1/E1 connects the PTDI1 input to the STDO1 output through a DFF, the PTMS1 input to the STMS1 output through a DFF, the STDI1 input to the PTDO1 output through a DFF, and the PTCK1 input connects directly to the STCK1 output. The DFFs are all clocked by the TCK input from the SBM. The ASP1/E2 makes a direct connection between the PTDI2 input and STDO2 output, the PTMS2 input and STMS2 output, the STDI2 input and PTDO2 output, and PTCK2 input and STCK2 output. Since the HASP uses a synchronized connection method, any number of HASPs may be placed between the SBM and ASP1/E2 to make a connection to any hierarchical environment level within a system.

SBM Transmitter Circuit Operation

Figure 39:
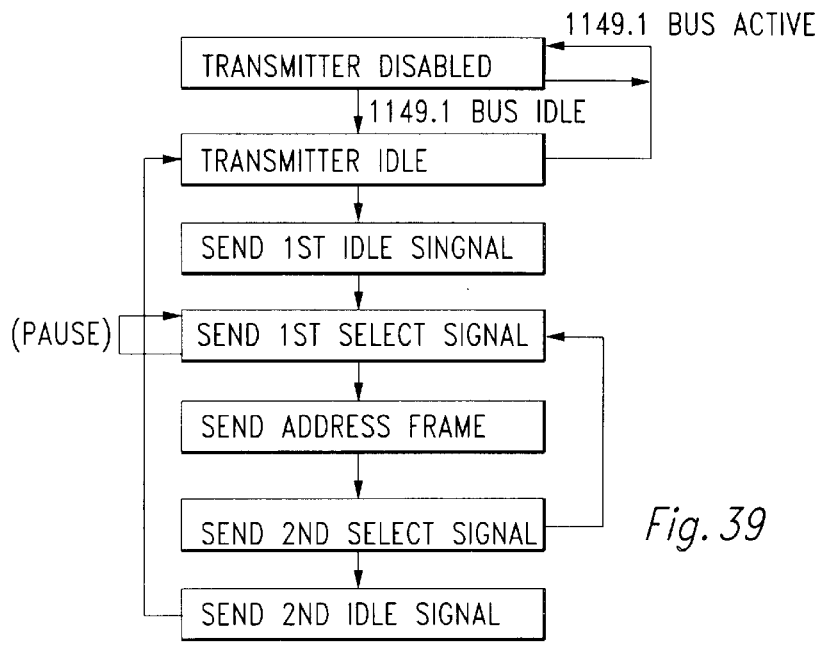
FIG. 39 depicts a state diagram of the SBM Transmitter circuitry of the HASP circuit of the invention.

A state diagram of the operation of the SBM's transmitter circuit is shown in FIG. 39. The SBM uses its transmitter circuit to transmit the inventions hierarchical select protocol and to transmit serial data during 1149.1 serial bus operations. In the state diagram, the transmitter circuit is forced into the Transmitter Disabled state while the 1149.1 bus is active. This state insures that the transmitter cannot be inadvertently enabled, while the 1149.1 bus is in operation, to output the hierarchical select protocols. When the 1149.1 bus is idle, the transmitter circuit enters into the Transmitter Idle state. If it is not necessary to output a hierarchical select protocol, the transmitter circuit remains in the Transmitter Idle state until the 1149.1 bus becomes active again, in which case the transmitter circuit returns to the Transmitter Disabled state.

If it is necessary to output a hierarchical select protocol, while in the Transmitter Idle state, the transmitter circuit enters the Send 1st Idle Signal state to output the first I signal to start the hierarchical select protocol, then enters the Send 1st Select Signal state to output the first S signal to start the address frame, then enters the Send Address Frame state to output a series of D signals indicating the address, then enters the Send 2nd Select Signal state to output the second S signal to stop the address frame. If another address frame is to be transmitted, the transmitter circuit transitions from the Send 2nd Select Signal state to the Send 1st Select Signal state to start another address frame. If another address frame is not transmitted, the transmitter circuit transitions from the Send 2nd Select Signal state to the Send 2nd Idle Signal state to stop the hierarchical select protocol. From the Send 2nd Idle Signal state, the transmitter circuit returns to the Transmitter Idle state. The transmitter returns to the Transmitter Disabled state whenever the 1149.1 bus becomes active again.

Note that if pausing between fields is required, the transmitter can remain in the Send First Select Signal state, transmitting S signals, until the pause is complete.

Note that if the SBM is sending a message frame to a RCASP instead of an address frame to an ASP, the message frame would be sent in the Send Address Frame state. The Send Address Frame state can be used to send either address or message frames.

SBM Receiver Circuit Operation

Figure 40:
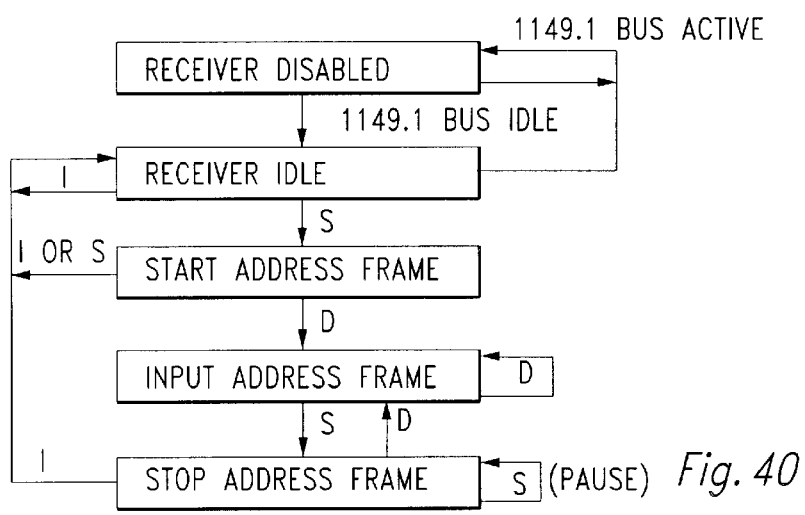
FIG. 40 depicts a state diagram of the SBM Receiver circuitry of the HASP circuit of the invention.

A state diagram of the operation SBM's receiver circuit is shown in FIG. 40. The SBM uses its receiver circuit to receive the hierarchical acknowledge protocol and to receive serial data during 1149.1 serial bus operations. In the state diagram, the receiver circuit is forced into the Receiver Disabled state while the 1149.1 bus is active. This state insures that the receiver cannot be inadvertently enabled, while the 1149.1 bus is in operation, to receive a false input condition. When the 1149.1 bus is idle, the receiver circuit enters into the Receiver Idle state. If the 1149.1 bus becomes active again, the receiver circuit returns to the Receiver Disabled state. While in the Receiver Idle state, the receiver circuit polls for the occurrence of an I or S signal. In response to an I signal, the receiver remains in the Receiver Idle state. In response to an S signal, the receiver signals the occurrence of a first S signal to the master control circuit (MCC) and transitions into the Start Address Frame state to start the address frame input operation.

When transitioned into the Start Address Frame state, the receiver circuit polls for the occurrence of an I, S, or D signal. In response to an I or S signal input, the receiver circuit will transition from the Start Address Frame state back into the Receiver Idle state and signal the master control circuit that a false first S signal had been received. This transition path provides; (1) a method of returning receiver circuit to the Receiver Idle state in the event that the receiver transitioned into the Start Address Frame state in response to an error input, and (2) a method of signaling the master control circuit that an acknowledge protocol had not actually been started and to reset and begin looking for the next occurrence of a first S signal indication. In response to a D signal input, the receiver circuit transitions from the Start Address Frame state into the Input Address Frame state and starts receiving the transmitted address. The receiver remains in the Input Address Frame state and continues receiving the address while D signals are being input. In response to an S signal, the receiver circuit stops inputting the address, signals the occurrence of the second S signal to the master control circuit, and transitions from the Input Address Frame state to the Stop Address Frame state.

Note that if the SBM is receiving a message frame from a RCASP instead of an address frame from an ASP, the message frame would be received in the Input Address Frame state. The Input Address Frame state can be used to receive either address or message frames.

If another S signal follows the S signal input, the SBM's receiver pauses in the Stop Address Frame state. If a D signal follows the S signal input, the SBM's receiver transitions from the Stop Address Frame state to the Input Address Frame state to receive additional data fields within a message frame. If an I signal follows the S signal input, the SBM's receiver transitions from the Stop Address Frame state to the Receiver Idle state to terminate input of the hierarchical acknowledge protocol. When the SBM's receiver enters the Receiver Idle state, the SBM's master control circuit matches the HASP address frame inputs against the expected HASP addresses to see if the correct HASPs had been selected. If the address frame inputs match the expected addresses, the SBM's master control circuit can serially access the selected hierarchical application using the 1149.1 serial bus protocol. If the address frames do not match the expected addresses, the SBM's master control circuit will not attempt to serially access the application and will report the failure.

SBM Master Control Circuit Operation

Figure 41:
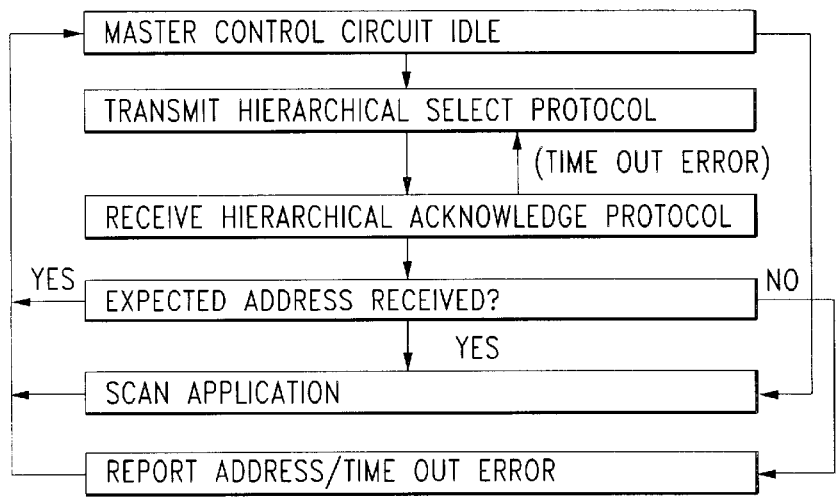
FIG. 41 depicts a state diagram of the SBM Master Control circuitry of the invention.

A state diagram of the operation of the SBM's master control circuit is shown in FIG. 41. The master control circuit regulates the operation of the SBM's transmitter and receiver circuits. The master control circuit can enable the SBM's transmitter and receiver circuits to communicate to HASP or ASP devices using either the 1149.1 serial bus protocol or the inventions hierarchical select and acknowledge protocols. Initially, the master control circuit will communicate to the devices using the inventions hierarchical select and acknowledge protocols to select an application for serial access. After an application has been selected the master control circuit serially accesses the application using the 1149.1 serial bus protocol.

As shown in the state diagram, when no application is being accessed the master control circuit is in the Master Control Circuit Idle state. If access is required to an applications whose HASP/ASP connections have previously been selected, the master control can transition from the Master Control Circuit Idle state to the Scan Application state and serially access the application using the 1149.1 protocol. However, if access to an application whose HASP/ASP connections have not been previously selected, the master control circuit must select the connections before entering the Scan Application state. To select an application, the master control circuit transitions from the Master Control Circuit Idle state into the Transmit Hierarchical Select Protocol state. In the Transmit Hierarchical Select Protocol state the master control circuit loads the SBM's transmitter circuit with the address frames of the HASPs required to access the application, then enables the transmitter circuit to transmit a hierarchical select protocol to select the application.

After the enabling the transmitter circuit to send the hierarchical select protocol, the master control circuit transitions from the Transmit Hierarchical Select Protocol state to the Receive Hierarchical Acknowledge Protocol state. In the Receive Hierarchical Acknowledge Protocol state, the master control circuit enables the SBM's receiver circuit to receive the hierarchical acknowledge protocol from the selected HASP/ASP devices. After the hierarchical acknowledge protocol is received, the master control circuit transitions from the Receive Hierarchical Acknowledge Protocol state into the Expected Addresses Received? state to verify that the address frames were correctly received. If incorrect addresses were received, the master control circuit aborts the select operation and transitions from the Expected Addresses Received? state into the Report Address/Time Out Error state. In the Report Address/Time Out Error state, the master control circuit reports the address failure and places the SBM's transmitter and receiver circuits into their idle state.

Note that if the SBM is receiving a message frame from a RCASP, the fields within the message frame would also be checked in the Expected Address Received state, as described above.

If the correct addresses were received, the master control circuit may either transition from the Expected Addresses Received? state into the Master Control Circuit Idle state and access the selected application at a later time, or transition into the Scan Application state to immediately access the application using the 1149.1 serial bus protocol. In either case, when the master control circuit does enter the Scan Application state, it configures the SBM's transmitter and receiver circuits to where they can be used to communicate with the application using the 1149.1 serial bus protocol. After the application has been serially accessed, the master control circuit transitions from the Scan Application state into the Master Control Circuit Idle state, where it disables the SBM's transmitter and receive circuits and remains until it is required to serially access the same or another application.

Note that if the hierarchical acknowledge protocol is not received after a predetermined amount of time, the master control circuit can transition from the Receiver Hierarchical Acknowledge Protocol state to the Transmit Hierarchical Select Protocol state in response to the Time Out Error and transmit a hierarchical select protocol with reset address frames into the HASPs of the system, as described above. After transmitting the reset address frames, the master control circuit transitions from the Transmit Hierarchical Select Protocol state to the Report Address/Time Out Error state to report the time out failure, place the SBM's transmitter and receiver circuits in their idle states, and then transition into the Master Control Circuit Idle state.

HASP Receiver Circuit Operation

A state diagram of the operation HASP's receiver circuit is shown in FIG. 42. The HASP uses its receiver circuit to receive the hierarchical select protocol and to transfer serial data during 1149.1 serial bus operations. In the state diagram, the receiver circuit is forced into the Receiver Disabled state while the 1149.1 bus is active. This state insures that the receiver cannot be inadvertently enabled, while the 1149.1 bus is in operation, to receive a false input condition. When the 1149.1 bus is idle, the receiver circuit enters into the Receiver Idle state. If the 1149.1 bus becomes active again, the receiver circuit returns to the Receiver Disabled state. While in the Receiver Idle state, the receiver circuit polls for the occurrence of an I or S signal. In response to an I signal, the receiver remains in the Receiver Idle state. In response to an S signal, the receiver signals the occurrence of a first S signal to the slave control circuit (SCC), resets the hierarchical select (HSP) flag, and transitions into the Start Address Frame state to start the address frame input operation.

When transitioned into the Start Address Frame state, the receiver circuit polls for the occurrence of an I, S, or D signal. In response to an I or S signal input, the receiver circuit will transition from the Start Address Frame state back into the Receiver Idle state and signal the slave control circuit that a false first S signal had been received. This transition path provides; (1) a method of returning receiver circuit to the Receiver Idle state in the event that the receiver transitioned into the Start Address Frame state in response to an error input, and (2) a method of signaling the slave control circuit that an select protocol had not actually been started and to reset and begin looking for the next occurrence of a first S signal indication. In response to a D signal input, the receiver circuit transitions from the Start Address Frame state into the Input Address Frame state and starts receiving the first transmitted address frame. The receiver remains in the Input Address Frame state and continues receiving the address frame while D signals are being input. In response to a second S signal, the receiver circuit stops inputting the address frame, signals the occurrence of the second S signal to the HASP's slave control circuit, and transitions from the Input Address Frame state to the Stop Address Frame state.

When the HASP's slave control circuit receives the signal indicating the occurrence of the second S signal, it matches the received address frame against the expected HASP address to see if it has been selected. If the address frame matches the expected address, the HASP's slave control circuit enables the receiver circuit to output the remainder of the hierarchical select protocol on the STDO output. If the address frame does not match the expected address, the slave control circuit disconnects the HASP and disables the receiver circuit from outputting the remainder of the hierarchical select protocol on the STDO output.

One of the following scenarios happen after the occurrence of the second S signal. (1) If the first address frame does not match and another S signal follows the second S signal input, the HASP's receiver transitions from the Stop Address Frame state to the Start Address Frame state to start another address frame input operation. This is just a dummy operation the receiver executes until the hierarchical select protocol is completed. (2) If the first address frame matches and another S signal follows the second S signal input, the HASP's receiver pauses in the Stop Address Frame state to the Start Address Frame state waiting for a D signal to start outputting the next address frame on the STDO output to the next higher environment level. (3) If the first address frame matches and a D signal follows the second S signal input, the HASP's receiver sets the HSP flag and transitions from the Stop Address Frame state to the Input Address Frame state to output a field of a message frame on the STDO output to the next higher environment level. (4) If an I signal follows the second S signal input, the HASP's receiver transitions from the Stop Address Frame state to the Receiver Idle state to terminate the hierarchical select protocol.

Note that the Input Address Frame state can be used to relay either an address frame or a field in a message frame. Also, if the hierarchical connection terminates with a RCASP instead of an ASP, the last frame relayed to the RCASP via the highest level HASP during the select protocol will be a message frame, not an address frame.

HASP Transmitter Circuit Operation

Figure 43:
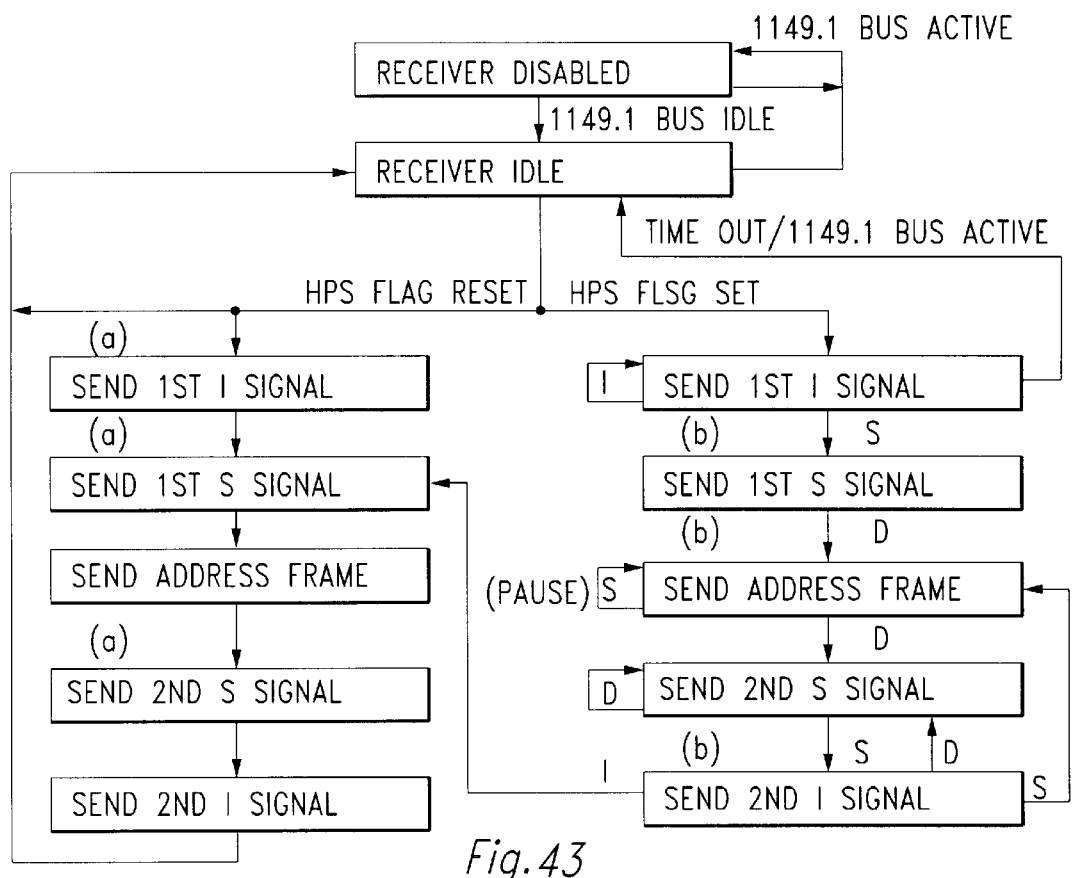
FIG. 43 depicts a state diagram of the HASP transmitter circuitry of the invention.

A state diagram of the operation of the HASP's transmitter circuit is shown in FIG. 43. The HASP uses its transmitter circuit to transmit the hierarchical acknowledge protocol and to transfer serial data during 1149.1 serial bus operations. In the state diagram, the transmitter circuit is forced into the Transmitter Disabled state while the 1149.1 bus is active. This state insures that the transmitter cannot be inadvertently enabled, while the 1149.1 bus is in operation, to output the hierarchical select protocols. When the 1149.1 bus is idle, the transmitter circuit enters into the Transmitter Idle state. In the Transmitter Idle state, three scenarios can occur.

(1) If it is not necessary to output an acknowledge protocol, the transmitter circuit remains in the Transmitter Idle state until the 1149.1 bus becomes active again, in which case the transmitter circuit returns to the Transmitter Disabled state.

(2) If the previous select protocol was not hierarchical (HSP Flag is reset see section 4.2), the transmitter circuit enters the Send 1st I Signal state (a) to output the first I signal to start the acknowledge protocol, then enters the Send 1st S Signal state (a) to output the first S signal to start the address frame, then enters the Send Address Frame state (a) to output a series of D signals indicating the HASP address, then enters the Send 2nd S Signal state (a) to output the second S signal to stop the address frame. The transmitter circuit transitions from the Send 2nd S Signal state (a) to the Send 2nd I Signal state to stop the acknowledge protocol. From the Send 2nd I Signal state, the transmitter circuit returns to the Transmitter Idle state. The transmitter returns to the Transmitter Disabled state whenever the 1149.1 bus becomes active again.

(3) If the previous select protocol was hierarchical (HSP Flag is set, see section 4.2), the transmitter circuit enters the Poll For 1st S Signal state to monitor the STDI input for the start of an acknowledge protocol. The transmitter circuit remains in the Poll For 1st S Signal state while I signals are input on the STDI input. If the 1149.1 bus becomes active or if a time out error occurs, the transmitter will transition into the Transmitter Idle state. If an S Signal is received on the STDI input, the transmitter circuit enters the Send 1st I Signal state (b) to output the first I signal on PTDO to start the acknowledge protocol, then enters the Send 1st S Signal state (b) to output the first S signal to start relaying the received address frame from an ASP or message frame from a RCASP, then enters the Relay Address Frame state to relay a series of D signals received on the STDI input to the PTDO output. When a 2nd S signal is received on the STDI input, the transmitter circuit enters the Send 2nd S Signal state (b) to output the second S signal on the PTDO output to stop relaying the address or message frame. One of the following scenarios occur after the 2nd S signal has been received.

(1) If the next signal received on the STDI input is a D signal, message frame fields are being received and the transmitter re-enters the Relay Address Frame state (b) and continues the process of relaying message frame fields. (2) If the next signal received on the STDI input is an S signal, the first frame type (address or message type) has been relayed and another address frame is being received. To relay the next address frame, the transmitter re-enters the Send 1st S Signal state to start relaying the next address frame. The transmitter pauses in the Send 1st S Signal state if additional S signals are input. (3) If the next signal received on the STDI input is a 2nd I signal, the transmitter enters the Send 1st S Signal state (a) to output a 1st S Signal to start its own address frame, then enters the Send Address Frame to output its address frame, then enters the Send 2nd S Signal state (a) to output the second S signal to stop its address frame output. The transmitter transitions from the Send 2nd S Signal state (a) to the Send 2nd I Signal state to stop the hierarchical acknowledge protocol. From the Send 2nd I Signal state, the transmitter circuit returns to the Transmitter Idle state. The transmitter returns to the Transmitter Disabled state whenever the 1149.1 bus becomes active again.

The Relay Address Frame state can be used to relay either a an address frame or a field in a message frame. Also, if the hierarchical connection terminates with a RCASP instead of an ASP, the first frame relayed back to the SBM via the lowest level HASP during the acknowledge protocol will be a message frame, not an address frame.

HASP Slave Control Circuit Operation

A state diagram of the operation of the HASP's slave control circuit is shown in FIG. 44. The slave control circuit regulates the operation of the HASP's transmitter and receiver circuits. The slave control circuit enables the HASP's transmitter and receiver circuits to communicate to the SBM using the inventions hierarchical select and acknowledge protocols. After the HASP has been selected by the SBM, the slave control circuit enables the transmitter and receiver circuits to pass the serial data input and output through the HASP during 1149.1 scan operations.

In the state diagram, when no hierarchical select protocols are being sent from the SBM to the HASP, the slave control circuit is in the Slave Control Circuit Idle state. When the start of a hierarchical select protocol is received by the HASPs receiver circuit the slave control circuit transitions from the Slave Control Circuit Idle state into the Receive Hierarchical Select Protocol state. After the first address frame of the hierarchical select protocol has been received, the slave control circuit transitions from the Receive Select Protocol state into the First Address Frame Match? state. In the First Address Frame Match? state the slave control circuit reads the first address frame from the receiver circuit and compares it against the HASP's address. If the address does not match the HASP's address, the slave control circuit transitions from the First Address Frame Match? state into the Disconnect Buses state to disconnect any previously connected board to backplane bus signals inside the HASP. From the Disconnect Buses state the slave control circuit transitions into the Slave Control Circuit Idle state and waits for the start of another select protocol sequence.

If the first address frame matches the HASP's address, the slave control circuit transitions from the First Address Frame Match? state into the Relay Hierarchical Select Protocol state. In the Relay Hierarchical Select Protocol state, the slave control circuit enables the receiver circuit's STDO output to relay any additional address frames on up to higher level HASPs or ASPs. When the hierarchical select protocol is completed, the slave control circuit transitions into the Relay Hierarchical Acknowledge Protocol state. In the Relay Hierarchical Acknowledge Protocol state, the slave control circuit enables the transmitter circuit to transmit an acknowledge protocol to the SBM. If the hierarchical select protocol only included the address frame of the HASP, (i.e. the select protocol was not hierarchical) the HSP flag will be reset and the acknowledge protocol is initiated by the HASP as soon as the transmitter circuit is enabled. However, if additional address frames were relayed through the HASP to higher level HASPs/ASPs, (i.e. the select protocol was hierarchical) the HSP flag will be set and the acknowledge protocol is initiated when a first S signal is received on the STDI input of the receiver as described in the receiver circuit description above.

After the acknowledge protocol has been sent, the slave control circuit disables the HASP's transmitter and transitions from the Relay Hierarchical Acknowledge Protocol state into the Connect Buses state. In the Connect Buses state, the slave control circuit outputs control to connect the primary and secondary ports to allow the SBM to serially access the application using the 1149.1 serial bus protocol. After the buses have been connected, the slave control circuit transitions from the Connect Buses state into the Slave Control Circuit Idle state to wait for the start of another hierarchical select protocol input from the SBM.

Note that if the hierarchical acknowledge protocol is not received after a predetermined amount of time, the HASP's transmitter circuit will terminate the acknowledge protocol and input a time out error signal to the slave control circuit, as described above. In response to the time out error signal, the slave control circuit will transition from the Relay Hierarchical Acknowledge Protocol state into the Slave Control Circuit Idle state and wait for another hierarchical select protocol input from the SBM.

Detail of the HASP Circuitry

Figure 45:
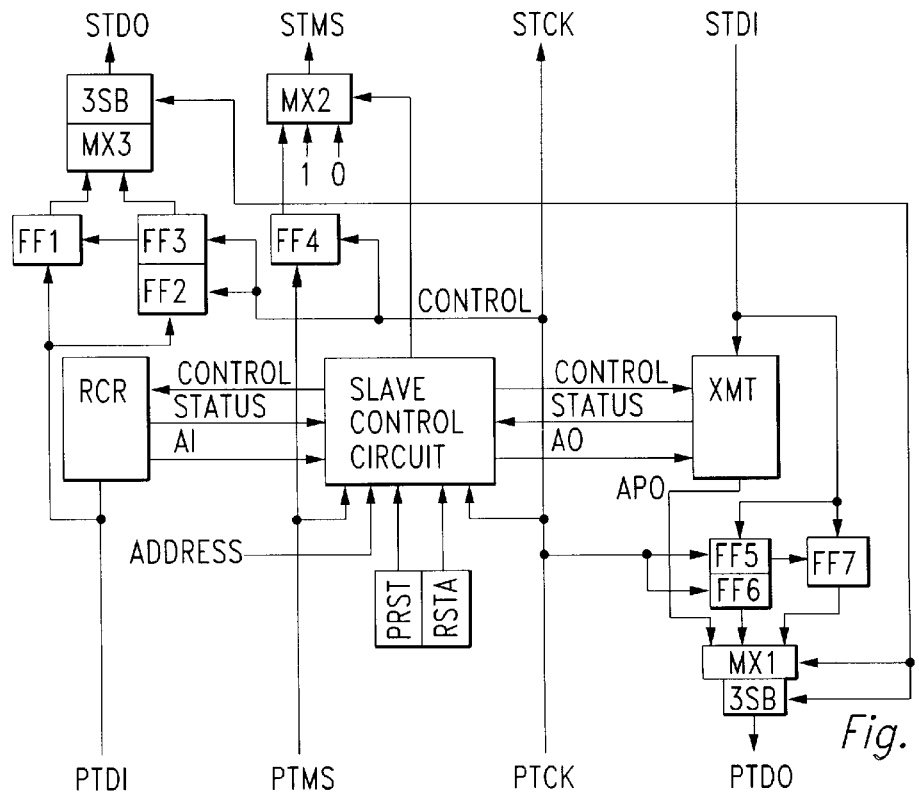
FIG. 45 depicts a block diagram of the HASP Circuit implementation.

One preferred implementation of the HASP is shown in FIG. 45. The HASP has inputs and outputs for; the primary 1149.1 serial bus signals (PTDI, PTMS, PTCK, PTCK), the secondary 1149.1 serial bus signals (STDO, STMS, STCK, STDO), and inputs for the HASP address. The HASP consists of a receiver (RCR), a transmitter (XMT), a slave control circuit, multiplexers 1–3, flip flops 1–7, a power up reset circuit (PRST), and a reset address circuit (RSTA).

HASP Receiver Circuit

The receiver circuit RCR in FIG. 45 consists of a controller for regulating the hierarchical select protocol input from the SBM, and a serial input/parallel output (SIPO) register for receiving the serial address from the SBM and outputting the address in parallel to the slave control circuit. The PTDI signal is input to the SIPO register to supply the serial address during select protocols, and is input to the controller for regulating the operation of the receiver during select protocols. The parallel address output from the SIPO is input to the slave control circuit via the address input (AI) bus. The status output from the receiver's controller is input to the slave controller circuit to indicate when a select protocol has started, when the address is ready to read, if the select protocol is hierarchical or non-hierarchical, and when the select protocol has completed.

The receiver's controller determines when a first "I then S then D" signal sequence occurs on PTDI, indicating the start of a select protocol and the start of the first address frame input. In response to this input sequence, the controller enables the SIPO to receive the serial address input on PTDI. The controller determines when a first "D then S" signal sequence occurs on PTDI, indicating the end of the first address frame. In response to this input sequence, the controller sends status to the slave control circuit to enable the address frame in the SIPO to be parallel input to the slave control circuit via the AI bus. If the select protocol is not hierarchical, an I signal will follow the "D then S" sequence to terminate the select protocol. If the select protocol is hierarchical, another S signal will follow the "D then S" signal sequence to start the transmission of the next frame, which may be either an address or message frame.

The receiver circuit receives the PTDI input and control input from the slave control circuit. The receiver outputs address and status information to the slave control circuit. The PTDI input is coupled to the STDO output via flip flops, multiplexer 3 (MX3), and the 3-state output buffer (3SB). Selection control for MX3 and enable control for the 3SB come from the slave control circuit. During select protocols and 1149.1 scan operations the 3SB is enabled to output data. When disabled, the STDO output from the 3SB is pulled up to a logic 1 level by a pull-up resistor inside the buffer. The status output from the receiver circuit indicates to the slave control circuit when a select protocol has been started, when the first address frame is ready to read, if the select protocol is hierarchical (HSP flag set) or non-hierarchical (HSP flag reset), and when the select protocol is completed. The control input to the receiver from the slave control circuit enables the receiver for select protocol operations.

During hierarchical select protocols, MX3 selects the PTDI input that passes through flip flops FF2 and FF3. Flipflops FF2 and FF3 are clocked by PTCK and provide storage for the S, D, and I signal bit pairs that are relayed from the PTDI input to STDO output during hierarchical select protocols. Flipflops FF2 and FF3 play an important role in the hierarchical select protocol in that they provide storage for the first S signal of the second and subsequent frames (address or message) received at the PTDI input, which indicates the start of a hierarchical select protocol. When the first S signal of the second frame (address or message) is received, the receiver verifies the occurrence of the S signal, then outputs control to select the output from FF3 to MX3 and enables the 3SB. Without flipflops FF2 and FF3, the S signal would not be stored and made available for output on the STDO output, thus the hierarchical acknowledge protocol scheme would not work as described.

Flipflops FF2 and FF3 also are important in that they provide a time delay for the receiver to receive and respond to the S, D, or I signal following the second S signal of each frame received at the PTDI input during a hierarchical select protocol. If an S signal follows the second S signal, one of more additional frames are to be relayed through the HASP during the hierarchical select protocol. If a D signal follows the second S signal, a field within a message frame (as described in the second invention) is being relayed through the HASP during the hierarchical select protocol. If an I signal follows the second S signal, the hierarchical select protocol is complete and no additional frames (address or message) are to be relayed through the HASP. Thus the time delay provided by flipflops FF2 and FF3 provides time for the receiver to evaluate the signal following the second S signal to determine what action is to be taken.

After the last frame (address or message) of a hierarchical select protocol has been relayed from the PTDI input to the STDO output, via flipflops 2 and 3, the hierarchical select protocol is terminated by the transmission of a second I signal. During 1149.1 scan operations, MX3 selects the PTDI input that passes through FF1. FF1 is clocked by PTCK and provides the synchronization required for hierarchical scan access, as described above with respect to FIG. 38.

HASP Transmitter Circuit

The transmitter circuit XMT of FIG. 45 consists of a controller for regulating the acknowledge protocol output from the ASP, and a parallel input/serial output (PISO) register for receiving the parallel ASP address from the slave control circuit and outputting the address serially to the SBM. The PISO register receives parallel data from the slave control circuit via the address output (AO) bus, and outputs the address serially to MX1 via the acknowledge protocol output (APO) signal. The controller receives control input from the slave control circuit via the control bus and the STDI input. The controller outputs status to the slave control circuit via the status bus. Control input on the control bus regulates the parallel to serial conversion process that takes place during the acknowledge protocol. The status output from the transmitter's controller informs the slave control circuit of the transmitters status during the acknowledge protocol, i.e. whether the acknowledge protocol is in progress or is completed.

MX1 receives selection control input from the slave control circuit and the STDI and APO signals, and outputs the selected input (STDI or APO) to the PTDO output, via a 3-state output buffer (3SB). MX1 has three inputs, one for receiving the APO signal, one for receiving the STDI after it passes through flipflops 5 and 6, and one for receiving the STDI signal after is passes through FF7. Tristate buffer 3SB is enabled or disabled (tristated) by control input from the slave control circuit. During acknowledge protocols and 1149.1 scan operations the 3SB is enabled to output data. When disabled, the PTDO output from the 3SB is pulled up to a logic 1 level by a pull-up resistor inside the buffer.

During hierarchical acknowledge protocols, MX1 selects the STDI input that passes through flipflops 5 and 6. Flipflops 5 and 6 are clocked by the PTCK and provide storage for the S and D signal bit pairs that are relayed from the PTDI input to the STDO output during hierarchical acknowledge protocols. Flipflops 5 and 6 provide storage for the first S signal received at the STDI input which indicates the start of a hierarchical acknowledge protocol. When the first S signal is received, the transmitter verifies the occurrence of the S signal, then outputs control to select the output from FF6 to MX1 and enables the 3SB. Without flipflops 5 and 6, the S signal would not be stored and made available for output on the PTDO output, thus the hierarchical acknowledge protocol scheme would not work as described.

Flipflops 5 and 6 also provide a time delay for the transmitter to receive and respond to the S, D, or I signal following the second S signal of each frame (address or message) received at the STDI input during the hierarchical acknowledge protocol transmission. If an S signal follows the second S signal, the transmitter's controller knows that another frame is being received and allows the S signal and associated frame to be output on PTDO via MX1 and flipflops 5 and 6. If a D signal follows the second S signal, the transmitter's controller knows that a field within a message frame (as described in the second invention) is being relayed through the HASP during the hierarchical acknowledge protocol. If an I signal follows the second S signal, the transmitter's controller knows that the transmission of the upper hierarchical acknowledge protocol has been completed.

In response to an I signal input on STDI, the transmitter's controller sends status to the slave control circuit to cause MX1 to select the APO output from the transmitter's PISO register. This action allows the transmitter to insert the HASPs address frame in the hierarchical acknowledge protocol being sent to the SBM, then terminate the acknowledge protocol by outputting a second I signal on PTDO. Thus the time delay provided by flipflops 5 and 6 provides time for the transmitter to evaluate the signal received on STDI following the second S signal of each received frame to determine what action is to be taken. Without flipflops 5 and 6, the transmitter would not have time to respond to the second I signal on the STDI input and switch MX1 to insert and output the HASPs address frame before terminating the hierarchical acknowledge protocol.

After the last frame of a hierarchical acknowledge protocol has been relayed from the STDI input to the PTDO output, via flipflops 5 and 6, MX1 selects the APO output from the transmitter to send the HASP's address frame and then terminates the hierarchical acknowledge protocol. During 1149.1 scan operations, MX1 selects the STDI input that passes through FF7. FF7 is clocked by PTCK and provides the synchronization required for hierarchical scan access, as described above with respect to FIG. 38. When disabled by control input from the slave control circuit, the PTDO output from the buffer 3SB is pulled up to a logic 1 level by a pull-up resistor inside the buffer. The status output from the transmitter circuit indicates to the slave control circuit when a hierarchical acknowledge protocol has been started, when the last hierarchical address frame has been relayed, and if a time out error has occurred during a hierarchical acknowledge protocol. The control input to the transmitter from the slave control circuit enables the transmitter for acknowledge operations and inputs the HSP flag to indicate whether the acknowledge protocol is a hierarchical or non-hierarchical type.

HASP Slave Control Circuit

The slave control circuit is a controller that regulates the operation of the HASP transmitter circuit, receiver circuit, and multiplexers in response to matching address input during a select protocol. The slave control circuit receives the PTMS and PTCK signals from the primary port, the address output (AO) and status buses from the receiver, the status bus from transmitter, the external HASP address signals, a reset signal from the power up reset circuit (PRST), and reset address signals from the reset address circuit (RSTA). The slave control outputs control to the receiver circuit, transmitter circuit, buffers 3SBs, and multiplexers 1–3.

The slave control circuit is clocked by the PTCK input from the primary port. The PTMS input from the primary port indicates to the slave control circuit when the 1149.1 bus is busy, idle or reset. The status inputs from the receiver and transmitter circuits inform the slave control circuit of the receiver and transmitter circuit status. The AI bus from the receiver is used to input the address received during a select protocol to the slave control circuit. The reset input from the PRST circuit resets the slave control circuit at powerup. The reset address input from the RSTA circuit allow resetting the slave control circuit via a reset address input from a select protocol operation.

The control output from the slave control circuit controls the operation of the receiver, transmitter, and MX1, MX2, and MX3. The AO bus output from the slave control circuit is used to input the ASPs parallel address to the transmitter during acknowledge protocols.

During select protocols, the slave control circuit receives parallel address input from the receiver via the AI bus. The status bus input from the receiver informs the slave control circuit: when a select protocol has been started, when the address input is ready to be read, if the select protocol is hierarchical or not, and when the select protocol is completed. From the address input, the slave control circuit determines whether the HASP has been selected during a select protocol. If the received address matches the HASP address the HASP responds after the select protocol is completed by outputting either a hierarchical or non-hierarchical acknowledge protocol, then connects its primary and secondary ports together.

MX2 receives selection control, the PTMS signal via FF4, and a logic 0 and 1 input. MX2 outputs the selected input (PTMS, logic 0, or logic 1) to the STMS output. During 1149.1 scan operations, MX2 selects the PTMS input that passes through FF4. FF4 is clocked by PTCK and provides the synchronization required for hierarchical scan access, as described above.

Resetting the HASP

When power is first applied to the HASP, the slave control circuit is reset by input from the power-up reset (PRST) circuit. When reset, the slave control circuit outputs control to; reset the transmitter and receiver circuits to their idle states, disable the STDO and PTDO outputs to a logic 1 via their 3SBs, cause STMS to output a logic 1 from MX2, and cause STCK to output the PTCK clock. While an internal power-up reset (PRST) circuit is illustrated, the reset could also be achieved by other means, such as inputting a reset signal to the slave control circuit using an external reset input signal.

The HASP can also be reset by inputting a select protocol with an address that matches the reset address (RSTA) inside the HASP. The reset address is a fixed address that is input to the slave control circuit and matched against the address frame input from the receiver circuit after a hierarchical select protocol has been completed and relayed through the HASP. If the address frame input matches the reset address, the HASP is reset to the same state as described in the power-up reset. The fixed reset address is the same for all HASPs so that a global reset of all HASPs can be achieved by the transmission of a hierarchical select protocol containing reset address frames. Since the reset address frame is used to reset the HASP, it must be unique and not reused as a HASP address.

A preferred value for the HASP reset address is zero, since HASP address numbering will usually start with an address of 1 and go up through address "a" as shown in FIG. 35. A description of the resetting action that takes place during a hierarchical select protocol is described above. There is no hierarchical acknowledge protocol transmitted from the HASPs to the SBM whenever reset addresses are transmitted during a hierarchical select protocol. Elimination of the acknowledge protocol is required to avoid contention of logic states that would occur between the PTDO outputs of multiple HASPs at each environment level within a system.

Selecting HASPs while the 1149.1 Bus is in RESET State

When the SBM in the root environment places the 1149.1 serial bus in the RESET state (FIG. 2), the PTMS signal will be at a logic 1 state, the PTCK signal will be active, and the PTDI and PTDO signals will be disabled to a high logic state. If, during the RESET state, the SBM inputs a hierarchical select protocol to the HASPs in the system, the HASPs with matching addresses will be selected and respond back to the SBM using a hierarchical acknowledge protocol.

After transmitting the hierarchical acknowledge protocol, the slave control circuit connects the HASP's primary and secondary buses together. During the connection process, the STDO buffer 3SB is enabled to output the PTDI signal via mux MX3 and FF1, the PTDO buffer 3SB is enabled to output the STDI signal via mux MX1 and FF7, and STMS outputs the PTMS signal via mux MX2 and FF4. The following three scenarios describe what happens on the STMS output when a HASP that has previously been; (1) reset, (2) deselected and left in the RESET state, or (3) deselected and left in the IDLE state, is selected while the 1149.1 bus is the RESET state.

(1) If a HASP is selected (while the 1149.1 bus is in the RESET state) after having been previously reset, MX2 switches from outputting the logic 1 input on STMS to outputting the present PTMS signal from FF4 on STMS. Since PTMS is a logic 1 when the 1149.1 bus is in the RESET state, the STMS output remains at a logic 1 during the connection process since FF4 outputs a logic 1.

(2) If a HASP is selected (while the 1149.1 bus is in the RESET state) after having been previously deselected while the 1149.1 bus was in the RESET state (PTMS is a logic 1 level in the 1149.1 bus RESET state), MX2 switches from outputting the previous PTMS state (logic 1 input to MX2) on STMS to outputting the present PTMS state from FF4 on STMS. Since PTMS is a logic 1 when the 1149.1 bus is in the RESET state, the STMS output remains at a logic 1 during the connection process since FF4 outputs a logic 1.

(3) If a HASP is selected (while the 1149.1 bus is in the RESET state) after having been previously deselected while the 1149.1 bus was in the IDLE state (PTMS is a logic 0 level in the 1149.1 bus IDLE state), MX2 switches from outputting the previous PTMS state (logic 0 input to MX2) on STMS to outputting the present PTMS state from FF4 on STMS. Since the PTMS is a logic 1 when the 1149.1 bus is in the RESET state, the STMS output changes from outputting a logic 0 to outputting a logic 1 during the connection process since FF4 outputs a logic 1.

Deselecting the HASP while the 1149.1 bus is in RESET State

When the SBM places the 1149.1 bus in the RESET state (FIG. 2), the PTMS signal will be at a logic 1 state, the PTCK signal will be active, and the PTDI and PTDO signals will be disabled to a high logic state. If, during the RESET state, the SBM outputs a hierarchical select protocol to select HASPs in the system, any previously selected HASPs become deselected and disconnected from the 1149.1 bus as the new HASPs become selected and connected onto the 1149.1 bus. During the disconnection process the STDO and PTDO outputs are disabled to a logic 1 state via their buffers 3SBs, and MX2 is switched from outputting the high logic level from the PTMS input via FF4 (PTMS is high when the 1149.1 bus is in the RESET state) on STMS, to outputting the logic 1 input to MX2 on STMS. By forcing MX2 to select and output the logic 1 input on the STMS output, the 1149.1 serial bus application connected to the HASP's secondary bus remains in the RESET state after the HASPs are deselected. Thus the HASP protocol, like the ASP provides a method of keeping the 1149.1 serial bus application connected to the HASP's secondary bus, in the RESET state, after the HASP has been deselected.

Selecting HASPs while the 1149.1 Bus is in IDLE State

When the SBM places the 1149.1 serial bus in the IDLE state (see FIG. 2), the PTMS signal will be at a logic 0 state, the PTCK signal will be active, and the PTDI and PTDO signals will be disabled to a high logic state. If, during the IDLE state, the SBM inputs a hierarchical select protocol to the HASP in the system, the HASPs with matching addresses will be selected and respond back to the SBM using a hierarchical acknowledge protocol.

After transmitting the hierarchical acknowledge protocol, the slave control circuit connects the HASP's primary and secondary buses together. During the connection process, the STDO 3SB is enabled to output the PTDI signal via MX3 and FF1, the PTDO 3SB is enabled to output the STDI signal via MX1 and FF7, and STMS outputs the PTMS signal via MX2 and FF4. The following three scenarios describe what happens on the STMS output when a HASP that has previously been; (1) reset, (2) deselected and left in the RESET state, or (3) deselected and left in the IDLE state, is selected while the 1149.1 bus is the IDLE state.

(1) If a HASP is selected (while the 1149.1 bus is in the IDLE state) after having been previously reset, MX2 switches from outputting the logic 1 input on STMS to outputting the present PTMS state from FF4 on STMS. Since PTMS is a logic 0 when the 1149.1 bus is in the IDLE state, the STMS output changes from outputting a logic 1 to outputting a logic 0 during the connection process since FF4 outputs a logic 0.

(2) If a HASP is selected (while the 1149.1 bus is in the IDLE state) after having been previously deselected while the 1149.1 bus was in the RESET state (PTMS is a logic 1 level in the RESET state), MX2 switches from outputting the previous PTMS state (logic 1 input to MX2) on STMS to outputting the present PTMS state from FF4 on STMS. Since PTMS is a logic 0 when the 1149.1 bus is in the IDLE state, the STMS output changes from outputting a logic 1 to outputting a logic 0 during the connection process since FF4 outputs a logic 0.

(3) If a HASP is selected (while 1149.1 bus is in the IDLE state) after having been previously deselected while the 1149.1 bus was in the IDLE state (PTMS is a logic 0 level in the IDLE state), MX2 switches from outputting the previous PTMS state (logic 0 input to MX2) on STMS to outputting the present PTMS state from FF4 on STMS. Since the PTMS is a logic 0 when the 1149.1 bus is in the IDLE state, the STMS output remains at a logic 0 during the connection process since FF4 outputs a logic 0.

Deselecting HASPs while the 1149.1 Bus is in IDLE State

When the SBM places the 1149.1 bus in the IDLE state (FIG. 2 of first invention), the PTMS signal will be at a logic 0 state, the PTCK signal will be active, and the PTDI and PTDO signals will be disabled to a high logic state. If, during the IDLE state, the SBM inputs a select protocol to select HASPs in the system, any previously selected HASPs becomes deselected and disconnected from the 1149.1 bus as the new HASPs become selected and connected onto the 1149.1 bus. During the disconnection process, the STDO and PTDO outputs are disabled to a logic 1 state via their 3SBs, and MX2 is switched from outputting the low logic level from the PTMS input via FF4 (PTMS is low when 1149.1 bus is in the IDLE state) on STMS, to outputting the logic 0 input to MX2 on STMS. By forcing MX2 to select and output the logic 0 input on the STMS output, the 1149.1 serial bus application connected to the secondary bus remains in the IDLE state after the HASP is deselected. Thus the third invention, like the first invention, provides a method of keeping the 1149.1 serial bus application, connected to the HASP's secondary bus, in the IDLE state after it has been deselected.

Adapting the HASP for a Two-Wire Communications Interface

A description above with respect to FIG. 30 described an RCASP circuit which had been adapted for a two-wire interface at its primary port. While the description of the RCASP stated that a two-wire interface may exist between it and a PSBM at the backplane level, the two-wire interface may extend to any hierarchical level within a system. To provide a two-wire communications interface between a RCASP and PSBM, the HASP circuit can be adapted to operate using only two wires. Using the two wire interface, a PSBM can communicate with a RCASP at any level within a system to transmit and receive data, command, and status information via the hierarchical select and acknowledge protocols.

As mentioned above, the inventions select and acknowledge protocols can both be operated on a common wire connection. This is possible because the protocols are never active at the same time.

In FIG. 46, an example of a RCASP and PSBM being hierarchically connected using HASPs 1-n is depicted. Each HASP 1-n has a two-wire interface consisting of a bidirectional serial input output (SIO) data signal and the TCK signal. The SIO and TCK signals connected to the HASP's primary port are referred to as PSIO and PTCK signals. The SIO and TCK signals connected to the HASP's secondary port are referred to as SSIO and STCK signals. The method of hierarchically accessing the RCASP from the PSBM is exactly the same as described previously using the four-wire interface HASP circuits. The only difference is that the TMS signal is deleted, the TDO and TDI signals are combined into one bidirectional signal called SIO, and only select and acknowledge protocol can be transferred between the PSBM and RCASP. Both the select protocol and acknowledge protocol are transmitted on the SIO signal wire.

To access the RCASP, a hierarchical select protocol is transmitted from the PSBM to the RCASP, via the HASPs. The hierarchical select protocol is transmitted from the PSBM's SIO output to HASP1's PSIO input, then passes from the HASP1's SSIO output to HASP2's PSIO input, then passes similarly on to HASPn's PSIO input to be input to the RCASP's PSIO input via HASPn's SSIO output. The select protocol input to the RCASP from the PSBM contains a message frame with a command that the RCASP can execute, as described in the second invention.

After the hierarchical select protocol has been transmitted, the RCASP replies by transmitting a hierarchical acknowledge protocol to the PSBM, via the HASPs. The hierarchical acknowledge protocol is transmitted from the RCASP's PSIO output to HASPn's SSIO input, then passes similarly through intermediate HASPs to be input to HASP2's SSIO input, then passes from HASP2's PSIO output to be input to the HASP1's SSIO input, then passes from HASP1's PSIO output to be input to the SIO input of the PSBM. The acknowledge protocol input to the PSBM from the RCASP contains a message frame with the results of the command issued, as described in the second invention.

The TCK output from the PSBM can be connected such that it passes through each level of HASP, or it can be directly input to each HASP as shown in the dotted lines of FIG. 15.

Figure 47:
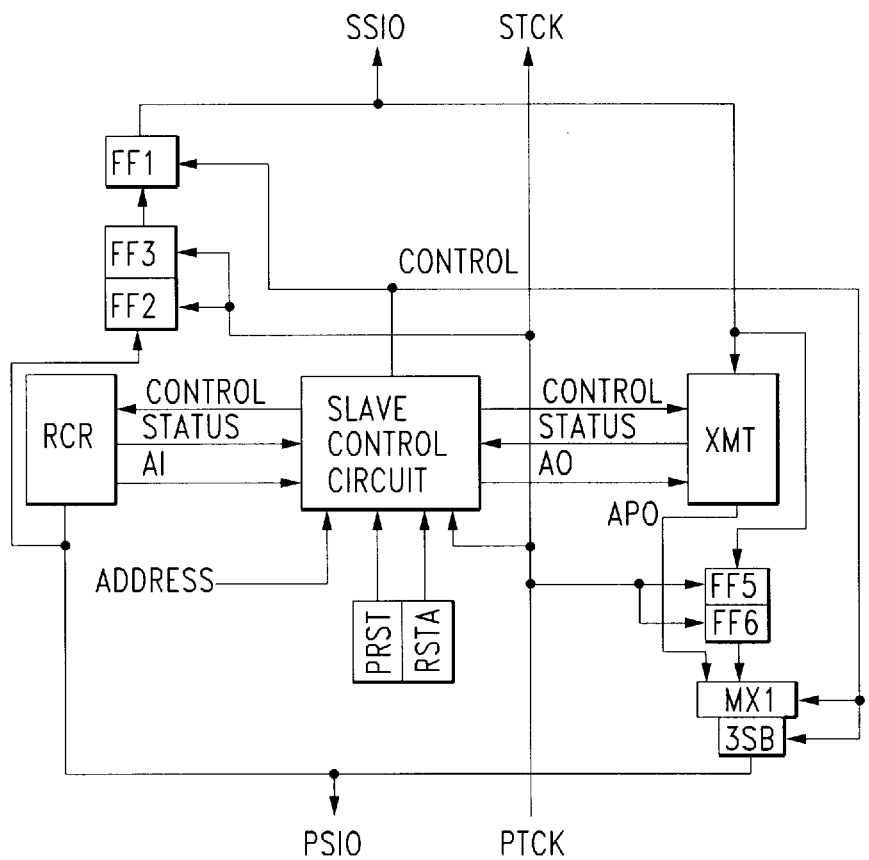
FIG. 47 depicts a HASP circuit adapted for two wire communication between the HASP's primary and secondary ports.

FIG. 47 depicts an example of the HASP circuit being changed to support a two wire interface. The changes required to adapt the HASP to the two-wire interface include: (1) removing the PTMS and STMS signals, (2) combining the STDI and STDO signals into the SSIO signal, (3) combining the PTDI and PTDO signals into the PSIO signal, removing flip flops FF1, FF4, and FF7, and (4) removing MX2.

During receiver, transmitter, and slave control circuit of the adapted HASP operate during hierarchical select and acknowledge protocols exactly as described in the four-wire HASP. The only difference is that the protocols are both transferred on the same wire.

Self-Connecting Cable Networks

While the use of the HASP has focused on a hierarchical connection method used to couple a particular controller (SBM) to an application inside a system, the HASP can also be used outside of systems to provide a self-connecting cabling network. The term self-connecting means that the process of making a connection between a controller and a target application on a cable is achieved via the hierarchical select and acknowledge protocol of the HASP.

In FIG. 48 a controller (CTL) is shown connected to applications 1-n (APP1-n) via cabling interconnects 1-n, as in the prior art. This cabling technique is typical of the way connections are made today between a controller and multiple applications. This approach is not very efficient in many areas. In weight sensitive environments, the multiple cable approach can be too heavy. In space sensitive environments, the area required for cable routing can be to large. In fault sensitive environments, adding a redundant cable as backup for each primary cable can amplify the two previous problems-weight and space sensitivities. These sensitivities are well known in avionics and space applications.

In FIG. 49 a controller (CTL) is shown connected to applications 1-n (APP1-n) via a single cable interconnect using the HASP circuit of the invention. The single cable interconnect method is made possible by the use of HASP circuitry and protocols in the cabling interface between the controller and each application. The controller may be connected to any of the applications by simply using the select and acknowledge protocol, as described in this disclosure, to make the connection. Once the connection has been made the controller can communicate to the selected application using whatever type of bus (serial or parallel format) is chosen.

This cabling technique overcomes the problems stated for the multiple cable environment of FIG. 48. Weight and space problems are reduced, since only a single cable is required to connect the controller up to any number of applications. Upgrading to a fault tolerant environment is less painful, since only one additional cable is required to provide a dual redundancy connection method between the controller and all applications. The approach illustrated in FIG. 49 based on the HASP circuitry and protocol, provides significant benefits in many areas of electronic systems, especially electronic systems employed in avionics and space applications.

It is important to understand that while this description describes the HASP circuitry of the invention and as being used in combination with a particular serial bus, IEEE 1149.1, it can be used with other pre-existing or newly defined serial buses to provide a method of hierarchially connecting a slave device (IC, board, subsystem, etc) up to an SBM. For example, a typical serial bus is comprised of the following signal types. A control signal (like TMS) that regulates the normal operation of the serial bus. A clock signal (like TCK) that times the flow of serial data through devices on the serial bus. A serial data input signal (like TDI) for inputting data to a slave device. A serial data output signal (like TDO) for outputting data from a slave device. Since the normal operation of the serial bus is regulated by a control signal (like TMS), the protocol developed for the HASP avoids using this signal to select or deselect slave devices. By designing the HASP's protocol to be independent of a particular serial bus's control signal, the inclusion of invention into existing serial buses does not require modifying the serial bus's normal mode of operation. Thus, the invention is general in nature, and can be used in a myriad of different serial bus types.

It is important to understand that the HASP circuit can exist as (1) a packaged IC for assembly on an environment such as a printed circuit board, (2) an unpackaged die for assembly on a multi-chip module substrate, (3) a subcircuit within an IC, or (4) an embedded circuit in a multi-chip module semiconductor substrate.

It is important to understand that the HASP circuit can be used at any level of electronic assembly to provide a hierarchically addressable connection between an SBM and an infinite number of slave application. For example, the HASP could be viewed as a circuit and protocol providing a hierarchical connection means between an SBM and multiple systems (1-n), further connectable to multiple subsystems (1-n), further connectable to multiple backplanes (1-n), further connectable to multiple boards (1-n), further connectable to multiple multi-chip modules (1-n), further connectable to multiple ICs (1-n), further connectable to multiple subcircuits within each IC.

It is also important to understand that the HASP circuit and protocol can be used as a two-wire communications interface.

It is also important to understand that the HASP circuit and protocol can be used in cable environments to gain significant advantages over existing cable connection methods.

A few preferred embodiments have been described in detail hereinabove. It is to be understood that the scope of the invention also comprehends embodiments different from those described, yet within the scope of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. Electrical circuitry, comprising:

a data transfer port;

a switch to make selectively a desired connection within said electrical circuitry, said switch having a control input to control opening and closing thereof; and a switch controller coupled to said port and having an output which, in response to a connection request received at said port, applies a request acknowledgement to said port, said switch controller having a further output which is connected to said control input of said switch and which, in response to completion of said request acknowledgement, signals said control input to close said switch.

2. Electrical circuitry, comprising:

first and second data transfer ports;

a switch connected between said first and second ports, said switch having a control input to control opening and closing thereof; and a switch controller coupled to said first port and having an output which, in response to a connection request received at said first port, applies a request acknowledgement to said first port, said switch controller having a further output which is connected to said control input of said switch and which, in response to completion of said request acknowledgement, signals said control input to close said switch.

3. A method of closing a switch, comprising the steps of:

issuing a request to close the switch;

issuing a request acknowledgement in response to the request; and closing the switch in response to completion of the request acknowledgement.

4. Electrical circuitry, comprising:

first and second data transfer ports connectable to one another and cooperable when connected to communicate therebetween according to a first communication protocol; and acknowledgement circuitry coupled to said first port, said acknowledgement circuitry having an output which, in response to communication at said first port according to a second communication protocol, applies to said first port an acknowledge signal.

5. A method of operating data transfer ports, comprising the steps of:

applying to one of the ports a request according to a first communication protocol;

applying an acknowledgment signal to said one port in response to the request; and communicating between the ports according to a second communication protocol.

6. An electrical system, comprising:

first and second data transfer ports;

first and second circuitries respectively connected to said first and second ports;

a switch connected between said first and second ports, said switch having a control input to control opening and closing thereof;

a switch controller coupled to said first port and having an output which, in response to a connection request received at said first port, applies a request acknowledgement to said first port, said switch controller having a further output which is connected to said control input of said switch and which, in response to completion of said request acknowledgement, signals said control input to close said switch; and said first and second circuitries operable to communicate therebetween when said switch is closed, said first circuitry operable to provide said connection request and receive said request acknowledgement.

7. An electrical system, comprising:

first and second data transfer ports selectively connectable to and disconnectable from one another;

first and second circuitries respectively connected to said first and second ports, said first and second circuitries cooperable to communicate therebetween according to a first communication protocol when said ports are connected;

acknowledgement circuitry coupled to said first port, said acknowledgement circuitry having an output which, in response to communication at said first port according to a second communication protocol, applies to said first port an acknowledge signal; and said first circuitry operable to provide at said first port said communication according to said second communication protocol.

* * * * *